(12) United States Patent
Ishitsuka et al.

(10) Patent No.: US 6,242,323 B1
(45) Date of Patent: Jun. 5, 2001

(54) SEMICONDUCTOR DEVICE AND PROCESS FOR PRODUCING THE SAME

(75) Inventors: Norio Ishitsuka, Niihari-Gun; Hideo Miura, Koshigaya; Shuji Ikeda, Koganei; Norio Suzuki, Mito; Yasushi Matsuda, Kodaira; Yasuko Yoshida, Sayama; Hirohiko Yamamoto, Hachioji; Masamichi Kobayashi, Kodaira; Akira Takamatsu, Hamura; Hirofumi Shimizu, Yamanashi; Kazushi Fukuda, Ome; Shinichi Horibe, Akiruno; Toshio Nozoe, Higashiyamato, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/367,524
(22) PCT Filed: Feb. 18, 1998
(86) PCT No.: PCT/JP98/00671
§ 371 Date: Aug. 16, 1999
§ 102(e) Date: Aug. 16, 1999
(87) PCT Pub. No.: WO98/36452
PCT Pub. Date: Aug. 20, 1998

(30) Foreign Application Priority Data

Feb. 18, 1997 (JP) .................................................... 9-033597
Apr. 30, 1997 (JP) .................................................... 9-112467

(51) Int. Cl.[7] .................................................... H01L 21/76
(52) U.S. Cl. .................... 438/435; 438/424; 438/436; 438/437
(58) Field of Search ...................................... 438/424, 435, 438/436, 437

(56) References Cited

U.S. PATENT DOCUMENTS

| 3,634,204 | * | 1/1972 | Dhaka . |
| 4,923,821 | | 5/1990 | Namose . |
| 5,447,884 | | 9/1995 | Fahey et al. . |
| 5,492,858 | | 2/1996 | Bose et al. . |
| 5,536,675 | | 7/1996 | Bohr . |
| 5,605,846 | * | 2/1997 | Ohtani et al. . |
| 5,651,858 | * | 7/1997 | Lin . |
| 5,933,748 | * | 8/1999 | Chou et al. . |

FOREIGN PATENT DOCUMENTS

| 611008944 | 1/1986 | (EP) . |
| 423722A2 | 10/1990 | (EP) . |
| 423722A3 | 10/1990 | (EP) . |
| 459397A2 | 5/1991 | (EP) . |
| 459397A3 | 5/1991 | (EP) . |

(List continued on next page.)

OTHER PUBLICATIONS

Tamaki et al., "Evaluation of Dislocation Generation in U–Groove Isolation", Solid–State Science and Technology, Mar. 1988.
Bryant et al., "Characteristics of CMOS Device Isolation for the ULSI Age", IEEE 1994.

*Primary Examiner*—Long Pham
(74) *Attorney, Agent, or Firm*—Antonelli, Terry, Stout & Kraus, LLP

(57) ABSTRACT

A semiconductor device having a highly reliable groove isolation structure with a desired radius of curvature formed at the groove upper edge and without formation of any step, there is produced by reducing the stress generation around the groove upper edge of an element isolation groove on a semiconductor substrate, thereby optimizing the shape of an element isolation groove and making the device finer and improving the device electric characteristics.

23 Claims, 40 Drawing Sheets

FOREIGN PATENT DOCUMENTS

| | | |
|---|---|---|
| 660391A2 | 12/1994 | (EP) . |
| 660391A3 | 3/1997 | (EP) . |
| 63-143835 | 6/1988 | (JP) . |
| 2-260660 | 10/1990 | (JP) . |
| 4-303942 | 10/1992 | (JP) . |
| 8-97277 | 4/1996 | (JP) . |
| 9602070 | 1/1996 | (WO) . |
| 9812742 | 3/1998 | (WO) . |

* cited by examiner

NO REMOVAL OF PAD OXIDE FILM→R : SMALL
(OXIDATION DOES NOT PROCEED DUE TO
COMPRESSING STRESS)

REMOVAL OF PAD OXIDE FILM→R : LARGE
(NO COMPRESSING STRESS)

FIG. 10
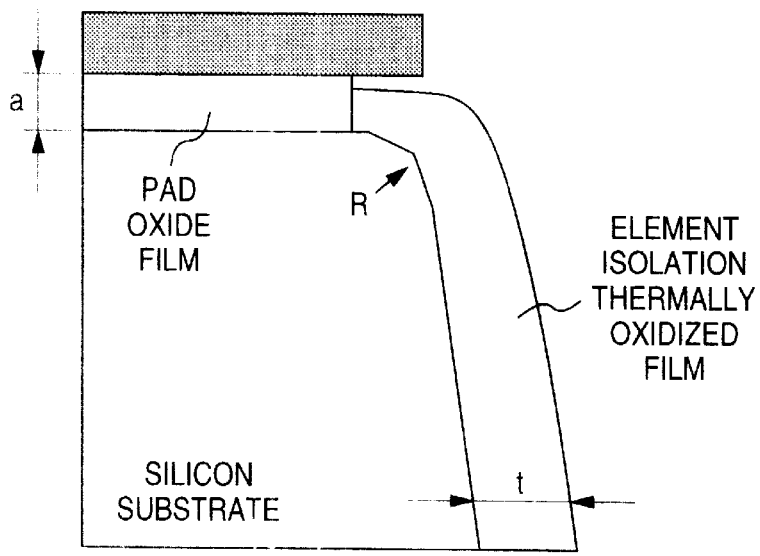
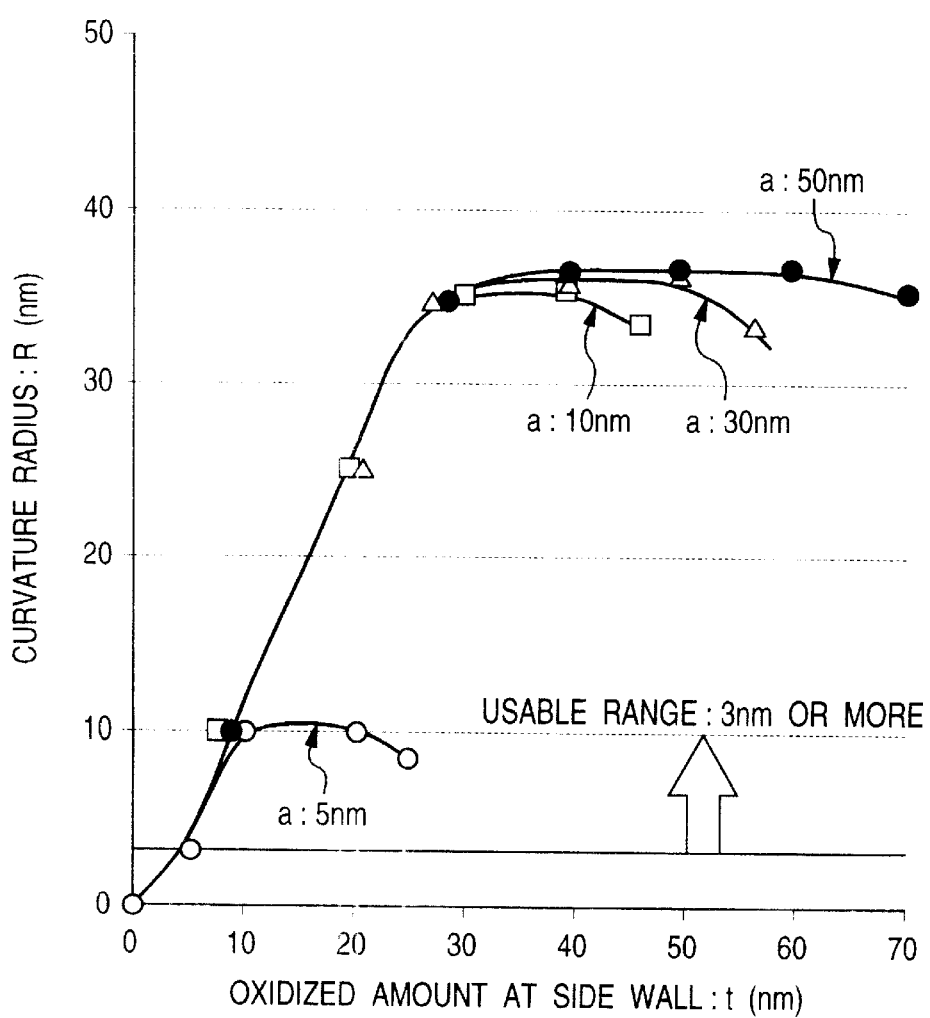

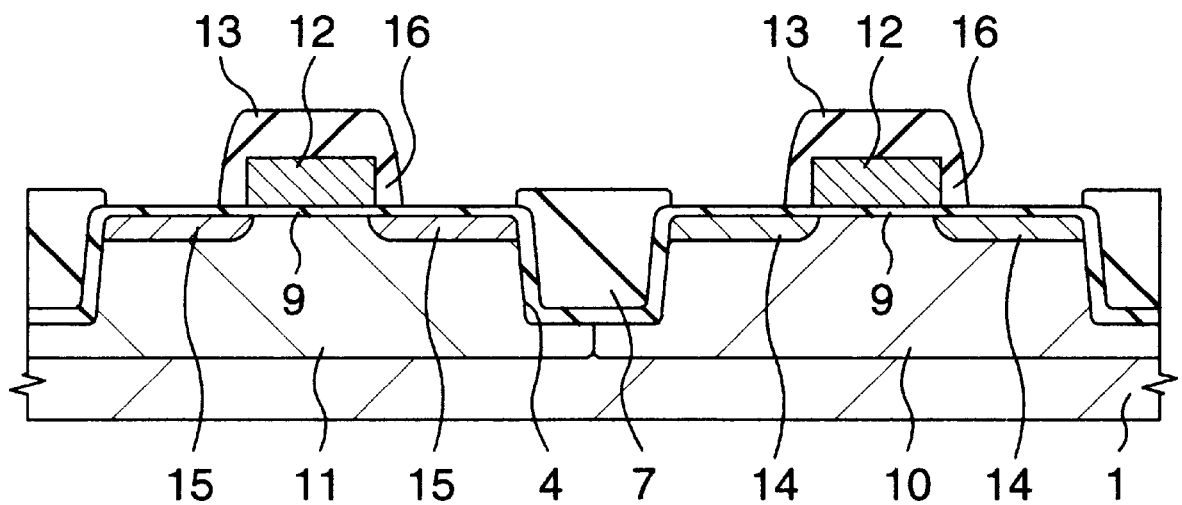
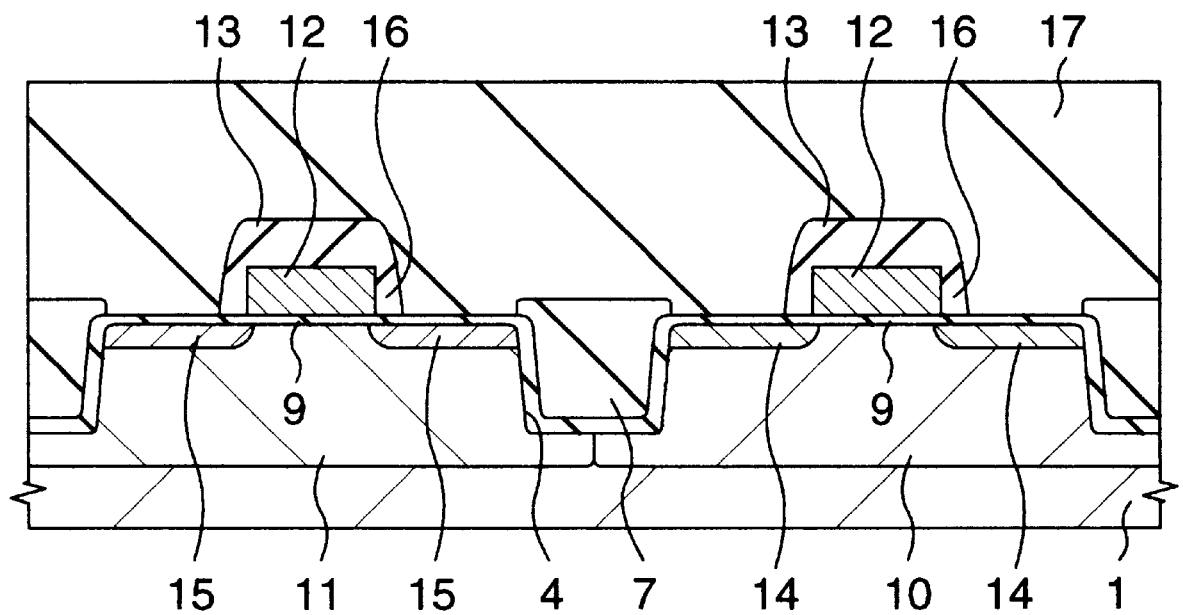

SEMICONDUCTOR DEVICE AND PROCESS FOR PRODUCING THE SAME

TECHNICAL FIELD

The present invention relates to a semiconductor device having a highly reliable groove isolation structure and a process for producing the same.

BACKGROUND ART

A shallow groove isolation (SGI) structure is now available to make an electrical insulation or isolation between adjacent elements such as transistors, etc. on a semiconductor substrate. As shown in FIGS. 1A to 1D, the SGI structure typically comprises a shallow groove formed on a semiconductor substrate 31 of silicon and an oxide film 35 and the like embedded in the groove and is suitable for devices requiring processing dimensional precision of 0.25 µm or under, because its processing dimensional precision is higher than that of the structure so far by local oxidation of silicon (LOCOS). However, the SGI structure sometimes suffers from formation of sharp protrusions 34 of semiconductor substrate 31 of silicon formed in the oxide film 35 formed by oxidation at the upper edge of the groove during the oxidation step, as shown in FIG. 1C. The presence of such sharp protrusions 34 of semiconductor substrate 31 of silicon causes concentration of electric fields around the protrusions during the circuit operation, sometimes deteriorating gate breakdown voltage or capacitance, as disclosed, for example, by A. Bryant et al (Technical Digest of IEDM '94, pp. 671–674). It is known from experiences that such deterioration of gate breakdown voltage occurs when the radius of curvature of the substrate is not more than 3 nm around the groove upper edge, even if the angle of substrate is not less than 90° around the groove upper edge. To overcome the deterioration, pad oxide film 32 of FIG. 1B is recessed backwards by about 0.1 µm as shown in FIG. 1B' and oxidized with an oxidant, preferably steam at a temperature of about 1,000° C. to form a desired radius of curvature at the groove upper edges, as disclosed in JP-A-2-260660.

Even though the desired radius curvature can be obtained by the prior art procedure, step (or unevenness) 44 is formed on the upper surface of semiconductor substrate of silicon 31 around the groove upper edge, as shown in FIG. 1C'. Such step 44 can be formed presumably due to the following mechanism. That is, semiconductor substrate 31 of silicon has a silicon-exposed region and a silicon-unexposed region in the recessed area at the edge of pad oxide film 32; the silicon-exposed region undergoes faster oxidant diffusion, i.e. faster oxidation, than the silicon-unexposed region, resulting in formation of step 44 at the edge of pad oxide film 32 as a boundary. Gate oxide film 37, when formed in such a step region, has an uneven thickness, which leads to variations of electrical properties. Furthermore, stresses are liable to concentrate therein, resulting in a possible decrease in the electrical reliability of a transistors to be formed on step 44.

Further, the silicon oxide film 36 is deposited on the semiconductor substrate 31 by chemical vapor deposition (CVD) to embed the silicon oxide film 36 in the groove and then the semiconductor substrate 31 is heat treated to sinter the silicon oxide film 36 embedded in the groove. Sintering is carried out for improving the quality of the silicon oxide film 36 embedded in the groove. If the sintering is insufficient, voids are often generated in the groove in the subsequent steps.

Furthermore, it is said that wet or steam oxidation is effective for sintering the silicon oxide film 36 embedded in the groove, but the wet or steam oxidation is liable to oxidize the inside, particularly side wall, of the groove. Oxidation starts from the groove surface and thus the groove bottom is less oxidized. Once the groove side wall is oxidized, the active region is narrowed. This is another problem. Thicker oxide film will cause a larger stress on the boundary between the oxide film and the substrate and the once rounded shoulder edge will return to the original sharp one and crystal defects are also generated. This is a further problem. To overcome these problems, it was proposed to provide a silicon nitride film along the groove inside wall.

According to a process for forming a groove, disclosed in JP-A-8-97277, a groove is trenched on a silicon substrate at first, and then an oxide film is formed on the groove inside surfaces (side wall and bottom surfaces) by heat oxidation, followed by further formation of a silicon nitride film thereon and still further formation of a silicon film such as anyone of amorphous, polycrystalline and monocrystalline silicon films on the silicon nitride film. Then, the groove is embedded with a silicon oxide film completely, followed by flattening of the groove top. After the deposition of the silicon oxide film on the entire surface of substrate, but before the fattening, the silicon film is oxidized in an oxidizing atmosphere including steam at about 950° C. to convert it to a silicon oxide film. The silicon substrate is not oxidized during the oxidation, because the silicon substrate is protected by the silicon nitride film. According to the process, a film having a good compatibility with a silicon oxide film, i.e. a silicon film is formed as a thin film on the groove inside surfaces and thus the groove can be embedded with the silicon oxide film without any remaining voids in the groove. The silicon film in the groove must be then converted to a silicon oxide film by oxidation, but the silicon nitride film is provided between the silicon film and the silicon substrate, the silicon substrate is never oxidized during the oxidation of the silicon film. That is, no device characteristics are deteriorated at all.

In the above-mentioned prior art processes for forming a groove, heat treatment is carried out at a high temperature such as 1,000° C. or higher to round the shoulder edge of element isolation groove. However, large-dimension wafers are liable to undergo dislocation, which will serve as nuclei for defects, by heat treatment at a high temperature such as 1,000° C. or higher, and thus a heat-treatment process at a high temperature such as 1,000° C. or higher would be hard to use in view of the future trend to use much larger-dimension wafers. In the heat treatment at a low temperature such as less than 1,000° C., it is hard to round the shoulder edge of element isolation groove.

DISCLOSURE OF THE INVENTION

An object of the present invention is to provide a semiconductor device with a desired radius of curvature formed at the groove upper end and without formation of any step there, and also a process for producing the same.

The object of the present invention can be attained by reducing the stress generation around the groove upper end of an element isolation groove on a semiconductor substrate.

Another object of the present invention is to provide a novel technique of optimizing the shape of an element isolation groove, thereby making the device finer and improving the device electric characteristics.

Other object of the present invention is to provide a novel technique of reducing an adverse effect of stresses to an active region due to the sintering of a silicon oxide film embedded (or buried) in an element isolation groove on the device characteristics.

The present invention provides a process for producing a semiconductor device, which comprises the following steps:
(1) a step of forming a pad oxide film having a thickness of at least 5 nm, preferably at least 10 nm on a circuit-forming side of a semiconductor substrate (or a silicon substrate),
(2) a step of forming an anti-oxidation film on the pad oxide film,
(3) a step of trenching a groove to a desired depth at a desired position on the circuit-forming side of the semiconductor substrate,
(4) a step of recessing the pad oxide film to an extent of 5 nm–40 nm from the inside wall of the groove,
(5) a step of oxidizing the inside wall of the groove trenched on the semiconductor surface,
(6) a step of embedding an isolation film in the oxidized groove,
(7) a step of removing the embedding isolation film formed on the anti-oxidation film,
(8) a step of removing the anti-oxidation film formed on the circuit-forming side of the semiconductor substrate, and
(9) a step of removing the pad oxide film formed on the circuit-forming side of the semiconductor substrate.

The present invention further provides a semiconductor device which comprises a semiconductor (or silicon) substrate and an element isolation oxide film having a groove isolation structure formed on the circuit-forming side of the semiconductor substrate, where the substrate has a monotonously convexed shape around the upper edge of the groove of the groove isolation structure; the oxide film is oxidized to have a thickness of 5 to 70 nm, preferably 30 to 70 nm at the inside wall of the groove at the intermediate level of the groove isolation structure; and the semiconductor substrate has a radius of curvature in a range of 3 to 35 nm at the upper edge of the groove thereof.

The present invention further provides a process for producing a semiconductor device, which comprises the following steps:
(a) a step of thermally oxidizing a semiconductor (or silicon) substrate, thereby forming a first silicon oxide film as a pad oxide film on the principal side (or surface) of the semiconductor substrate, then depositing a silicon nitride film as an anti-oxidation film on the first silicon oxide film, and then selectively etching the silicon nitride film, the first silicon oxide film and the semiconductor substrate residing in an element isolation region while masking an element region, thereby trenching a groove on the principal side (or surface) of the semiconductor substrate,
(b) a step of etching the first silicon oxide film exposed to the inside wall of the groove, thereby recessing the first silicon oxide film from the inside wall of the groove towards an active region to an extent of 5 to 40 nm,
(c) a step of thermally oxidizing the semiconductor substrate, thereby forming a second silicon oxide film on the inside wall of the groove within the range for filling the second silicon oxide film in the recess space formed up to the edge of the recessed first silicon oxide film and rounding the shoulder edge of the groove at the same time,
(d) a step of depositing a third silicon oxide film on the principal side (or surface) of the semiconductor substrate, thereby embedding the third silicon oxide film in the groove,
(e) a step of heat-treating (or annealing) the semiconductor substrate, thereby sintering the third silicon oxide film embedded in the groove,
(f) a step of removing the third silicon oxide film on the silicon nitride film, while leaving the third silicon oxide film only in the groove, thereby forming an element isolation groove embedded with the third silicon oxide film, and
(g) a step of removing the silicon nitride film on the surface of the active region whose circumference is confined by the element isolation groove and then forming a semiconductor element in the active region.

The present invention further provides a process for producing a semiconductor device, which comprises the following steps:
(a) a step of thermally oxidizing a semiconductor substrate, thereby forming a first silicon oxide film on the principal side (or surface) of the semiconductor substrate, then depositing a silicon nitride film on the first silicon oxide film, and then selectively etching the silicon nitride film and the first silicon oxide film residing in an element isolation region while masking an element region,
(b) a step of isotropically and shallowly etching the surface of the semiconductor substrate in the element isolation region, thereby providing an undercut on the semiconductor substrate at the edge of the element isolation region,
(c) a step of selectively etching the semiconductor substrate in the element isolation region, thereby trenching a groove on the principal side (or surface) of the semiconductor substrate,
(d) a step of thermally oxidizing the semiconductor substrate, thereby forming a second silicon oxide film on the inside wall of the groove and rounding the shoulder edge of the groove at the same time,
(e) a step of depositing a third silicon oxide film on the principal side (or surface) of the semiconductor substrate, thereby embedding the third silicon oxide film in the groove,
(f) a step of heat-treating (or annealing) the semiconductor substrate, thereby sintering the third silicon oxide film embedded in the groove,
(g) a step of removing the third silicon oxide film on the silicon nitride film, while leaving the third silicon oxide film only in the groove, thereby forming an element isolation groove embedded with the third silicon oxide film, and
(h) a step of removing the silicon nitride film on the surface of an active region whose circumference is confined by the element isolation groove and then forming a semiconductor element in the active region.

The present invention further provides numbers of variations of the above-mentioned processes.

BRIEF DESCRIPTION OF DRAWINGS

FIG. 10 is a diagram showing the working and effect of the fourth embodiment of the present invention.

FIGS. 11 to 32 are cross-sectional elevation views of essential part of a semiconductor substrate showing a process for producing a semiconductor device according to Example 5 of the present invention.

BEST MODE FOR CARRYING OUT THE INVENTION

The present process for producing a semiconductor device comprises the following steps:

(1) a step of forming a pad oxide film such as a silicon oxide film to a thickness of at least 5 nm, preferably at least 10 nm, on a circuit-forming side of a semiconductor substrate, (2) a step of forming an anti-oxidation film such as a silicon nitride film on the pad oxide film, (3) a step of partially removing the anti-oxidation film and the pad oxide film from a desired position on the circuit-forming side of the semiconductor substrate and further trenching a groove to a desired depth at that position on the surface of the semiconductor substrate, (4) a step of recessing (or partially removing) the pad oxide film from the edge side of the remaining anti-oxidation film on the basis of the surface of the semiconductor substrate to an extent of 5 to 40 nm by etching, (5) a step of heat (or thermal) oxidizing the inside wall of the groove trenched on the semiconductor substrate preferably in an oxidative atmosphere having a gas ratio of $H_2/O_2$ of less than 0.5 within the range for filling the resulting oxide in the recess space (clearance between the surface of the substrate and the anti-oxidation film) formed up to the edge of the recessed pad oxide film, (6) a step of embedding (or burying) an embedding isolation film in the oxidized groove, (7) a step of removing the embedding isolation film formed on the anti-oxidation film, (8) a step of removing the anti-oxidation film formed on the circuit-forming side of the semiconductor substrate, and (9) a step of removing the pad oxide film formed on the circuit-forming side of the semiconductor substrate.

Figure 34:
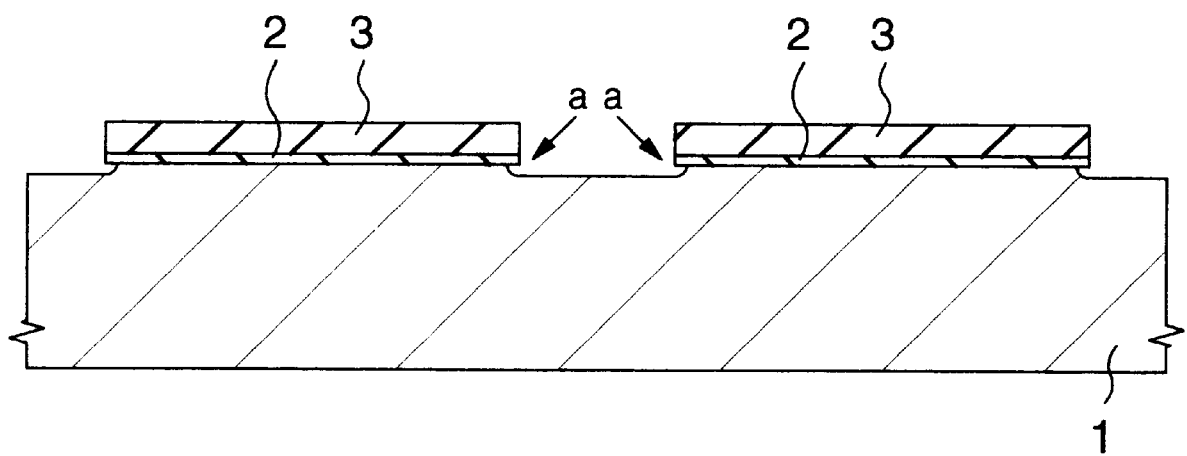

In the above-mentioned process, the shoulder edge of the groove can be more effectively improved by providing a partial undercut a below the pad oxide film 2, as shown in FIG. 34, before trenching the groove.

In the present semiconductor device comprising a semiconductor substrate and an element isolation oxide film having a groove isolation structure formed on the circuit-forming side of the semiconductor substrate, produced by the above-mentioned process, the substrate has no step on the upper surface, but a monotonously convexed shape around the upper edge of the groove of the groove isolation structure; the oxide film is oxidized to have a thickness t of 5 to 70 nm, preferably 30 to 70 nm at the inside wall of the groove at the intermediate level of the groove isolation structure, as shown in FIG. 10; and the semiconductor substrate has a radius of curvature in a range of 3 to 35 nm at the upper edge of the groove thereof.

Typical processes of those to be disclosed herein will be briefly outlined below:

According to a first typical aspect of the present invention, a process for producing a semiconductor device comprises the following steps:

(a) a step of thermally oxidizing a semiconductor substrate, thereby forming a first silicon oxide film as a pad oxide film on the principal side (or surface) of the semiconductor substrate, then depositing a silicon nitride film as an anti-oxidation film on the first silicon oxide film, and then selectively etching the silicon nitride film, the first silicon oxide film and the semiconductor substrate residing in an element isolation region while masking an element region, thereby trenching a groove on the principal side (or surface) of the semiconductor substrate, (b) a step of etching the first silicon oxide film exposed to the inside wall of the groove, thereby recessing the first silicon oxide film to an extent of 5 to 40 nm from the groove inside wall towards an active region, (c) a step of thermally oxidizing the semiconductor substrate, thereby forming a second silicon oxide film on the inside wall of the groove within the range for filling the second silicon oxide film in the recess space formed up to the edge of the recessed first silicon oxide film and rounding the shoulder edge of the groove at the same time, (d) a step of depositing a third silicon oxide film on the principal side (or surface) of the semiconductor substrate, thereby embedding the third silicon oxide film in the groove, (e) a step of heat-treating (or annealing) the semiconductor substrate, thereby sintering the third silicon oxide film embedded in the groove, (f) a step of removing the third silicon oxide film on the silicon nitride film, while leaving the third silicon oxide film only in the groove, thereby forming an element isolation groove embedded with the third silicon oxide film, and (g) a step of removing the silicon nitride film on the surface of the active region whose circumference is confined by the element isolation groove and then forming a semiconductor element in the active region.

In the first typical aspect of the present process, a thermally oxidizing temperature for forming the first silicon oxide film, a thermally oxidizing temperature for forming the second silicon oxide film and a heat-treating (or annealing) temperature for sintering the third silicon oxide film are all not more than 1,000° C.

In the first typical aspect of the present process, the thermally oxidizing temperature for forming the second silicon oxide film is from 8000 to 1,000° C.

In the first typical aspect of the present process for producing a semiconductor device, the groove has a taper angle θ of not more than 85°.

In the first typical aspect of the present process, the inside wall of the groove is subjected to an soft nitriding treatment after the step (c) but before the step (d), thereby forming a silicon nitride layer in an area near the boundary between the second silicon oxide film formed on the inside wall of the groove and the active region of the semiconductor substrate.

In the first typical aspect of the present process, an area near the boundary between the second silicon oxide film formed on the inside wall of the groove and a element isolation region of the semiconductor substrate is subjected to nitrogen ion implantation after the step (c) but before the step (d), thereby forming a silicon nitride layer in the area near the second silicon oxide film formed on the inside wall of the groove and the element isolation region of the semiconductor substrate.

In the first typical aspect of the present process, the third silicon oxide film on the silicon nitride film is removed after the step (d), while leaving the third silicon oxide film only in the groove, thereby forming an element isolation groove embedded with the third silicon oxide film, and then heat-treating (or annealing) the semiconductor substrate, thereby sintering the third silicon oxide film embedded in the groove.

In the first typical aspect of the present process, the step (c) is carried out in a nitrogen-containing atmosphere, thereby forming a second silicon nitride film on the inside wall of the groove just before fully filling the space formed by recess of the pad oxide film, and rounding the shoulder edge of the groove at the same time.

In the first typical aspect of the present process, a second silicon nitride film is formed at least on the surface of the second silicon oxide film after the step (c) but before the step (d).

According to a second typical aspect of the present invention, a process for producing a semiconductor device comprises the following steps:

(a) a step of thermally oxidizing a semiconductor substrate, thereby forming a pad oxide film (a first silicon oxide film) on the principal side (or surface) of the semiconductor substrate, then depositing a silicon nitride film on the first silicon oxide film, and then selectively etching the silicon nitride film and the first silicon oxide film residing in an element isolation region while masking an element region, (b) a step of isotropically and shallowly etching the semiconductor substrate in the element isolation region, thereby forming the undercut on the semiconductor substrate at the edge of the element isolation region, (c) a step of selectively etching the semiconductor substrate in the element isolation region, thereby trenching a groove on the principal side (or surface) of the semiconductor substrate, (d) a step of thermally oxidizing the semiconductor substrate, thereby forming a second silicon oxide film on the inside wall of the groove and rounding the shoulder edge of the groove at the same time, (e) a step of depositing a third silicon oxide film on the principal side (or surface) of the semiconductor substrate, thereby embedding the third silicon oxide film in the groove, (f) a step of heat-treating (or annealing) the semiconductor substrate, thereby sintering the third silicon oxide film embedded in the groove, (g) a step of removing the third silicon oxide film on the silicon nitride film, while leaving the third silicon oxide film only in the groove, thereby forming an element isolation groove embedded with the third silicon oxide film, and (h) a step of removing the silicon nitride film on the surface of an active region whose circumference is confined by the element isolation groove, and then forming a semiconductor element in the active region.

According to a third typical aspect of the present invention, a process for producing a semiconductor device comprises the following steps:

(a) a step of thermally oxidizing a semiconductor substrate, thereby forming a first silicon oxide film on the principal side (or surface) of the semiconductor substrate, then depositing a first silicon nitride film on the first silicon oxide film and then selectively etching the first silicon nitride film, the first silicon oxide film and the semiconductor substrate residing in an element isolation region while masking an element region, thereby trenching a groove on the principal side (or surface) of the semiconductor substrate.

(b) a step of etching the first silicon oxide film exposed to the inside wall of the groove, thereby recessing the first silicon oxide film from the inside wall of the groove to an extent of 5 to 40 nm towards an active region, (c) a step of thermally oxidizing the semiconductor device, thereby forming a second silicon oxide film on the inside wall of the groove in the range for filling the second silicon oxide film in the recess space formed up to the recessed first silicon oxide film, and rounding the shoulder edge of the groove at the same time, (d) a step of depositing a second silicon nitride film on the semiconductor substrate including the inside of the groove by chemical vapor deposition, (e) a step of depositing a third silicon oxide film on the principal side (or surface) of the semiconductor substrate, thereby embedding the third silicon oxide film in the groove, (f) a step of heat-treating (or annealing) the semiconductor substrate, thereby sintering the third silicon oxide film embedded in the groove, (g) a step of removing the third silicon oxide film and the second silicon nitride film on the first silicon nitride film, while leaving the third silicon oxide film and the second silicon nitride film only in the groove, thereby forming an element isolation groove embedded with the third silicon oxide film and the second silicon nitride film, (h) a step of removing the first silicon nitride film on the surface of the active region whose circumference is confined by the element isolation groove by etching, (i) a step of thermally oxidizing the third silicon oxide film in the element isolation groove, thereby increasing the thickness of the film and filling a recess formed by simultaneous removal of the second silicon nitride film at the shoulder edge of the element isolation groove during the removal of the first silicon nitride film by etching, and (j) a step of forming a semiconductor element in the active region.

According to a fourth typical aspect of the present invention, a process for producing a semiconductor device comprises the following steps:

(a) a step of thermally oxidizing a semiconductor substrate, thereby forming a first silicon oxide film on the principal side (or surface) of the semiconductor substrate, then depositing a first silicon nitride film on the first silicon oxide film, and then selectively etching the first silicon nitride film, the first silicon oxide film and the semiconductor substrate residing in an element isolation zone while masking an element region, thereby trenching a groove on the principal side (or surface) of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of thermally oxidizing the semiconductor substrate, thereby forming a second silicon oxide film on the inside wall of the groove in the range for filling the second silicon oxide film in the recess space formed up to the recessed first silicon oxide film, and rounding the shoulder edge of the groove at the same time, (d) a step of depositing a second silicon nitride film on the semiconductor substrate including the inside of the groove by chemical vapor deposition, (e) a step of depositing a third silicon oxide film on the principal side (or surface) of the semiconductor substrate, thereby embedding the third silicon oxide in the groove, (f) a step of removing the third silicon oxide film and the second silicon nitride film on the first silicon nitride film, while leaving the third silicon oxide film and the second silicon nitride film only in the groove, thereby forming an element isolation groove embedded with the third silicon oxide film and the second silicon nitride film, (g) a step of heat-treating (or annealing) the semiconductor substrate, thereby sintering the third silicon oxide film embedded in the groove and oxidizing the surface of the first silicon nitride film and the surface of the second silicon nitride film on the shoulder edge of the element isolation groove, (h) a step of removing the first silicon nitride film on the surface of the active region whose circumference is confined by the element isolation groove and the oxide film on the surface of the first silicon nitride film by etching, and (i) a step of forming a semiconductor element in the active region.

According to the fifth typical aspect of the present invention, a process for producing a semiconductor device comprises the following steps:

(a) a step of thermally oxidizing a semiconductor substrate, thereby forming a first silicon oxide film (a pad oxide film) on the principal side (or surface) of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the principal side (or surface) of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of depositing a second silicon oxide film (an embedded oxide film) on the principal side (or surface) of the semiconductor substrate, thereby embedding the second silicon oxide film in the groove, (d) a step of thermally oxidizing the semiconductor substrate, thereby sintering the second silicon oxide film embedded in the groove, forming a third silicon oxide film (a heat oxide film) on the inside wall of the groove and rounding the shoulder edge of the groove at the same time, (e) a step of removing the second silicon oxide film on the silicon nitride film, while leaving the second silicon oxide film only in the groove, thereby forming an element isolation groove embedded with the second silicon oxide film, and (f) a step of removing the silicon nitride film on the surface of the active region whose circumference is confined by the element isolation groove, and then forming a semiconductor element in the active region.

According to a sixth typical aspect of the present invention, a process for producing a semiconductor device comprises the following steps:

(a) a step of thermally oxidizing a semiconductor substrate, thereby forming a first silicon oxide film (a pad oxide film) on the principal side (or surface) of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the principal side (or surface) of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of depositing a second silicon oxide film (an embedded oxide film) on the principal side (or surface) of the semiconductor substrate, thereby embedding the second silicon oxide film in the groove, (d) a step of removing the second silicon oxide film on the silicon nitride film, while leaving the second silicon oxide film only in the groove, thereby forming an element isolation groove embedded with the second silicon oxide film, (e) a step of thermally oxidizing the semiconductor substrate, thereby sintering the second silicon oxide film embedded in the groove, forming a third silicon oxide film (a heat oxide film) on the inside wall of the groove and rounding the shoulder edge of the groove at the same time, and (f) a step of removing the silicon nitride film on the surface of the active region whose circumference is confined by the element isolation groove, and then forming a semiconductor element in the active region.

According to a seventh typical aspect of the present invention, a process for producing a semiconductor device comprises the following steps:

(a) a step of thermally oxidizing a semiconductor substrate, thereby forming a first silicon oxide film on the principal side (or surface) of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the principal side (or surface) of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of thermally oxidizing the semiconductor substrate, thereby forming a second silicon oxide film on the inside wall of the groove in the range for filling the second silicon oxide film in the recess space formed up to the edge of the recessed first silicon oxide film, and rounding the shoulder edge of the groove at the same time, (d) a step of depositing a polycrystalline silicon film on the principal side (or surface) of the semiconductor substrate, (e) a step of depositing a third silicon oxide film on the principal side (or surface) of the semiconductor substrate, thereby embedding the third silicon oxide film in the groove, (f) a step of heat-treating (or annealing) the semiconductor substrate, thereby sintering the third silicon oxide film embedded in the groove and oxidizing the polycrystalline silicon film to convert at least a portion thereof to a silicon oxide film, (g) a step of removing the third silicon oxide film and the silicon oxide film on the silicon nitride film, while leaving the third silicon oxide film and the silicon oxide film only in the groove, thereby forming an element isolation groove embedded with the third silicon oxide film and the silicon oxide film, and (h) a step of removing the silicon nitride film on the surface of the active region whose circumference is confined by the element isolation groove, and then forming a semiconductor element in the active region.

According to an eighth typical aspect of the present invention, a process for producing a semiconductor device comprises the following steps:

(a) a step of thermally oxidizing a semiconductor substrate, thereby forming a first silicon oxide film on the principal side (or surface) of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the principal side (or surface) of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of thermally oxidizing the semiconductor substrate, thereby forming a second silicon oxide film on the inside wall of the groove in the range for filling the second silicon oxide film in the recess space formed up to the edge of recessed first silicon oxide film and rounding the shoulder edge of the groove at the same time, (d) a step of depositing a polycrystalline silicon film on the principal side (or surface) of the semiconductor substrate, (e) a step of depositing a third silicon oxide film on the principal side (or surface) of the semiconductor substrate, thereby embedding the third silicon oxide film in the groove, (f) a step of removing the third silicon oxide film and the polycrystalline silicon film on the silicon nitride film, while leaving the third silicon oxide film and the polycrystalline silicon film in the groove, thereby forming an element isolation groove embedded with the third silicon oxide film and the polycrystalline silicon film, (g) a step of heat-treating (or annealing) the semiconductor substrate, thereby sintering the third silicon oxide film embedded in the groove and oxidizing the polycrystalline silicon film to convert at least a portion thereof to a silicon oxide film, and (h) a step of removing the silicon nitride film on the surface of the active region whose circumference is confined by the element isolation groove, and then forming a semiconductor element in the active region.

According to a ninth typical aspect of the present invention, a process for producing a semiconductor device comprises the following steps:

(a) a step of oxidizing a semiconductor substrate, thereby forming a first silicon oxide film (a pad oxide film) on the principal side (or surface) of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the principal side (or surface) of the semiconductor substrate, (b) a step of etching the first silicon oxide film exposed to the inside wall of the groove, thereby recessing the first silicon oxide film from the inside wall of the groove towards an active region in an extent of 5 to 40 nm, (c) a step of heat-nitriding the semiconductor substrate, thereby forming a second silicon nitride on the inside wall of the groove, (d) a step of depositing a second silicon oxide film (an embedded oxide film) on the principal side (or surface) of the semiconductor substrate, thereby embedding the second silicon oxide film in the groove, (e) a step of heat-treating (or annealing) the semiconductor substrate, thereby sintering the second silicon oxide film embedded in the groove, (f) a step of removing the second silicon oxide film on the first silicon nitride film, while leaving the second silicon oxide film only in the groove, thereby forming an element isolation groove embedded with the second silicon oxide film, and (g) a step of removing the first silicon nitride film on the surface of the active region whose circumference is confined by the element isolation groove, and then forming a semiconductor element in the active region.

According to the tenth typical aspect of the present invention, a process for producing a semiconductor device comprises the following steps:

(a) a step of thermally oxidizing a semiconductor substrate, thereby forming a first silicon oxide film on the principal side (or surface) of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the principal side (or surface) of the semiconductor substrate, (b) a step of etching the first silicon oxide film exposed to the inside wall of the groove, thereby recessing the first silicon oxide film from the inside wall of the groove towards an active region in an extent of 5 to 40 nm, (c) a step of thermally oxidizing the semiconductor substrate, thereby forming a second silicon oxide film on the inside wall of the groove, and then nitriding the second silicon oxide film, thereby converting at least a portion thereof to a silicon nitride film, (d) a step of depositing a third silicon oxide film on the principal side (or surface) of the semiconductor substrate, thereby embedding the third silicon oxide film in the groove, (f) a step of removing the third silicon oxide film on the first silicon nitride film, while leaving the third silicon oxide film only in the groove, thereby forming an element isolation groove embedded with the third silicon oxide film, and (g) a step of removing the first silicon nitride film on the surface of the active region whose circumference is confined by the element isolation groove, and then forming a semiconductor element in the active region.

According to the eleventh typical aspect of the invention, a process for producing a semiconductor device comprises the following steps:

(a) a step of thermally oxidizing a semiconductor substrate, thereby forming a first silicon oxide film (a pad oxide film) on the principal side (or surface) of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the principal side (or surface) of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of depositing a polycrystalline silicon film on the semiconductor substrate, and then nitriding the polycrystalline silicon film, thereby converting at least a portion thereof to a silicon nitride film, (d) a step of depositing a second silicon oxide film (an embedded oxide film) on the principal side (or surface) of the semiconductor substrate, thereby embedding the second silicon oxide film in the groove, (e) a step of heat-treating (or annealing) the semiconductor substrate, thereby sintering the second silicon oxide film embedded in the groove, (f) a step of removing the second silicon oxide film on the first silicon nitride film, while leaving the second silicon oxide film only in the groove, thereby forming an element isolation groove embedded with the second silicon oxide film, and (g) a step of removing the first silicon nitride film on the surface of the active region whose circumference is confined by the element isolation groove, and then forming a semiconductor element in the active region.

The embodiments of the present invention will be described in detail below, referring to drawings, where members having the same function will be identified with the same reference numerals throughout the drawings illustrating the embodiments of the present invention to omit repeat explanation.

EXAMPLE 1

Steps of producing a groove isolation structure of a semiconductor device according to the first embodiment of the present invention will be explained below, referring to FIGS. 2A to 2I and FIG. 3.

Figure 1A:
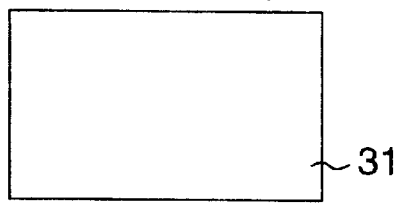
FIGS. 1A to 1D and 1B' and 1C' schematically show steps of producing a groove isolation structure by the conventional selective oxidation process.
Figure 1B:
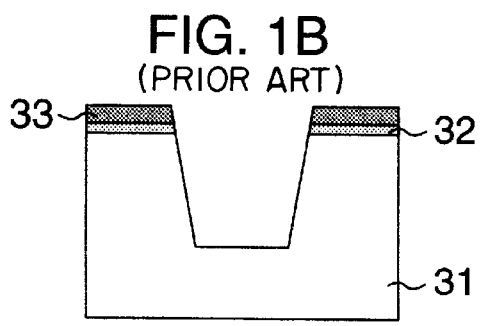
Figure 1B:
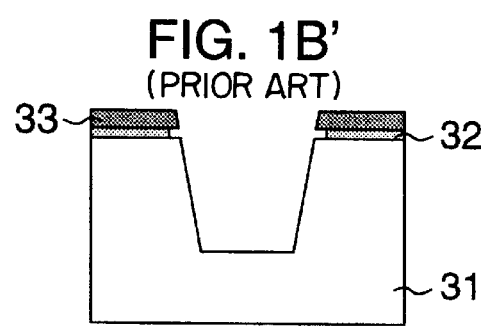
Figure 1C:
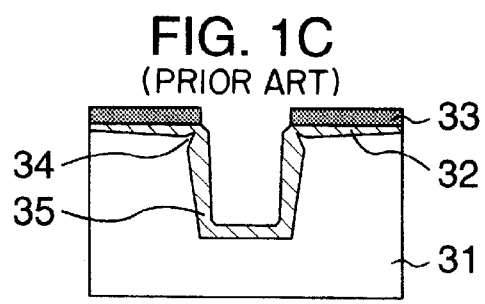
Figure 1C:
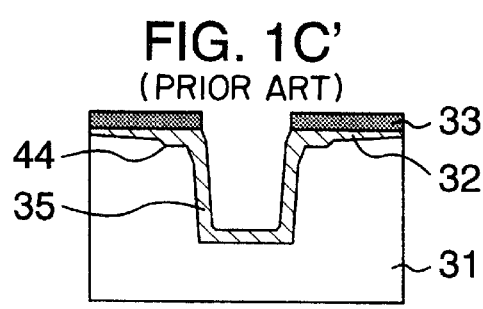
Figure 1D:
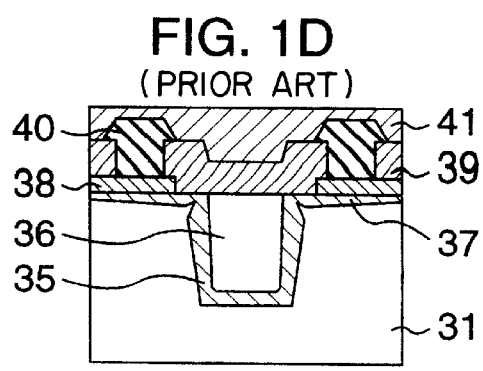
Figure 2A:
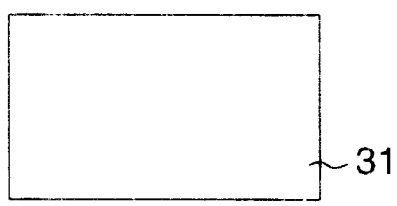
FIGS. 2A to 2I schematically show steps of producing a groove isolation structure according to a first embodiment of the present invention.
Figure 2B:
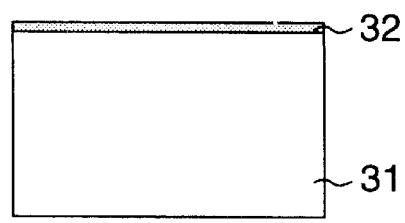
Figure 2C:
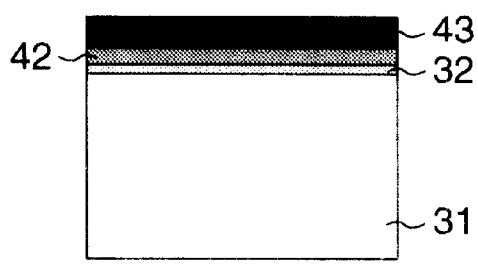
Figure 2D:
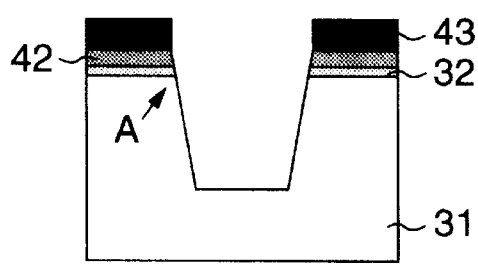
Figure 2E:
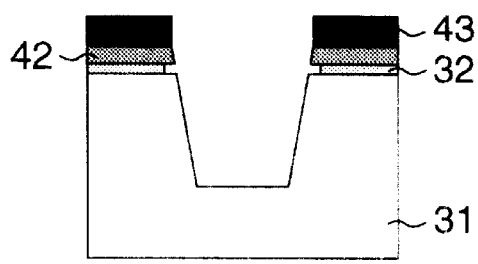
Figure 2F:
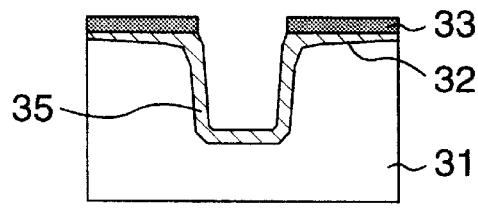
Figure 2G:
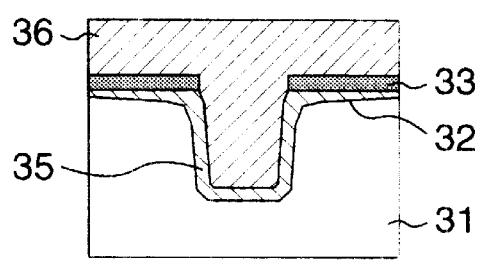
Figure 2H:
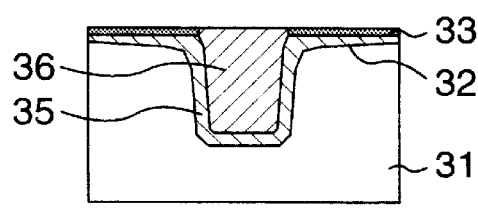
Figure 2I:
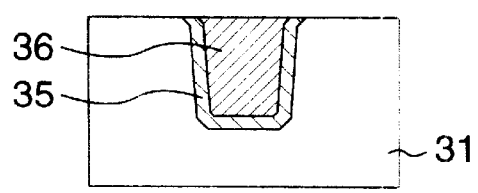
Figure 3:
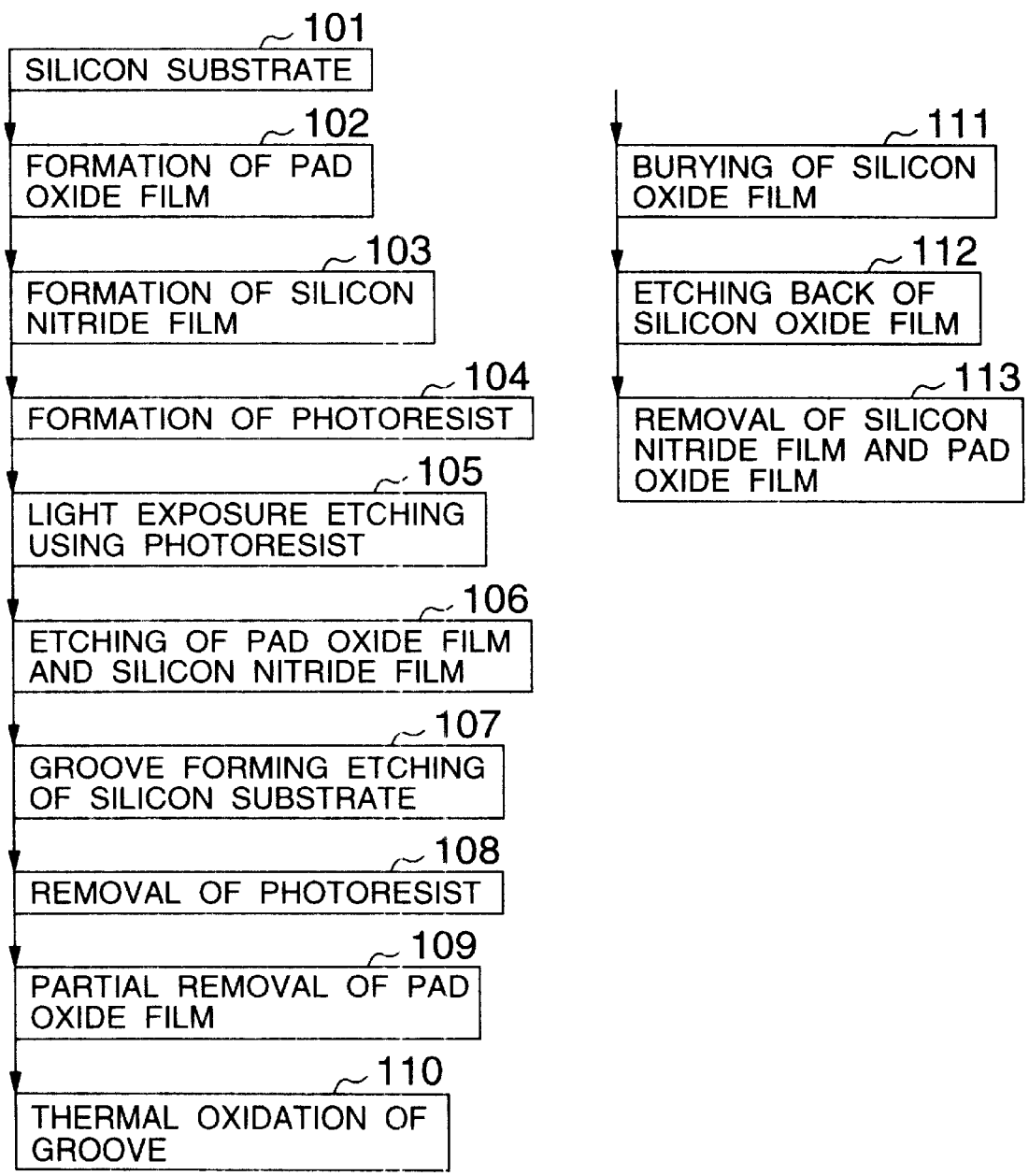
FIG. 3 is a flow chart showing steps of producing a groove isolation structure according to the first embodiment of the present invention.

FIGS. 2A to 2I are cross-sectional structured elevation views of a semiconductor device according to the present process and FIG. 3 is a flow chart showing outlines of steps of the process. Steps will be explained, referring to FIGS. 2A to 2I according to the flow chart of FIG. 3.

(1) The surface of silicon substrate 31 was thermally oxidized to form a pad oxide film 32 having a thickness of about 10 nm (101 and 102 in FIG. 3).

(2) Silicon nitride film 42 was deposited to a thickness of about 200 nm on pad oxide film 32 and used as an anti-oxidation film when element isolation, thermally oxidized film 35 was formed (103 in FIG. 3).

(3) Photoresist 43 was formed on silicon nitride film 42 (104 in FIG. 3).

(4) Photoresist 43 at a desired position was removed by an ordinary light exposure procedure, and then parts of silicon nitride film 42, pat oxide film 32 and silicon substrate 31 were removed by etching, and a shallow groove was trenched at a predetermined angle of the inside wall of the groove to the surface of silicon substrate 31 (for example, at an angle of 95° to 110° as shown by A in FIG. 2D) (105 to 107 in FIG. 3).

(5) Photoresist 43 was removed and then pad oxide film 32 was recessed (or partially removed) in an extent of 5 to 40 nm by etching (108 and 109 in FIG. 3).

(6) Then, the surface of silicon substrate 31 was thermally oxidized to a thickness of about 30 nm, for example, in a dry oxidative atmosphere at 900° to 1,000° C. to form a heat (or thermal)-oxidized film 35 on the inside wall of the groove (110 in FIG. 3).

(7) An isolation film such as a silicon oxide film, etc. was deposited thereon by chemical vapor deposition (CVD), sputtering etc. to embed (or bury) the isolation film in the groove (the isolation film will be hereinafter referred to as embedding isolation film 36). The silicon oxide film, etc. deposited by chemical vapor deposition, sputtering, etc. are usually porous films, and thus after the deposition of embedding isolation film 36 silicon substrate 31 may be annealed at about 1,000° C. or oxidized in an oxidative atmosphere at about 1,000° C. to make the film compact (111 in FIG. 3)

(8) Embedding isolation film 36 was etched back by chemical mechanical polishing (CMP) or dry etching, where silicon nitride film 42 used as an anti-oxidation film served as an etching stopper to prevent silicon substrate 31 below silicon nitride film 42 from etching (112 in FIG. 3).

(9) Silicon nitride film 42 and pad oxide film 32 were removed, thereby the embedded groove structure was completed (113 in FIG. 3). Then, a semiconductor device was fabricated through necessary mounting procedures for producing a transistor structure, for example, by formation of gate oxide films and gate electrodes, doping with impurities, formation of wiring, interlayer insulating films, etc. formation of a surface protective film, etc.

Figure 4:
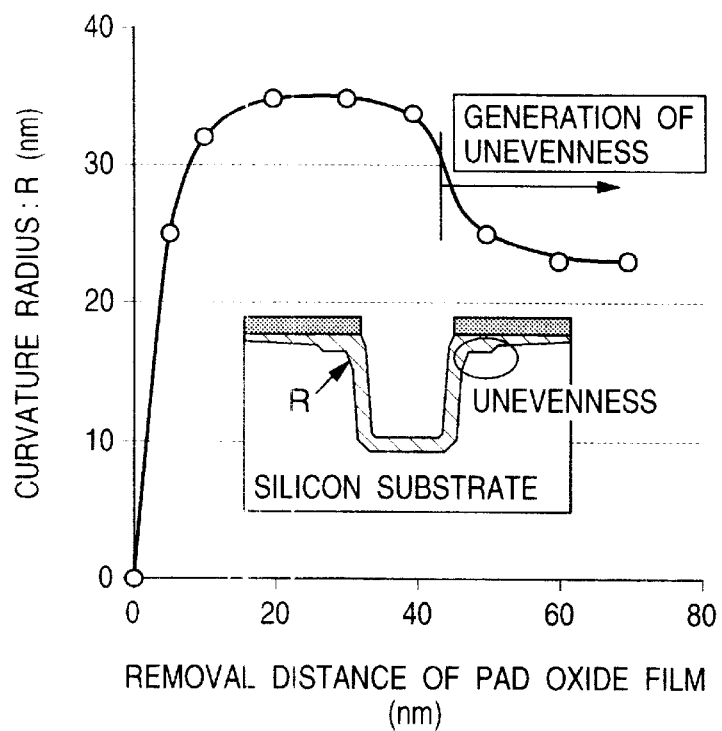
FIG. 4 is a diagram showing the working and effect of the first embodiment of the present invention.

Working and effects of the first embodiment of the present invention will be explained below, referring to FIG. 4 and FIGS. 5A and 5B.

Distinction of the first embodiment of the present invention from the prior art is that the extent of recessing pad oxide film 32 in the foregoing step (5) is limited. FIG. 4 shows results of analyzing changes in radius of curvature of the silicon substrate 31 at the groove upper edge by changing the extent of recessing pad oxide film 32, where the extent of recessing pad oxide film 32 is given on the axis of abscissa and the radius at curvature of silicon substrate at the groove upper edge on the exist of ordinate. As is evident from FIG. 4, the radius of curvature of the substrate at the groove upper edge increases with increasing extent of recessing pad oxide film 32 from zero, reaches about 25 nm with a recessing extent of 5 nm and further increases to about 35 nm with a recess extent of 20 nm. However, when the recessing extent is increased beyond 40 nm, a step is formed on the upper side of the substrate at the groove upper edge, reducing the radius of curvature, for example, to 25 nm with a recessing extent of 60 nm.

Figure 5A:
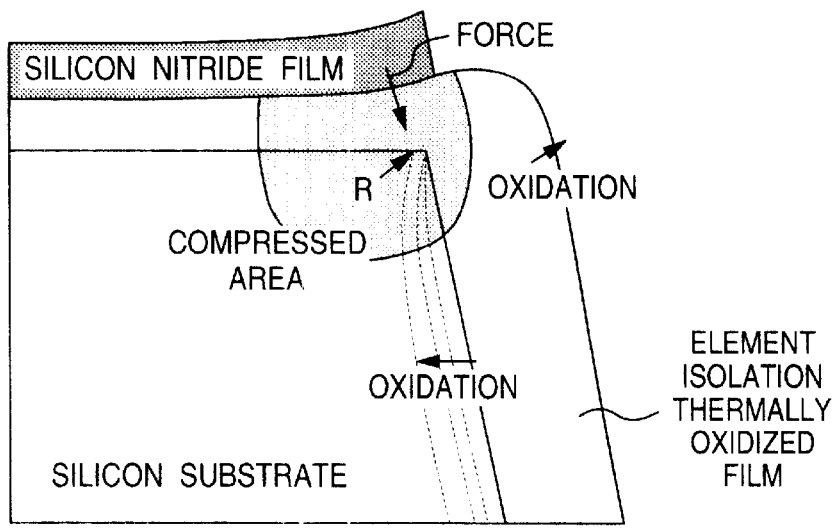
FIGS. 5A and 5B show the working and effect of the first embodiment of the present invention.
Figure 5B:
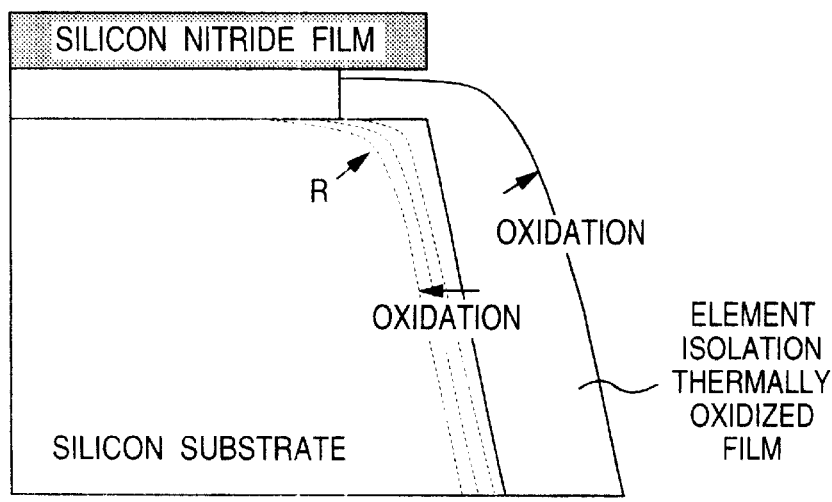

It can be presumed that the dependency of the radius of curvature upon the extent of recessing the pad oxide film is due to the following grounds;

The oxide film starts to grow during the groove oxidation, while undergoing approximately 2-fold volumic expansion between silicon nitride film 42 and silicon substrate 31 (FIGS. 5A and 5B). When the extent of recessing pad oxide film 32 is zero, edge of silicon nitride film 42 is pushed upwards by the volumic expansion, deforming the silicon nitride film into a upwardly warped concave shape. A counterforce develops due to the warping deformation of silicon nitride film 42, resulting in development of compression stress both in the oxide film (including part of pad oxide film 32) below silicon nitride film 42 and in the silicon substrate (FIG. 5A). Once the compression stress develops, diffusion of oxidative seeds, that is, progress of oxidation reaction, is suppressed, so that the rate of oxidation is considerably lowered at the groove upper edge. On the groove inside wall on the other hand, the growth direction (direction normal to the inside wall surface) of the oxide film is free from any restriction, that is, there is no inhibiting factor against the volumic expansion of the growing oxide film, and thus oxidation can process on the inside wall surface without any restriction in contrast to the oxidation of the groove upper edge. Thus, the substrate shape is sharpened at the groove upper edge of silicon substrate 31 with progress of oxidation, as shown by dotted lines in FIG. 5A.

When pad oxide film 32 is recessed, an exposed region of silicon substrate 31 at the groove upper edge and an unexposed region thereof are formed (FIG. 5B). In the exposed region, the growing oxide film is not in contact with upper layer silicon nitride film 42 at the initial stage of oxidation and thus no compression stress due to the warping deformation of silicon nitride film 42, as explained above, referring to FIG. 5A, develops substantially, and thus oxidation can proceed without any restriction. Furthermore, silicon substrate 31 is in two-side contact (i.e. in two oxygen supply directions) at the groove upper edge, and thus oxidation can proceed rapidly, resulting in rounding the groove upper edge, that is, increasing the radius of curvature.

In the unexposed region of silicon substrate 31, on the other hand, diffusion of oxidative seeds is inhibited by the presence of pad oxide film 32, that is, the oxidation is inhibited. Thus, a step is formed on the silicon substrate around the edge of pad oxide film 32, because of a difference in the rate of oxidation, as shown in FIG. 4. When the extent of recessing pad oxide film 32 is not more than 40 nm, the step is not formed, because of an approach to the readily oxidizable groove upper edge part (in two oxygen supply directions). Thus the radius of curvature is as large as 35 nm. On the other hand, when the recessing extent is more than 40 nm, a step is formed because of remoteness from the groove upper edge part, resulting in decreasing the radius of curvature. It should be noted that, when oxidation is further continued in the step (6), the oxide film growing on the exposed part will be brought into contact with the silicon nitride film, followed by rapid development of a compression stress, as explained above. That is, the radius of curvature so far attained will be again decreased.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to remove the edges), followed by oxidation in the grooves.

In the first embodiment of the present invention, no step is formed any more on the substrate around the upper edge of groove isolation structure and a much larger radius of curvature than 3 nm can be obtained by restricting an extent of recessing the pad oxide film to a range of 5 to 40 nm, and thus an increase in transistor leakage current or a decrease in gate breakdown voltage due to the field concentration around the edge of gate electrode film can be effectively prevented and also the transistor electric reliability can be effectively improved. The shoulder edge of the groove can be more preferably rounded by providing an undercut, as shown in FIG. 34, before trenching the groove.

EXAMPLE 2

Steps of producing a groove isolation structure of a semiconductor device according to a second embodiment of the present invention will be explained below, referring to FIGS. 2A to 2I and FIG. 6.

Figure 6:
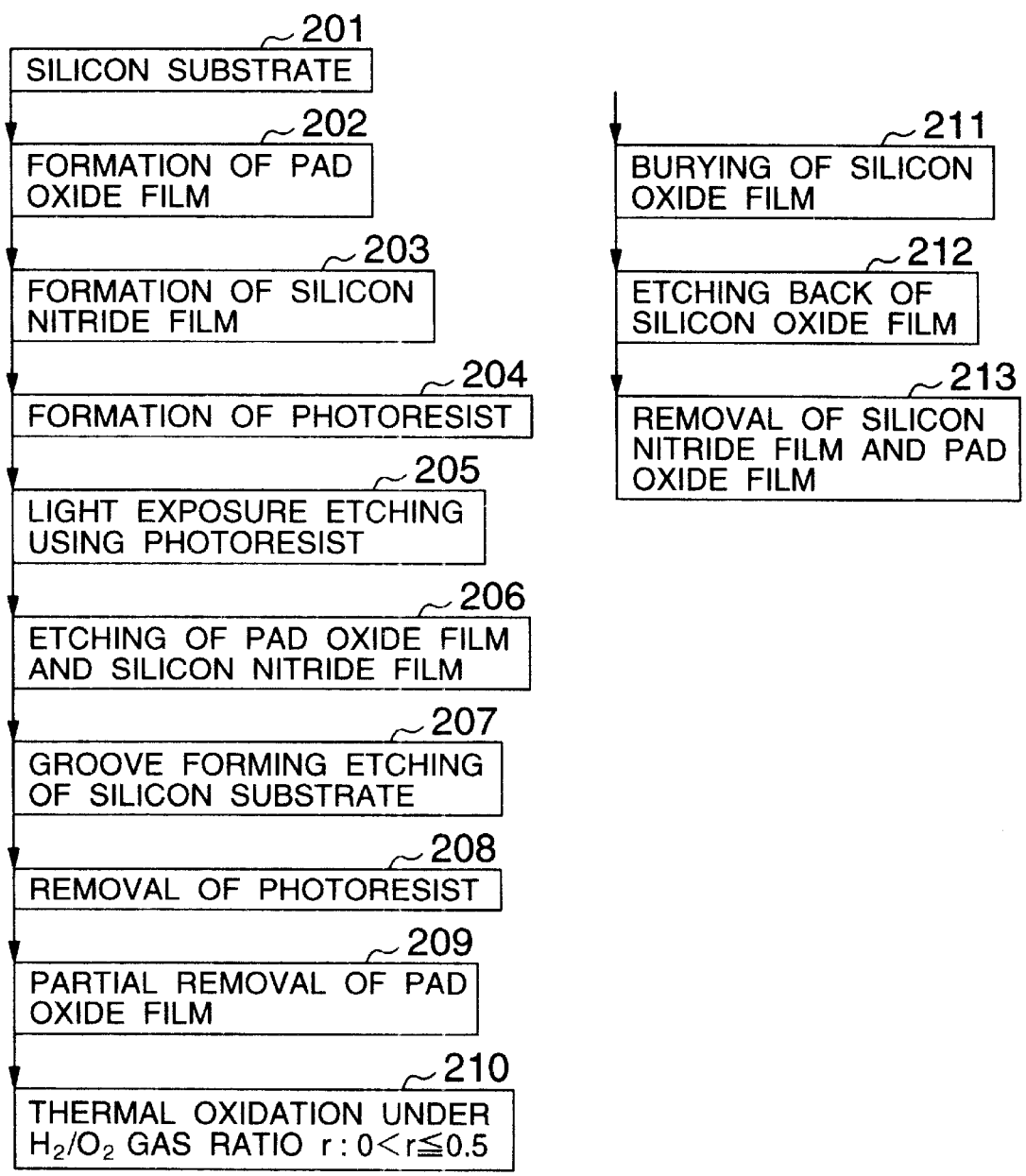
FIG. 6 is a flow chart showing steps of producing a groove isolation structure according to a second embodiment of the present invention.

Process for producing an embedded groove structure of a semiconductor device according to the second embodiment of the present invention (flow chart) shown in FIG. 6 is a modification of step (6) of the process according to the first embodiment of the present invention. The embedded groove structure of the second embodiment is not largely different in structure, etc. from that of the first embodiment, and thus the steps of the second embodiment will be explained below, referring to the flow chart of FIG. 6, using the cross-sectional structural elevation views of the semiconductor device shown in FIGS. 2A to 2I.

(1) The surface of silicon substrate 31 was thermally oxidized to form a pad oxide film 32 having a thickness of about 10 nm (201 and 202 in FIG. 6).

(2) Silicon nitride film 42 was deposited on pad oxide film 32 to a thickness of about 200 nm, and used as an anti-oxidation film when element isolation, thermally oxidized film 35 was formed (203 in FIG. 6).

(3) Photoresist 43 was formed on silicon nitride film 42 (204 in FIG. 6).

(4) Photoresist 43 at a desired position was removed by an ordinary light exposure procedure, and then parts of silicon nitride film 42, pad oxide film 32 and silicon substrate 31 were removed by etching, and a shallow groove was trenched at a predetermined angle of the inside wall of the groove to the surface of silicon substrate 31 (for example, at an angle of 95° to 110° as shown by A in FIG. 2D) (205 to 207 in FIG. 6).

(5) Photoresist 43 was removed and then pad oxide film 32 was recessed in an extent of 5 to 40 nm by etching (208 and 209 in FIG. 6).

(6) The groove trenched on silicon substrate 31 was thermally oxidized to a depth of about 30 nm in an oxidative atmosphere of $H_2/O_2$ gas mixture in a gas flow rate ratio of $H_2/O_2$ ($0<r\leq0.5$) to form an element isolation, thermally oxidized film 35 (210 in FIG. 6).

(7) An isolation film such as a silicon oxide film, etc. was deposited thereon by chemical vapor deposition (CVD), sputtering, etc. to embed the isolation film in the groove (the isolation film will be hereinafter referred to as embedding isolation film 36). The silicon oxide film, etc. deposited by chemical vapor deposition, sputtering, etc. are usually porous films and thus after the deposition of embedding isolation film 36 silicon substrate 31 may be annealed at about 1,000° C. or oxidized in an oxidative atmosphere at about 1,000° C. to make the film compact (211 in FIG. 6).

(8) Embedding isolation film 36 was etched back by chemical mechanical polishing (CMP) or dry etching, where silicon nitride film 42 used as an anti-oxidation film served as an etching stopper to prevent silicon substrate 31 below silicon nitride film 42 from etching (212 in FIG. 6).

(9) Silicon nitride film 42 and pad oxide film 32 were removed, whereby the embedded groove structure was completed (213 in FIG. 6). Then, a semiconductor device was fabricated through necessary mounting procedures for producing a transistor structure, for example, by formation of gate oxide films and gate electrodes, doping with impurities, formation of wirings, interlayer insulating films, etc., formation of a surface protective film, etc.

Figure 7:
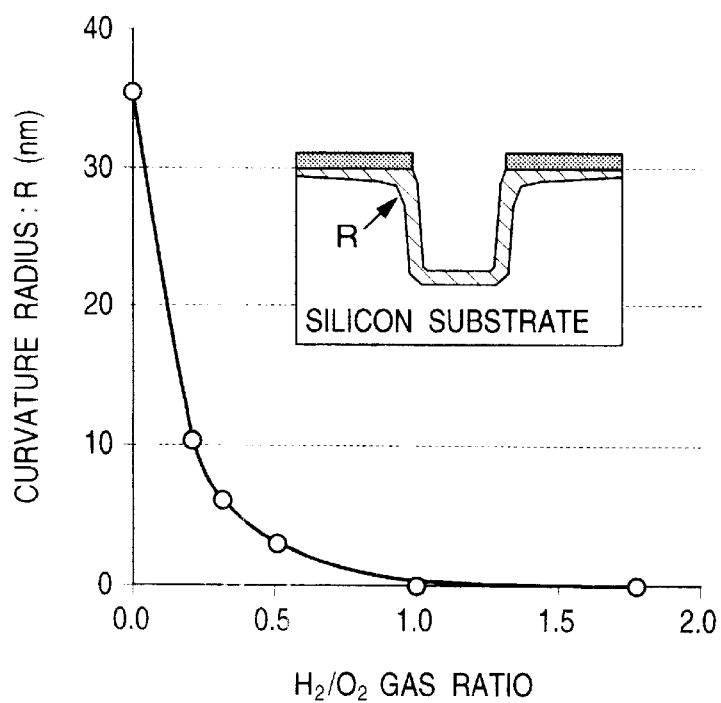
FIG. 7 is a diagram showing the working and effect of the second embodiment of the present invention.

Working and effects of the second embodiment of the present invention will be explained below, referring to FIG. 7.

A gas flow rate ratio of $H_2/O_2$ of the oxidative atmosphere can be changed in a range of $0<r\leq2$, but when r reaches 2 the reaction proceeds explosively. From the viewpoint of safety, the upper limit to r will be substantially about 1.8. When the oxidation temperature is presumed constant within the above-mentioned range of gas flow rate ratio, the rate of oxidation increases with increasing gas flow rate ratio, whereas the rate of oxidation decreases with decreasing gas flow rate ratio. Thus, an effect of the rate of oxidation upon the shape of upper edge of the groove of a semiconductor substrate was analyzed. The results are shown in FIG. 7, where a gas flow rate ratio of $H_2/O_2$ is shown on the axis of abscissa and a radius of curvature at the upper edge of the groove of a semiconductor substrate is shown on the axis of ordinate. As is evident from FIG. 7, the resulting radius of curvature drastically decreases with increasing gas flow rate ratio of hydrogen ($H_2$) in the oxidative atmosphere. When a gas flow rate ratio r reaches 0.5, the radius of curvature is decreased to about 3 nm. When the gas flow rate ratio is made higher, the radius of curvature further decreases, though little by little.

Grounds for such phenomena can be explained as follows:

Oxidation develops a strain (stress) around the boundary between the silicon substrate and the silicon oxide film, as already mentioned above. On the other hand, the silicon oxide film shows a remarkable viscous behavior at a high temperature (900° C. or higher), and thus the developed stress is lessened at a high temperature with time. When the thickness of the oxide film is presumed constant, the time required for lessening the developed stress will be shorter with increasing rate of oxidation (larger gas flow rate ratio of $H_2/O_2$), though the developed strain (stress) value is constant. Consequently, the residual stress will be increased. In case of lower rate of oxidation (smaller gas flow are ratio of $H_2/O_2$), the viscous effect of silicon oxide film can be brought about, so that the stress lessening proceeds relatively as compared under the conditions of constant oxide film thickness. The higher the stress induced by the oxidation, the more inhibited the oxidation in the region around the developed stress. Thus, the region of silicon substrate around the upper edge of the groove is a stress-concentrated site due to the growth of oxide film on the substrate upper side and the groove inside, and when the residual stress becomes higher, the oxidation around the stress concentrated site will be inhibited, so that the upper edge of the groove in silicon substrate will be sharpened. That is, oxidation of the semiconductor substrate around the upper edge of the groove can proceed in a low stress state by making a gas flow rate ratio of $H_2/O_2$ lower, so that the rounding of silicon substrate 31 can be attained around the upper edge of the groove.

From the foregoing grounds, the radius of curvature of the substrate around the upper edge of the groove in the groove isolation structure can be made much larger than 3 nm according to the second embodiment of the present invention. Furthermore, the extent of recessing the pad oxide film is set in a range of 5 to 40 nm as given in the first embodiment of the present invention, the step development on the upper surface of the substrate at the upper edge of the groove can be prevented. That is, an increase in transistor leakage current or a decrease in gate breakdown voltage due to the field concentration around the edge of gate electrode film can be effectively prevented and also the transistor electric reliability can be effectively improved. The shoulder edge of the groove can be more preferably rounded by providing an undercut, as shown in FIG. 34, before trenching the groove.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

EXAMPLE 3

Steps of producing an embedded groove structure of a semiconductor device according to a third embodiment of the present invention will be explained below, referring to FIGS. 2A to 2I and FIG. 8.

Figure 8:
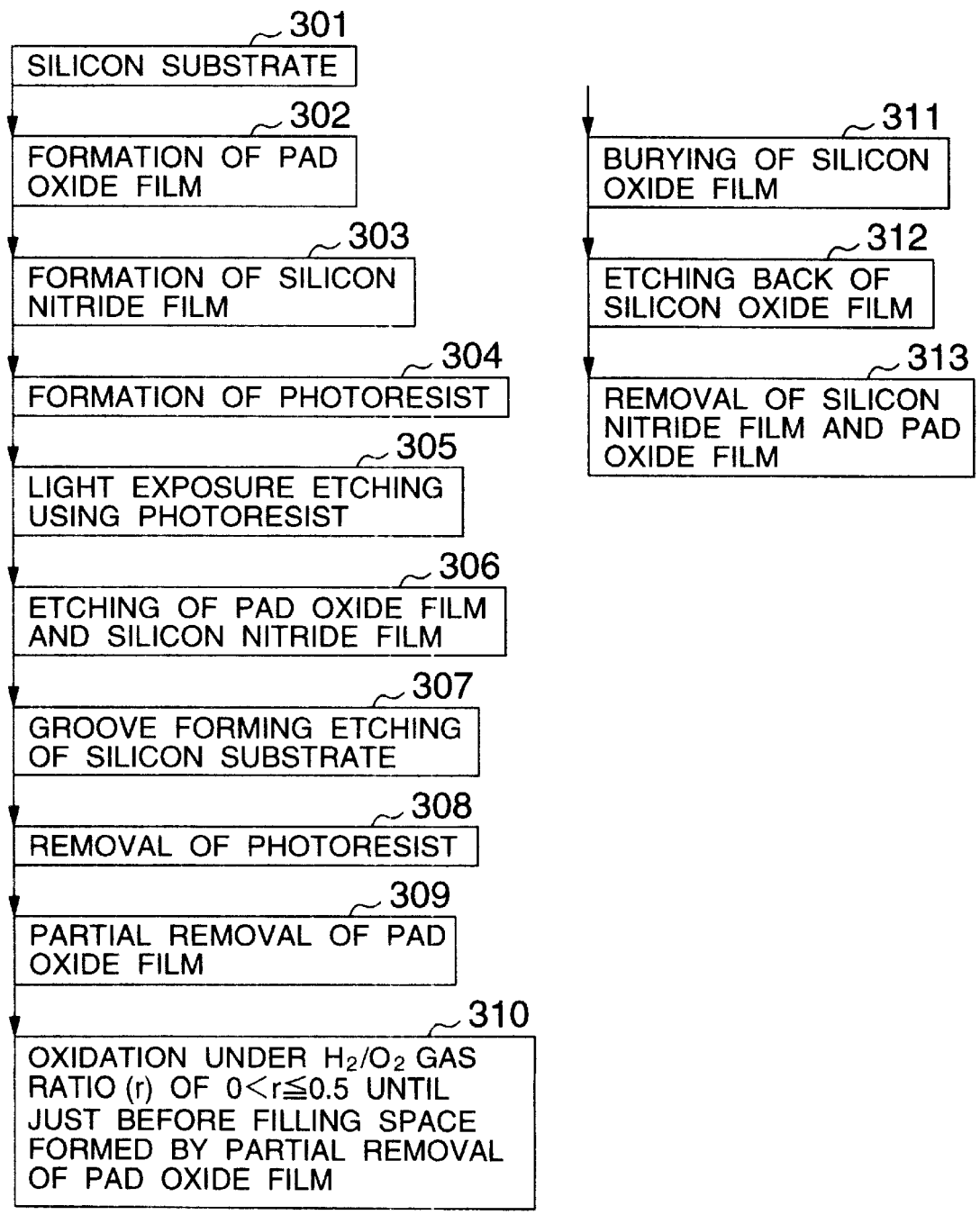
FIG. 8 is a flow chart showing steps of producing a groove isolation structure according to a third embodiment of the present invention.

Process for producing an embedded groove structure of a semiconductor device according to the third embodiment of the present invention (flow chart) shown in FIG. 8 is a modification of step (6) of the process according to the first embodiment of the present invention. The embedded groove structure of the third embodiment is not largely different in structure, etc. from that of the first embodiment, and thus the steps of the third embodiment will be explained below, referring to the flow chart of FIG. 8, using the cross-sectional structural elevation views of the semiconductor device shown in FIGS. 2A to 2I.

(1) The surface of silicon substrate 31 was thermally oxidized to form a pad oxide film 32 having a thickness of about 10 nm (301 and 302 in FIG. 8)

(2) Silicon nitride film 42 was deposited on pad oxide film 32 to a thickness of about 200 nm, and used as an anti-oxidation (film when element isolation, thermally oxidized film 35 was formed (303 in FIG. 8).

(3) Photoresist 43 was formed on silicon nitride film 42 (304 in FIG. 5).

(4) Photoresist film 43 at a desired position was removed by an ordinary light exposure procedure, and then parts of silicon nitride film 42, pad oxide film 32 and silicon substrate 31 were removed by etching, a shallow groove was trenched at a predetermined angle of inside wall of the groove to the surface of silicon substrate 31 (for example, at an angle of 95° to 110° as shown by A in FIG. 2D) (305 to 307 in FIG. 8).

(5) Photoresist 43 was removed and then pad oxide film 32 was recessed in an extent of 5 to 40 nm by etching (308 and 309 in FIG. 8).

(6) The groove trenched on silicon substrate 31 was thermally oxidized in an oxidative atmosphere of $H_2/O_2$ gas mixture in a gas flow rate ratio r of $H_2/O_2$ (o<r≦0.5) in the range wherein the recess space formed up to the edge of the recesses pad oxide film was filled (310 in FIG. 8).

(7) An isolation film such as a silicon oxide film, etc. was deposited thereon by chemical vapor deposition (CVD), sputtering, etc. to embed the isolation film in the groove (the isolation film will be hereinafter referred to as embedding isolation film 36). The silicon oxide film, etc., deposited by chemical vapor deposition, sputtering, etc. are usually porous films and thus after the deposition of embedding isolation film 36 silicon substrate 31 may be annealed at about 1,000° C. or oxidized in an oxidative atmosphere at about 1,000° C. to make the film compact (311 in FIG. 8).

(8) Embedding isolation film 36 was etched back by chemical mechanical polishing (CMP) or dry etching, where silicon nitride film 42 used as an anti-oxidation film served as an etching stopper to prevent silicon substrate 31 below silicon nitride film 42 from etching (312 in FIG. 8)

(9) Silicon nitride film 42 and pad oxide film 32 were removed, whereby the embedded groove structure was completed (313 in FIG. 8). Then, a semiconductor device was fabricated through necessary mounting procedures for producing a transistor structure, for example, by formation of gate oxide films and gate electrodes, doping with impurities, formation of wirings, interlayer insulating film, etc., formation of a surface protective film, etc.

Working and effects of the third embodiment of the present invention will be explained below, referring to FIGS. 2A to 2I.

As explained already in the first embodiment of the present invention (FIG. 4), silicon nitride film 42 undergoes upward warping deformation when the recess space formed up to the edge of the pad oxide film is fully filled by oxidation, and a compression stress develops on pad oxide film 32 below silicon nitride film 43 and silicon substrate 31 by a compression force due to the bending of film 43, so that the oxidation is inhibited by the stress, sharpening the silicon substrate around the upper edge of the groove. However, when the oxidation is carried out just before the recess space formed up to the edge of pad oxide film 32 is fully filled, no compression stress due to the warping deformation develops any more, so that the oxidation smoothly proceeds at the upper corner end of silicon substrate 31, rounding silicon substrate 31 around the upper end of the groove. Furthermore, the extent of recessing the pad oxide film is limited to a range of 5 to 40 nm, as given in the first embodiment of the present invention, development of a step on the upper surface of the silicon substrate at the upper edge of the groove can be prevented.

For the foregoing grounds, the radius of curvature of the substrate around the upper edge of the groove in the groove isolation structure can be made much larger than 3 nm according to the third embodiment of the present invention. Furthermore, the step development on the upper surface of the substrate at the upper edge of the groove can be prevented, so that an increase in transistor leakage current or a decrease in gate breakdown voltage due to the field concentration around the end of gate electrode film can be effectively prevented and also the transistor electric reliability can be effectively improved. The shoulder edge of the groove can be more preferably rounded by providing an undercut, as shown in FIG. 34, before trenching the groove.

It is also possible to further round the shoulder edge of the groove by removing edge portions of upper end portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

EXAMPLE 4

Embedded groove structure of a semiconductor device according to a fourth embodiment of the present invention and steps of producing the embedded groove structure will be explained below, referring to FIGS. 2A to 2I and FIG. 9.

Figure 9:
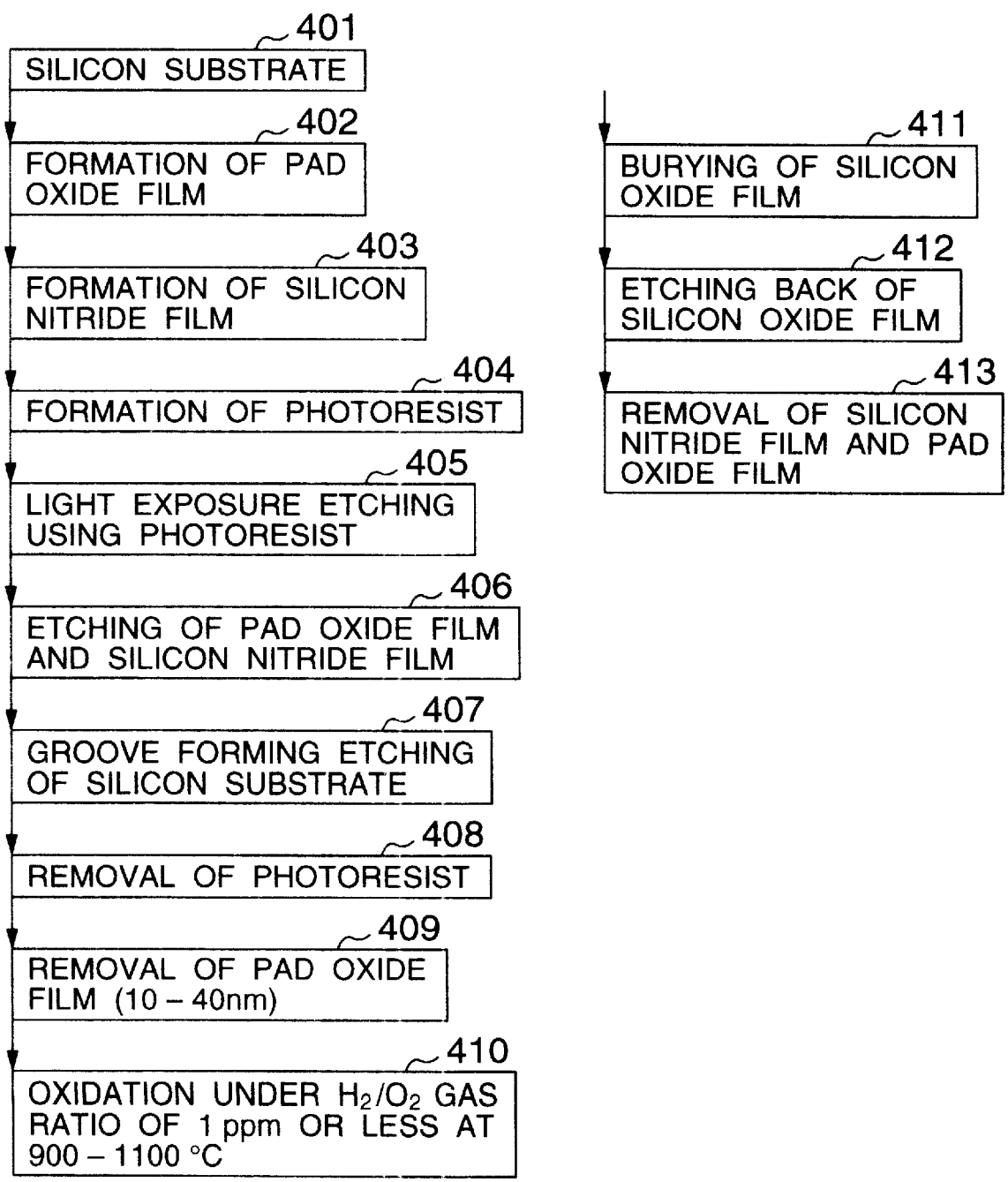
FIG. 9 is a flow chart showing steps of producing a groove isolation structure according to a fourth embodiment of the present invention.

FIGS. 2A to 2I are cross-sectional structural elevation views of a semiconductor device according to the fourth embodiment of the present invention and FIG. 9 is a flow chart showing outlines of steps of producing the present semiconductor device. Steps of producing the present semiconductor device will be explained below along the flow chart of FIG. 9, referring to FIGS. 2A to 2I.

(1) The surface of silicon substrate 31 was thermally oxidized to form a pad oxide film 32 having a thickness of 5 to 50 nm (401 and 402 in FIG. 9).

(2) Silicon nitride film 42 was deposited on pad oxide film 32 to a thickness of 10 to 300 nm, and used as an anti-oxidation film when element isolation, thermally oxidized film 35 is formed (403 in FIG. 9).

(3) Photoresist 43 was formed on silicon nitride film (404 in FIG. 9).

(4) Photoresist film 43 at a desired position was removed by an ordinary light exposure procedure, and then parts of silicon nitride film 42, pad oxide film 32 and silicon substrate 31 were removed by etching, and a shallow groove was trenched at a predetermined angle of inside wall of the groove to the surface of silicon substrate 31 (for example, at an angle of 95° to 110° as shown by A in FIG. 2D) (405 to 407 in FIG. 9).

(5) Photoresist 43 was removed and then pad oxide film 32 was recessed in an extent of 5 to 40 nm by etching (408 and 409 in FIG. 9).

(6) Then, silicon substrate 31 was thermally oxidized at an oxidation temperature of 900° to 1,000° C. in an oxidative atmosphere of $H_2/O_2$ of not more than 1 ppm, to form thermally oxidized film 35 in the range wherein the recess space formed up to the edge of the recessed pad oxide film is filled with the thermally oxidized film (410 in FIG. 9).

(7) An isolation film such as a silicon oxide film, etc. was deposited thereon by chemical vapor deposition (CVD), sputtering, etc. to embed the isolation film in the groove (the isolation film will be hereinafter referred to as embedding isolation film 36). The silicon oxide film, etc. deposited by chemical vapor deposition, sputtering, etc. are usually porous films and thus after the deposition of embedding isolation film 36 silicon substrate 31 may be annealed at about 1,000° C. or oxidized in an oxidative atmosphere at about 1,000° C. to make the film compact (411 in FIG. 9).

(8) Embedding isolation film 36 was etched back by chemical mechanical polishing (CMP) or dry etching, where silicon nitride film 42 used as an anti-oxidation film served as an etching stopper to prevent silicon substrate 31 below silicon nitride film 42 from etching (412 in FIG. 9).

(9) Silicon nitride film 42 and pad oxide film 32 were removed, whereby the embedded groove structure was completed (413 in FIG. 9). Then, a semiconductor device was fabricated through necessary mounting procedures for producing a transistor structure, for example, by formation of gate oxide films and gate electrodes, doping with impurities, formation of wirings, interlayer insulating films, etc., and formation of a surface protective film, etc. In the groove isolation structure of the semiconductor device according to the fourth embodiment of the present invention, the substrate has no step on the upper surface, and a nonotonously convexed shape around the upper edge of the groove, the oxide film thickness is in a range of 5 to 70 nm at the inside wall of the groove at the intermediate level of the groove isolation structure and the radius of curvature at the upper corner edge of semiconductor substrate is in a range of 3 to 35 nm.

Working and effects of the fourth embodiment of the present invention will be explained below, referring to FIG. 10.

FIG. 10 shows results of simulation of relations between the oxidized amount (thickness) of the element isolation, thermally oxidized film at the inside wall of the groove at the intermediate level and the radius of curvature at the upper corner edge of the substrate according to the fourth embodiment of the present invention, where "a" indicates a thickness of pad oxide film. As is evident from FIG. 10, the radius of curvature R at the upper corner edge of silicon substrate increases with increasing oxidized amount of inside wall of the groove, and reaches a maximum value. The maximum value depends upon the thickness a of pad oxide film, and increases with increasing thickness a, but reaches a constant value (about 35 nm) above a thickness a of 10 nm or more. The reason why the radius of curvature takes a maximum value is that the radius of curvature increase with progress of groove oxidation, and the recess space formed up to the edge of the recessed pad oxide film is gradually filled by the oxidation, resulting in development of upward warping deformation of the silicon nitride film (development of a compression stress on the silicon substrate and oxide film) with intrusion of oxidation therein, as shown in FIG. 5A and consequent inhibition of oxidation by the compression stress, making the radius of curvature smaller. Further, with an increase of oxidation amount stress in the thermal oxide film at the upper edge portions of groove increases probably due to inhibition of the oxidation.

It has been found by experiments that the radius of curvature R gives no adverse effect on the transistor characteristics, so far as it is about 3 nm or more. The oxidized amount on the inside wall of the groove is 5 nm or more, which can ensure the necessary radius of curvature, as given in FIG. 10. Even by oxidation over an oxidized amount of 30 nm the radius of curvature no more increases. Thus, to maximize the radius of curvature, it is preferable to make the thickness of pad oxide film 10 nm or more and the oxidized amount of groove inside wall 30 nm or more.

Furthermore, no step is developed on the upper surface of the substrate at the upper edge of groove, because the extent of recessing the pad oxide film is set in a range of 5 to 40 nm according to the fourth embodiment of the present invention. Thus, the substrate at the upper edge of the groove can have a monotonously convexed surface. The shoulder edge of the groove can be more preferably rounded by providing an undercut, as shown in FIG. 34, before trenching the groove.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

In the fourth embodiment of the present invention, the radius of curvature of the substrate around the upper edge of the groove can be made as large as about 35 nm, and the substrate has no step on the upper surface at the upper edge of the groove, and thus an increase in transistor leakage current or gate breakdown voltage due to the field concentration around the end of gate electrode film can be effectively prevented and also the transistor electric reliability can be effectively improved.

As described above, the present invention can provide a semiconductor device having a groove isolation structure without deterioration of gate breakdown voltage of transistors, and also a process for producing the same.

EXAMPLE 5

A process for producing a complementary MISFET (CMOSFET) according to a further embodiment of the present invention will be explained below, referring to FIGS. 11 to 32.

Figure 11:
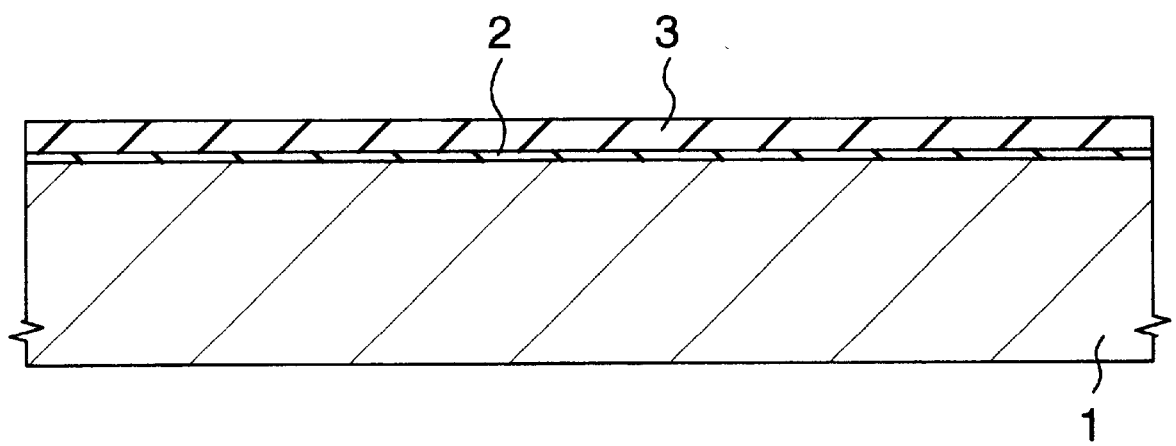

As shown in FIG. 11, for example, semiconductor substrate 1 of p-type single crystal silicon having a resistivity of about 1 to 10 Ωcm was thermally oxidized at a temperature of 800° to 850° C. to form a silicon oxide film (pad oxide film) 2 destined to stress lessening and protection of an active region on the principal side (or surface) thereof, and then silicon nitride film 3 was deposited on silicon oxide film 2 by CVD.

Figure 12:
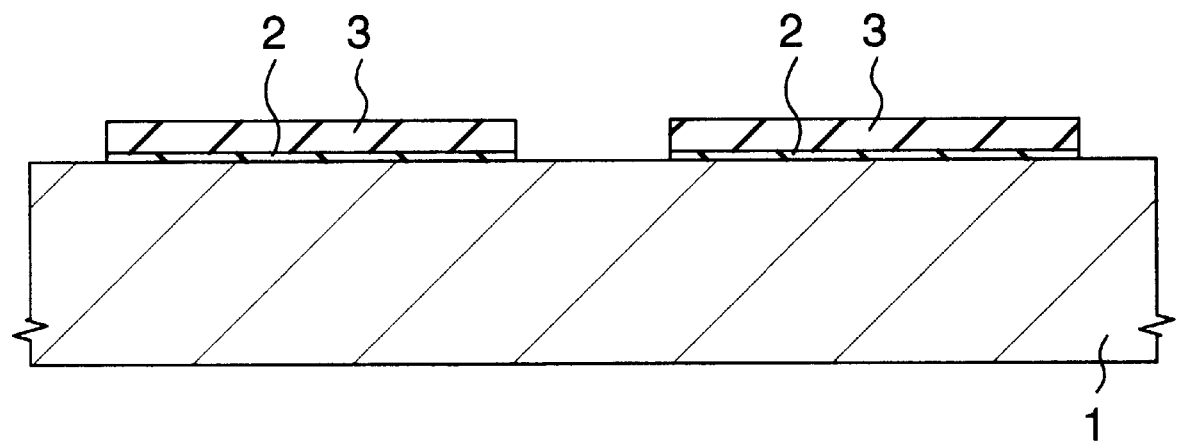
Figure 13:
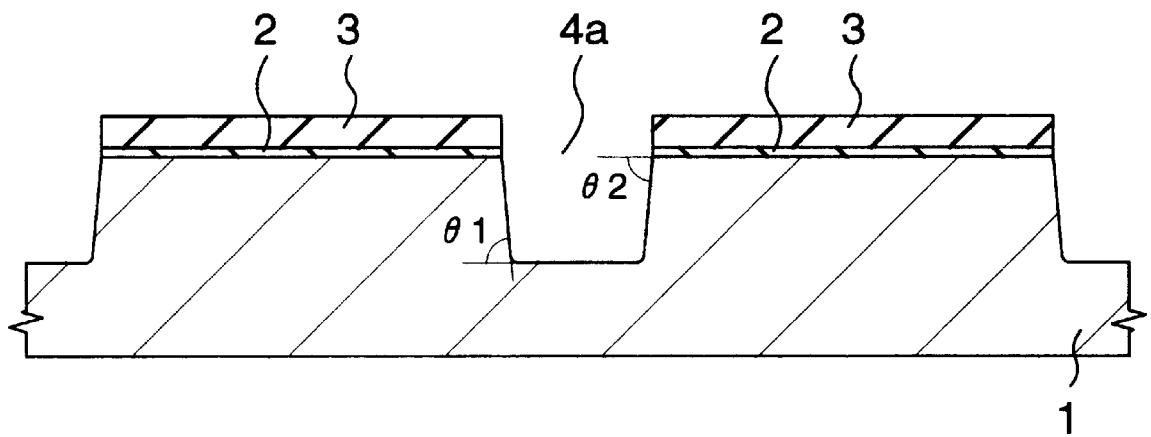

Then, as shown in FIG. 12, silicon nitride film 3 and silicon oxide film 2 in an element isolation region were removed by etching, using a photoresist as a mask, and then, as shown in FIG. 13, groove 4a was trenched to a depth of 350 to 400 nm on semiconductor substrate 1 in the element isolation zone by etching, using silicon nitride film 3 as a mask. In that case, the shoulder edge of the groove could be more preferably rounded by providing an undercut, as shown in FIG. 34, before trenching groove 4a. Inside wall of groove 4a was tapered, for example, at angles $\theta_1$ and $\theta_2$ of 85° or less at the lower and upper corner ends of the substrate, respectively, by adjusting a gas composition for etching semiconductor substrate 1. By taping the inside wall of groove 4a, an isolation film can be easily embedded in groove 4a.

Groove 4a could be also trenched by successively etching silicon nitride film 3, silicon oxide film 2 and semiconductor substrate 1 residing in the element isolation region, using the photoresist as a mask. When semiconductor substrate 1 was etched, using the photoresist as a mask, a decrease in the thickness of silicon nitride film 3 serving as a mask for heat oxidation could be prevented. That is, the initial thickness of silicon nitride film 3 could be made smaller.

Figure 14:
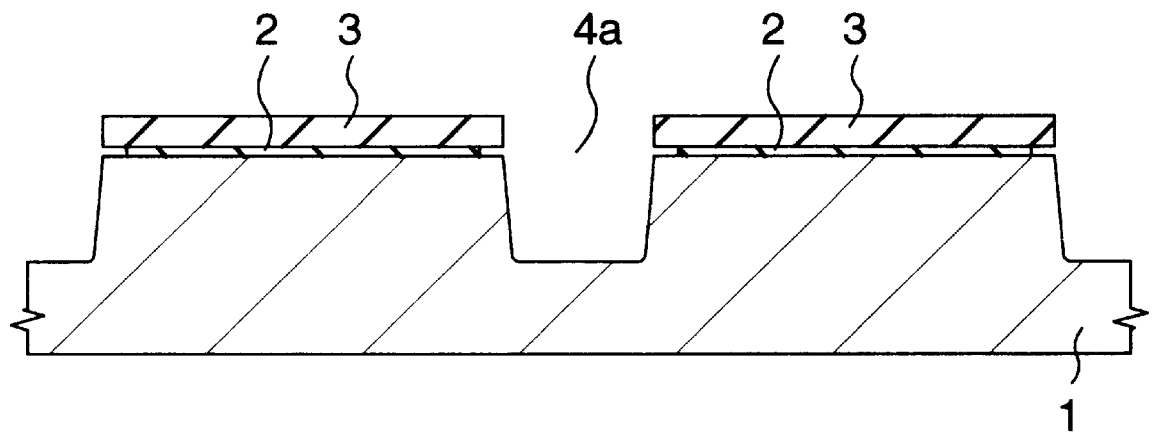
Figure 15:
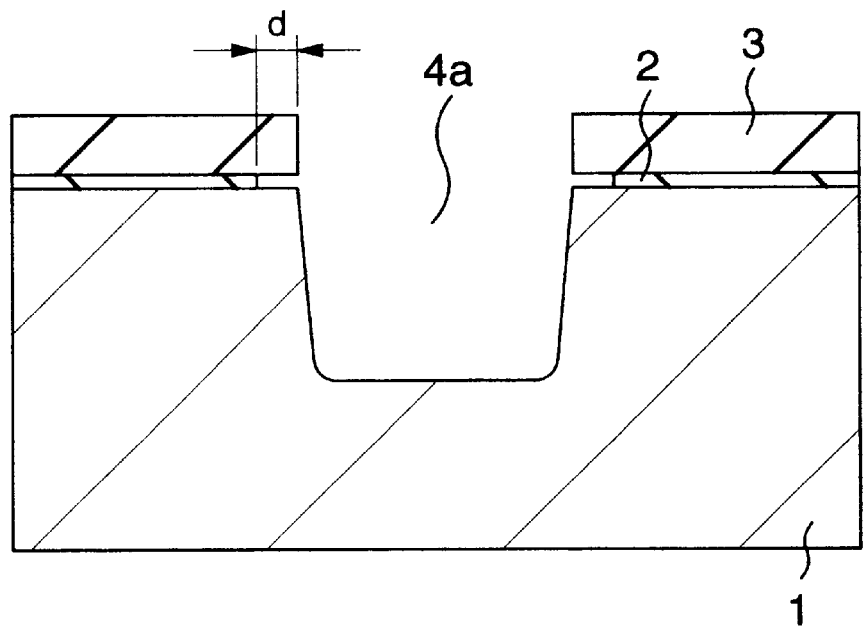

Then, the inside of groove 4a was wet-washed to remove etching residues, and then, as shown in FIG. 14 and FIG. 15, which is an enlarged view of the essential part of FIG. 14, silicon oxide film exposed to the inside wall of groove 4a was removed by a hydrofluoric acid-based etching solution to recess the silicon oxide film towards the active region. The extend d of recessing silicon oxide film 2 by the etching was in a range of 5 to 40 nm.

By recessing silicon oxide film 2 exposed to the inside wall of groove 4a in the above-mentioned extent range, rounding of the shoulder edge of groove 4a could be made easier when silicon oxide film 5 was to be formed on the inside wall of groove 4a in the successive heat oxidation step. When the extent of recessing silicon oxide film 2 was too large, the step is undesirably formed at the shoulder edge. Therefore, it was important to control the extent d of recessing silicon oxide film 2 from the inside wall of groove 4a to a range of 5 to 40 nm.

Figure 16:
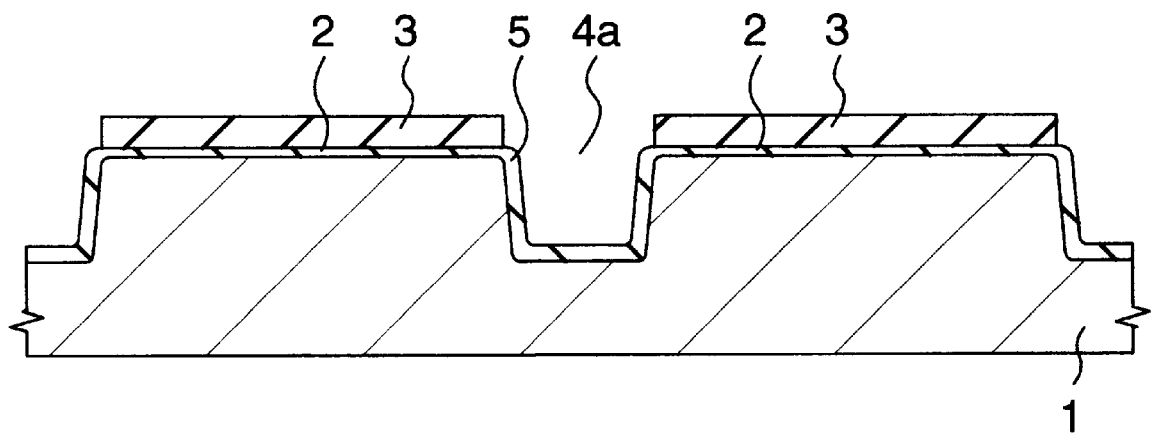
Figure 17:
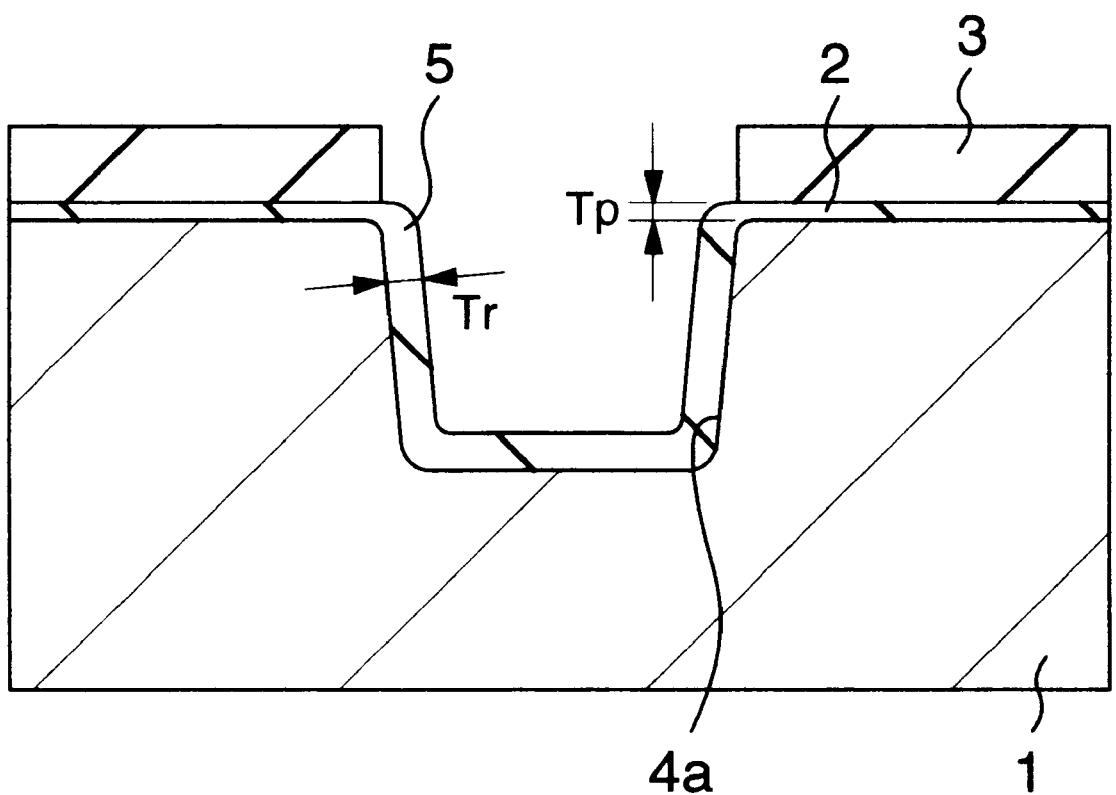

Then, as shown in FIG. 16 and FIG. 17, which is an enlarged view of the essential part of FIG. 16, semiconductor substrate 1 was thermally oxidized, for example, at 950° C. to form silicon oxide film 5 on the inside wall of groove 4a. Silicon oxide film 5 was formed to remedy etching damages on the inside wall of groove 4a and also to lessen a stress on silicon oxide film 6 to be embedded in groove 4a in a successive step. Thickness Tr of silicon oxide film 5 was made larger than thickness Tp of silicon oxide film (pad oxide film) 2 but three times as large as Tp, that is, in a range of $Tp < Tr \leq 3Tp$, by controlling the oxidation time, thereby rounding the shoulder edge of groove 4a. When the oxidation temperature of semiconductor substrate 1 was below 800° C., silicon oxide film 5 was hard to grow, whereas above 1,000° C., a wafer of particularly large diameter was readily susceptible of dislocation. It was found that the oxidation was carried out in a temperature range of 800° to 1,000° C.

Figure 18:
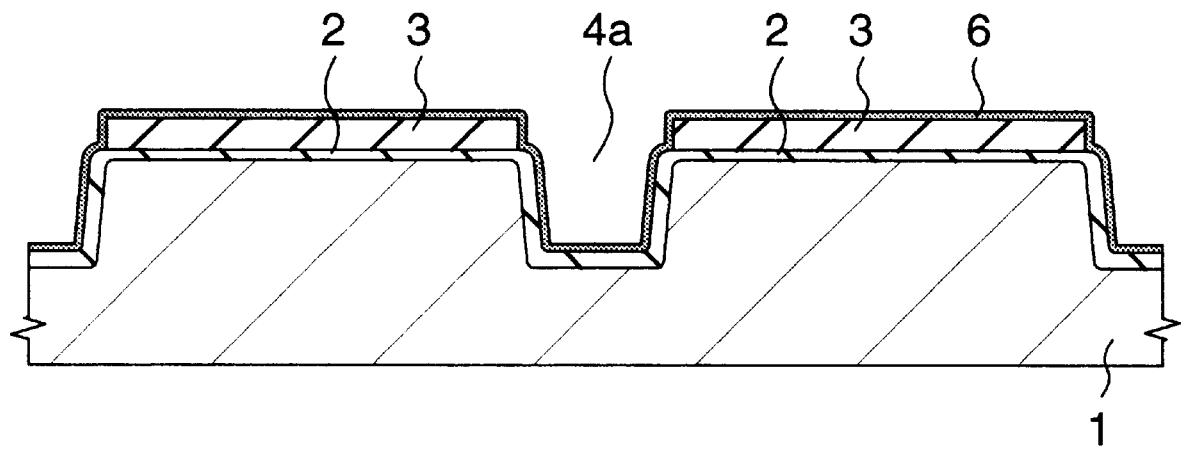
Figure 19:
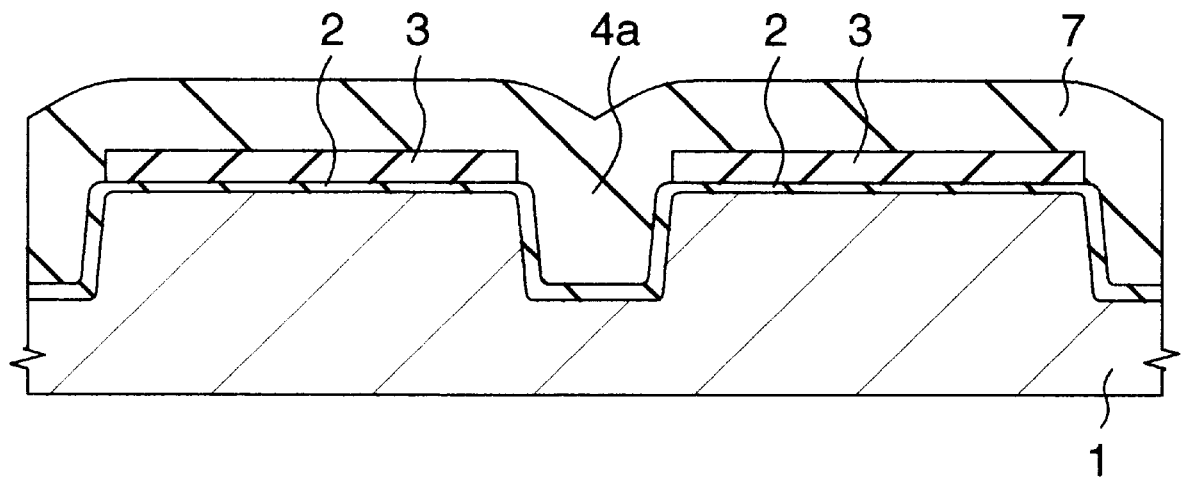

Then, as shown in FIG. 19, silicon oxide film 7 was deposited on the principal side (or surface) of semiconductor substrate 1 by CVD to embed silicon oxide film 7 in groove 4a. Silicon oxide film 7 was made from a silicon oxide material having a good flowability as in a silicon oxide film formed from, for example, ozone ($O_3$) and tetraethoxysilane $((C_2H_5)_4Si)$. Prior to the step of depositing silicon oxide film 7, silicon nitride film 6 could be thinly deposited on the inside wall of groove by CVD, as shown in FIG. 18, where silicon nitride film 6 served to suppress growth of silicon oxide film 5 on the inside wall of groove 4a towards the active region when sintering silicon oxide film 7 embedded in groove 4a in a successive step and thus to suppress such an inconvenience as formation of leak path due to development of a stress on semiconductor substrate 1 in the active region by silicon oxide film 5.

Then, semiconductor substrate 1 was wet oxidized at a temperature of not more than 1,000° C., for example, 850° C., to sinter silicon oxide film 7 embedded in groove 4a, thereby improving the quality of silicon oxide film 7.

Figure 20:
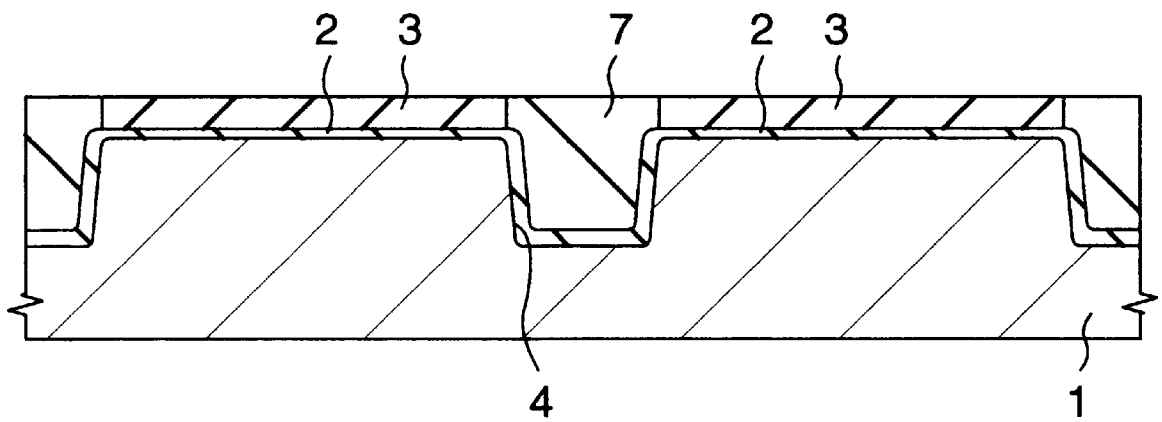
Figure 21:
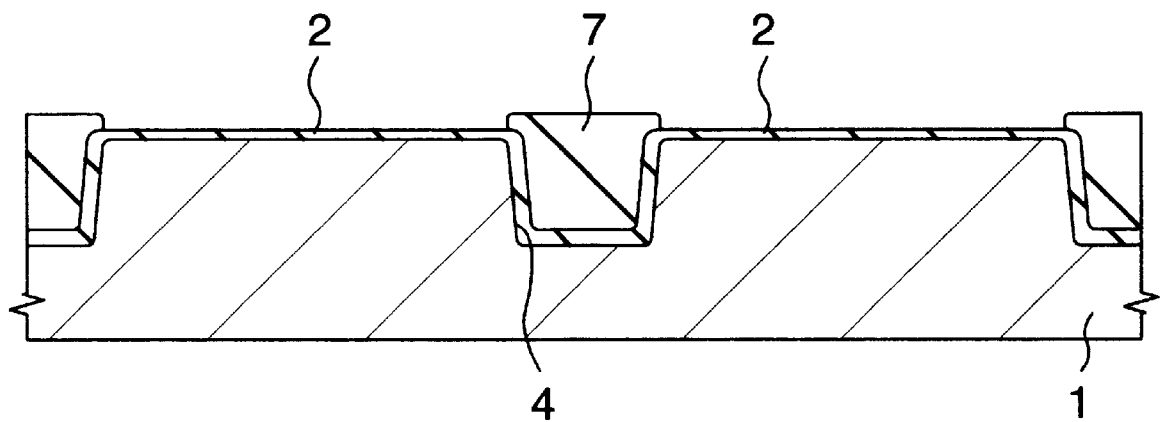

Then, as shown in FIG. 20, silicon oxide film 7 was polished, for example, by chemical mechanical polishing (CMP) to flatten the surface. Polishing was carried out with silicon nitride film 3 covering the active region as a stopper to leave silicon oxide film 7 only in groove 4a, thereby an element isolation groove 4 embedded with silicon oxide film 7 was completed. Then, as shown in FIG. 21, silicon nitride film 3 covering the active region was removed by an etching solution such as hot phosphoric acid, etc.

Sintering of silicon oxide film 7 embedded in groove 4a could be carried out after silicon oxide film 7 was polished by CMP to leave silicon oxide film 7 only in groove 4a. In that case, the thickness of silicon oxide film 7 to be sintered was smaller than that when the sintering was carried out before polishing silicon oxide film 7, and thus sintering time could be shortened.

Figure 22:
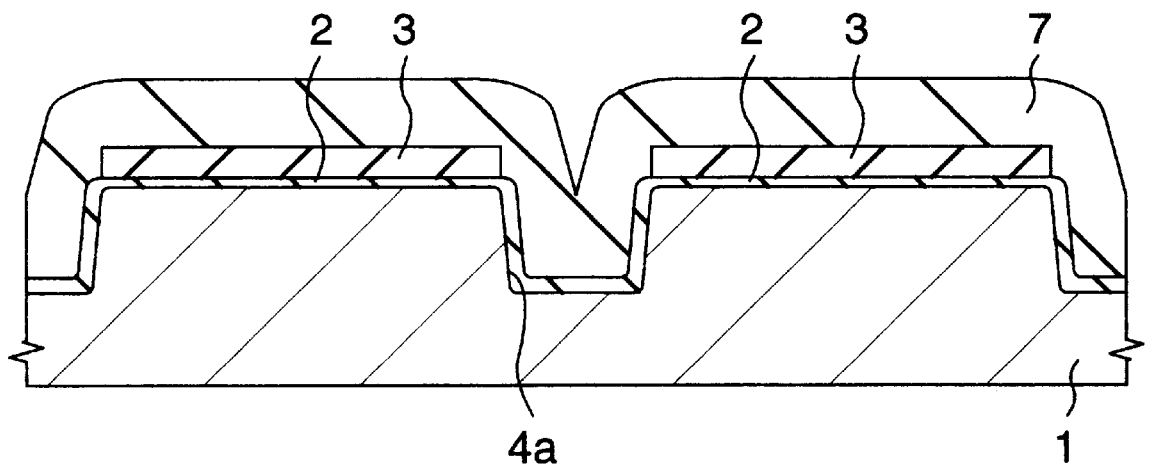
Figure 23:
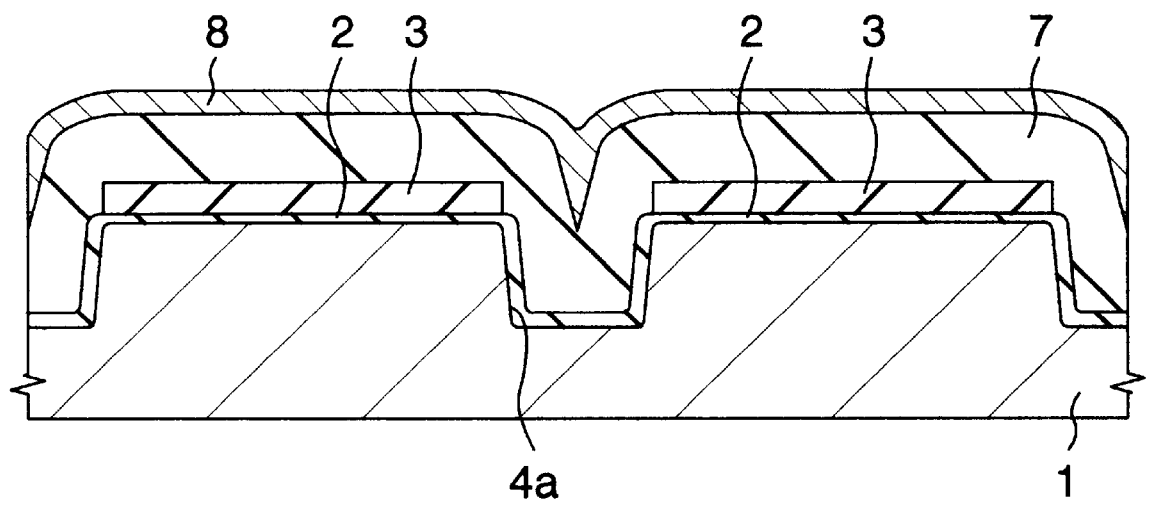

When the size of groove 4a was very small, voids could be sometimes formed in silicon oxide film 7, when embedded in groove 4a during the step of depositing silicon oxide film 7 on semiconductor substrate 1. To avoid such formation of voids, silicon oxide film 7 having a thickness large enough to prevent formation of voids in the film was deposited, as shown in FIG. 22, and then polycrystalline silicon film 8 was deposited thereon by CVD, as shown in FIG. 23, thereby completely embedding a double layer of silicon oxide film 7 and polycrystalline silicon film 8 in groove 4a. Prior to the step of depositing silicon oxide film 7, silicon nitride film 6 could be thinly deposited on the inside wall of groove 4a and silicon nitride film 3 by CVD to suppress growth of silicon oxide film 5 towards the active region during the sintering.

Figure 24:
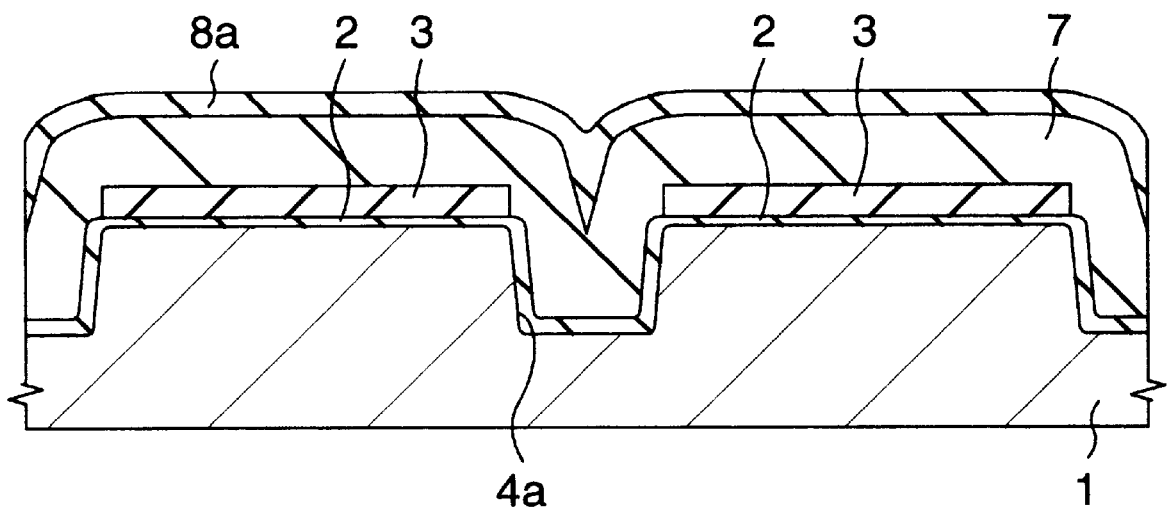

Then, as shown in FIG. 23, semiconductor substrate 1 was heat-treated (or annealed) under the above-mentioned conditions to sinter silicon oxide film 7. In that case, polycrystalline silicon film 8 on silicon oxide film 7 was thermally oxidized to and converted to silicon oxide film 8a as shown in FIG. 24.

Figure 25:
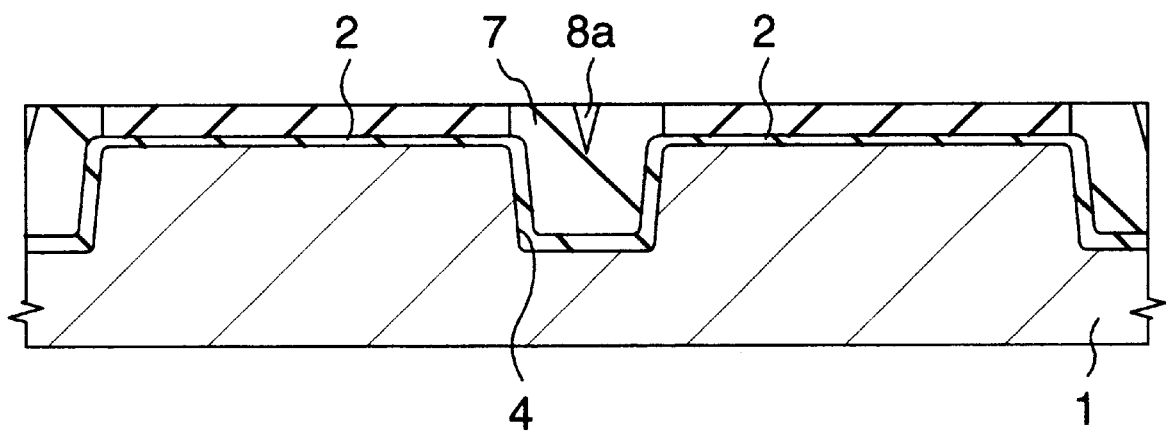

Then, as shown in FIG. 25, silicon oxide film 8a and silicon oxide film 7 were polished to obtain an element isolation groove 4 free from voids.

Figure 26:
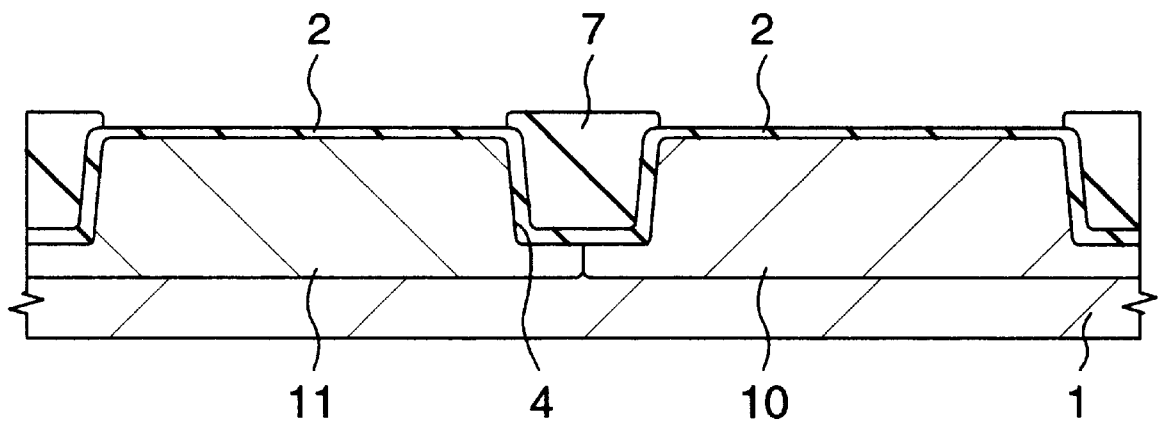

A complementary MISFET was formed in the active region of semiconductor substrate 1 whose circumference was confined by element isolation groove 4 in the following manner:

At first, silicon oxide film (pad oxide film) 2 remaining on the surface of the active region was removed by a hydrofluoric acid solution, etc. and then, as shown in FIG. 26, semiconductor substrate 1 was thermally oxidized at a temperature of 800° to 850° C. to form a clean gate oxide film 9 on the surface of semiconductor substrate 1. In that case, the shoulder edge of element isolation groove 4 was rounded, thereby preventing such an inconvenience as thinning of gate oxide film 9 at the shoulder edge.

Figure 27:
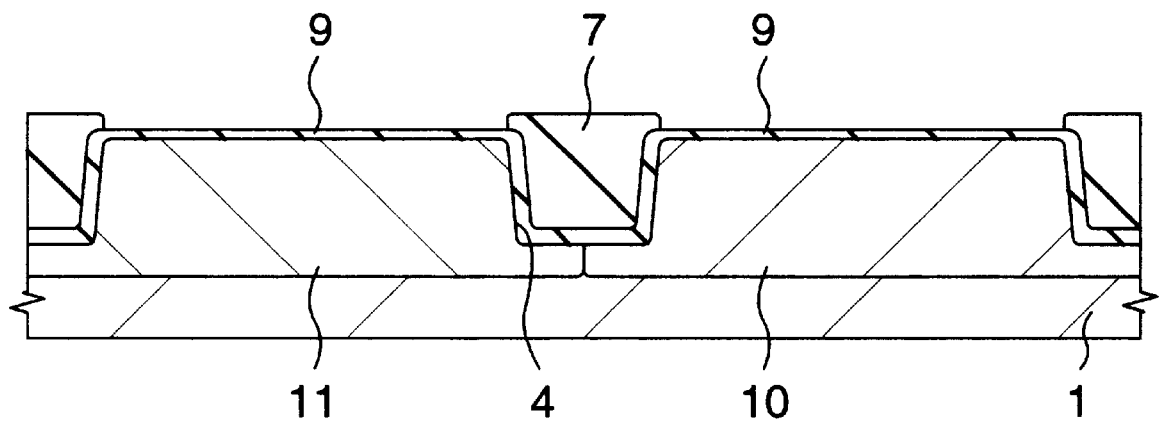

Then, as shown in FIG. 27, n-type impurities such as phosphorus (P), etc. were ion-implanted onto part of semiconductor substrate 1 and p-type impurities such as boron (B), etc. were ion-implanted on the other part thereof, and then semiconductor substrate 1 was heat-treated at a temperature of not more than 1,000° C., for example, 950° C. to conduct extended diffusion of the two kinds of impurities, thereby forming p-type well 10 in n-channel type MISFET-forming region and n-type well 11 on p-channel type MISFET-forming region. Gate oxide film 9 could be formed on the surfaces of p-type well 10 and n-type well 11, after their respective formation.

Figure 28:
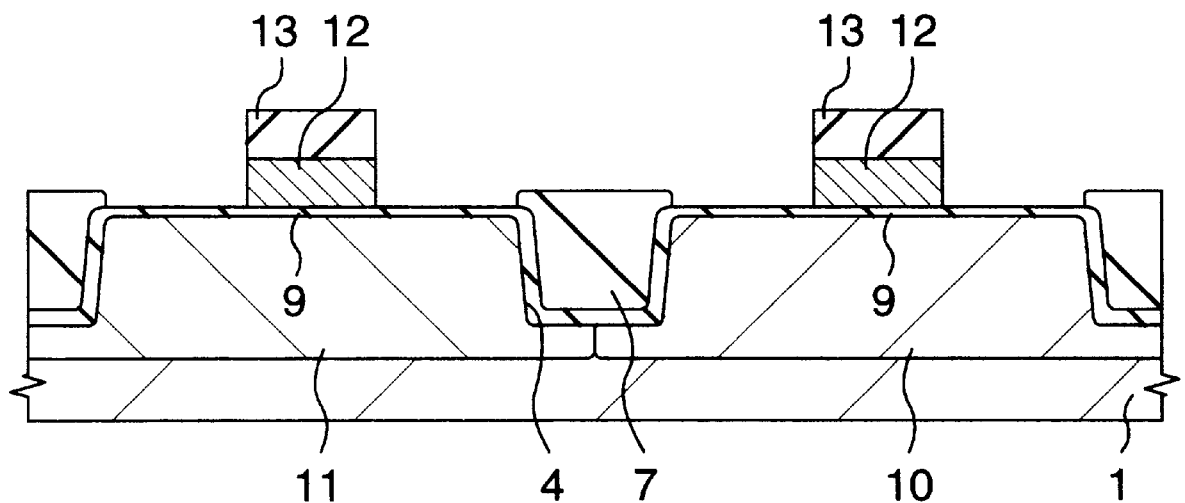

Then, as shown in FIG. 28, gate electrode 12 for the n-channel type MISFET was formed on p-type well 10 and gate electrode 12 for p-channel type MISFET was formed on n-type well 11. To form gate electrode 12, for example, a p-doped polycrystalline silicon film, a tungsten (W) silicide film and a cap isolation film 13 were deposited successively on semiconductor substrate 1 by CVD, and then these films were patterned by etching, using a photoresist as a mask, thereby obtaining gate electrode 12. Cap isolation film 13 was made from a silicon oxide film or a silicon nitride film.

Figure 29:
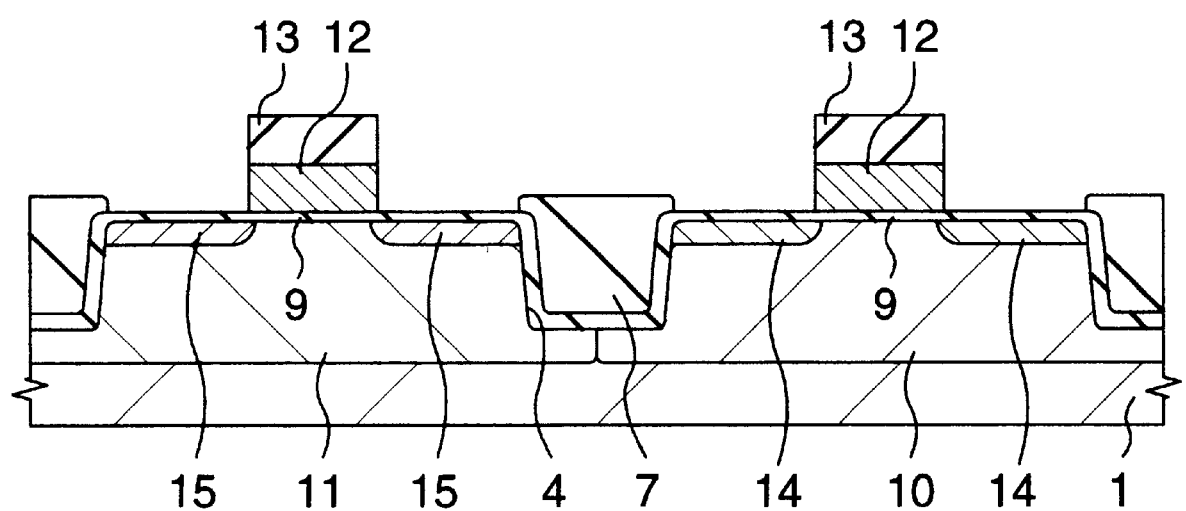

Then, as shown in FIG. 29, p-type well 10 was ion-implanted with n-type impurities such as P, etc. to form n-type semiconductor region (source, drain) 14 of n-channel type MISFET, and n-type well 11 was ion-implanted with p-type impurities such as B (boron) etc. to form p-type semiconductor region (source, drain) 15 of p-channel type MISFET, thereby obtaining an n-channel type MISFETQ$_n$ and p-channel type MISFETQ$_p$.

Then, as shown in FIG. 30, side wall spacer 16 was formed on the side wall of gate electrode 12. Side wall spacer 16 was formed by depositing a silicon oxide film or a silicon nitride film on semiconductor substrate 1 by CVD and patterning the film by anisotropic etching.

Figure 32:
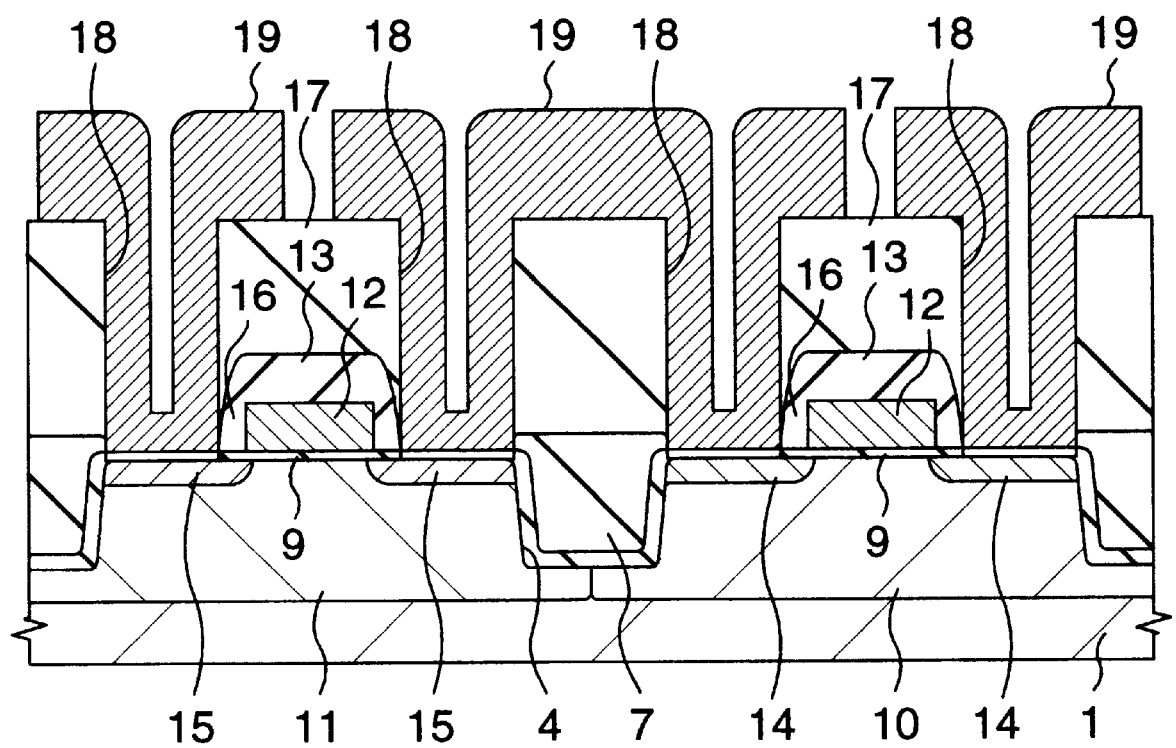

Then, as shown in FIG. 31, silicon oxide film 17 was deposited on semiconductor substrate 1 by CVD, and then, as shown in FIG. 32, contact holes 18 were formed through silicon oxide film 17 on n-type semiconductor region (source, drain) 14 of n-channel type MISFETQ$_n$ and p-type semiconductor region (source, drain) of p-channel type MISFETQ$_n$, respectively, and an aluminum (Al) alloy film deposited on silicon oxide film 17 by sputtering was patterned to form wiring 19.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edge), followed by oxidation in the groove.

EXAMPLE 6

A process for forming element isolation groove 4 according to a still further embodiment of the present invention will be explained below, referring to FIGS. 33 to 36.

Figure 33:
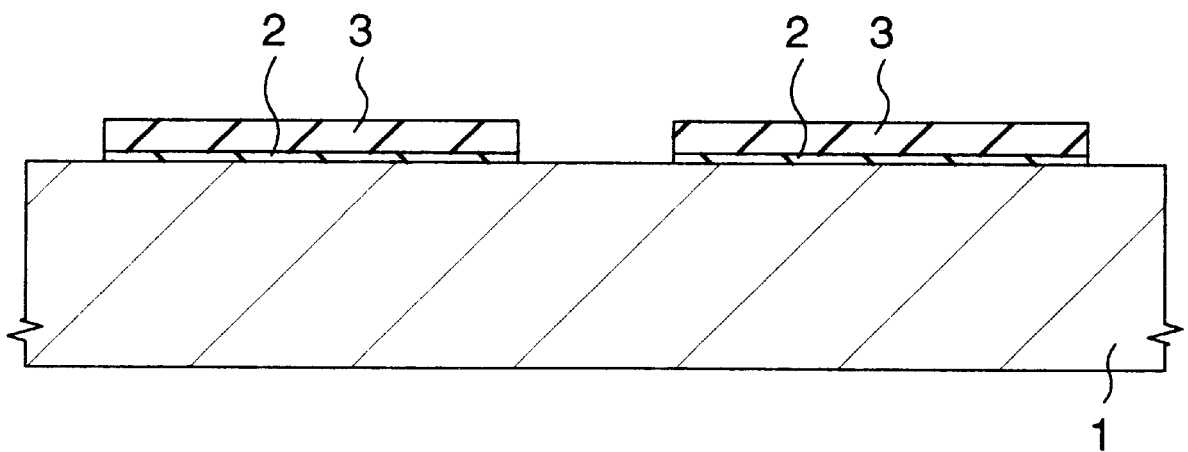
FIGS. 33 to 36 are cross-sectional elevation views of essential part of a semiconductor device according to Example 6 of the present invention.

At first, as shown in FIG. 33, semiconductor substrate 1 was thermally oxidized at a temperature of 800° to 850° C. to form silicon oxide film (pad oxide film) 2 on the principal side (or surface) of semiconductor substrate 1, and then silicon nitride film 3 was deposited on silicon oxide film 2 by CVD. Then, silicon nitride film 3 and silicon oxide film 2 in an element isolation region were removed by etching, using a photoresist as a mask.

Then, as shown in FIG. 34, the surface of semiconductor substrate 1 in the element isolation region was isotropically and shallowly etched to form an undercut a on semiconductor substrate 1 at the edges in the element isolation region.

Figure 35:
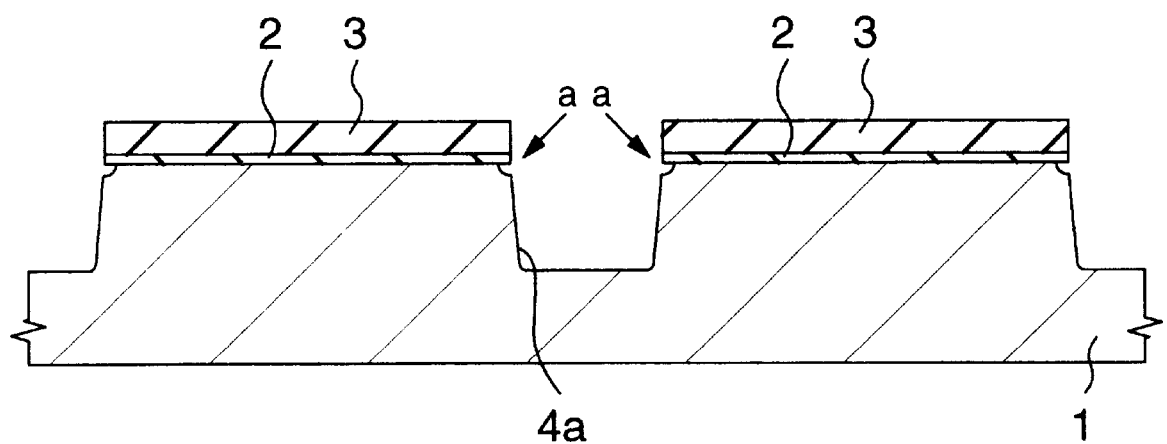
Figure 36:
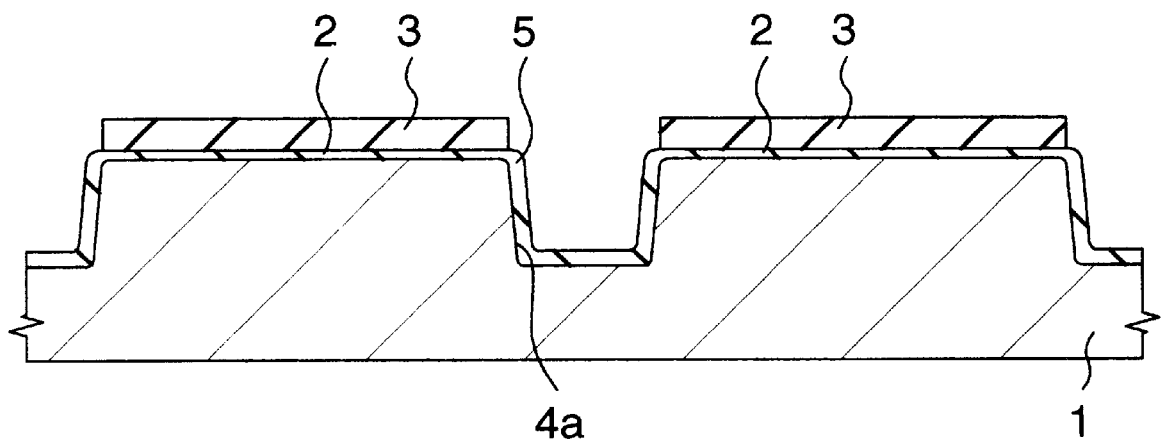

Then, as shown in FIG. 35, semiconductor substrate 1 in the element isolation region was anisotropically etched by changing an etching gas composition, etc. to form groove 4a on semiconductor substrate 1 in the element isolation region. Then, as shown in FIG. 36, semiconductor substrate 1 was thermally oxidized, for example, at 950° C. to form silicon oxide film 5 on the inside wall of groove 4a and round the shoulder edged groove 4a at the same time. The successive steps were carried out in the same manner as in Example 5.

According to this embodiment, undercut a was formed at the shoulder edge of groove 4a prior to the step of forming silicon oxide film 5 on the inside wall of groove 4a, whereby the shoulder edge of groove 4a could be rounded. Formation of undercut a at the shoulder edge of groove 4a according to this embodiment could be also carried out together with recessing of silicon oxide film 2 exposed to the inside wall of groove 4a towards the active region according to Example 5.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

EXAMPLE 7

A process for forming element isolation groove 4 according to a further embodiment of the present invention will be explained below, referring to FIGS. 37 to 44.

Figure 37:
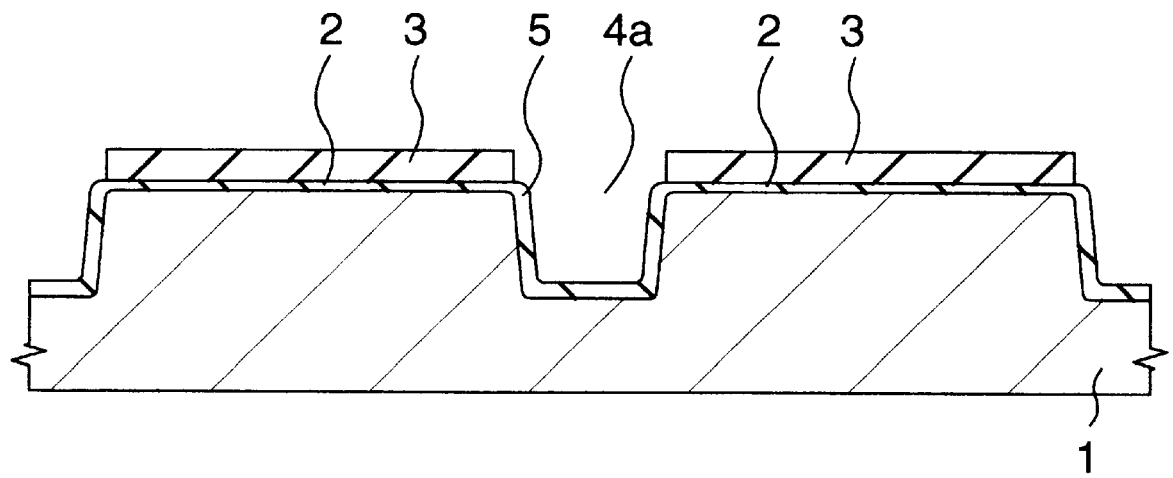
FIGS. 37 to 44 are cross-sectional elevation views of essential part of a semiconductor substrate showing a process for producing a semiconductor device according to Example 7 of the present invention.
Figure 38:
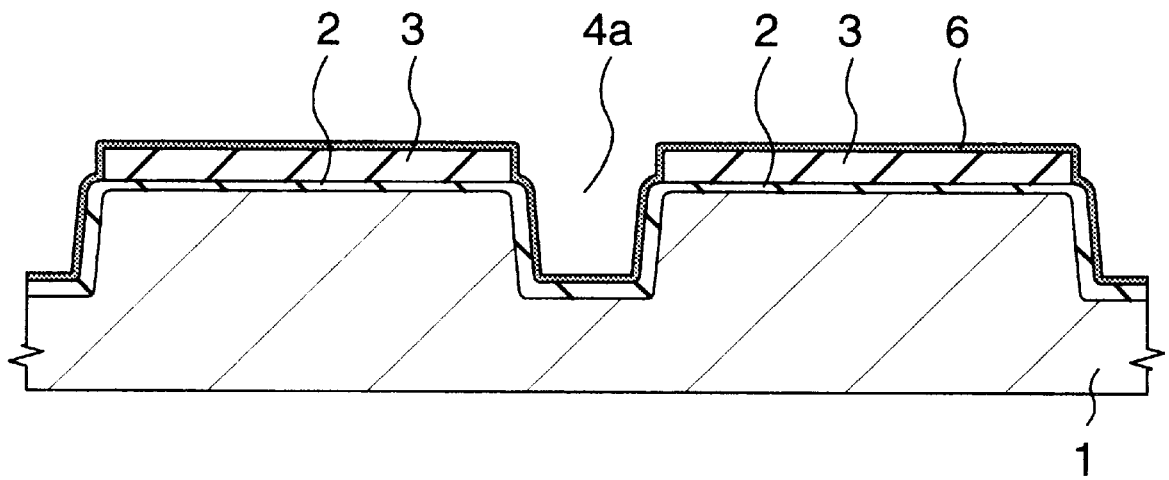

At first, as shown in FIG. 37, silicon oxide film 5 was formed on the inside wall of groove 4a and the shoulder edges of groove 4a were rounded at the same time in the same manner as in Examples 1 to 3, and then, as shown in FIG. 38, silicon nitride film 6 was thinly deposited on semiconductor substrate 1 by CVD. Silicon nitride film 6 was formed to suppress growth of silicon oxide film 5 on the inside wall of groove 4a towards the active region during sintering of silicon oxide film 7 embedded in groove 4a in a successive step.

Figure 39:
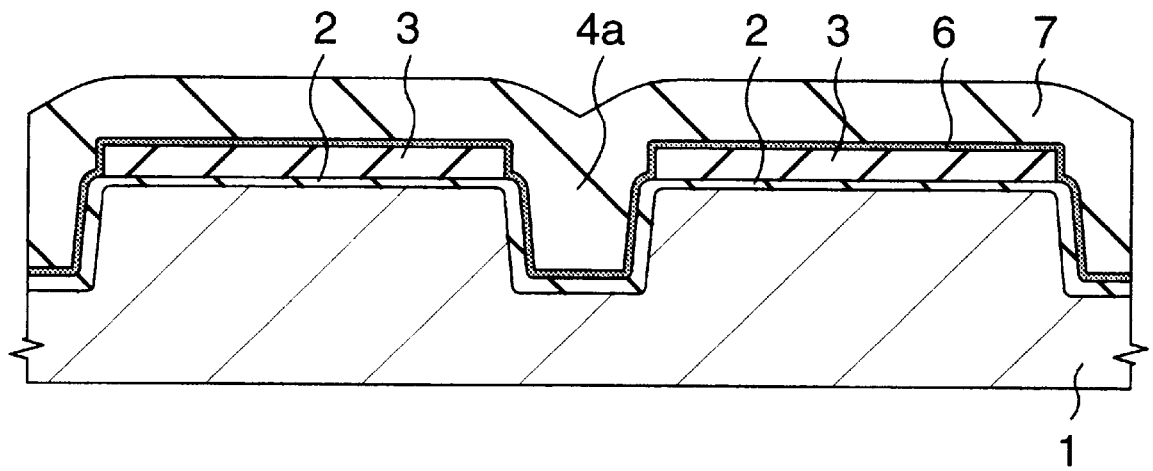

Then, as shown in FIG. 39, silicon oxide film 7 was deposited on semiconductor substrate 1 by CVD to embed silicon oxide film 7 in groove 4a, and then semiconductor substrate 1 was wet oxidized or annealed in the same temperature conditions as described before to sinter silicon oxide film 7 embedded in groove, thereby improving the quality of silicon oxide film 7.

Figure 40:
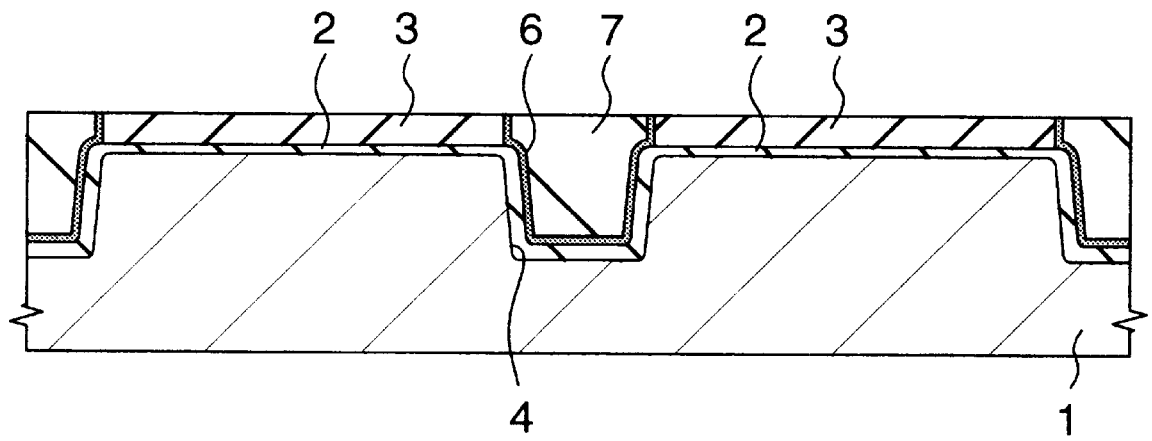
Figure 41:
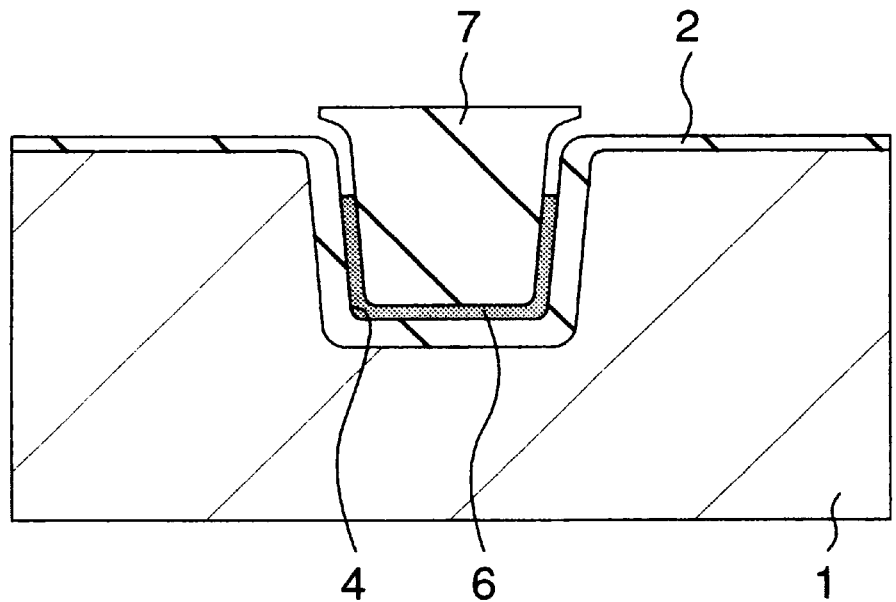
Figure 42:
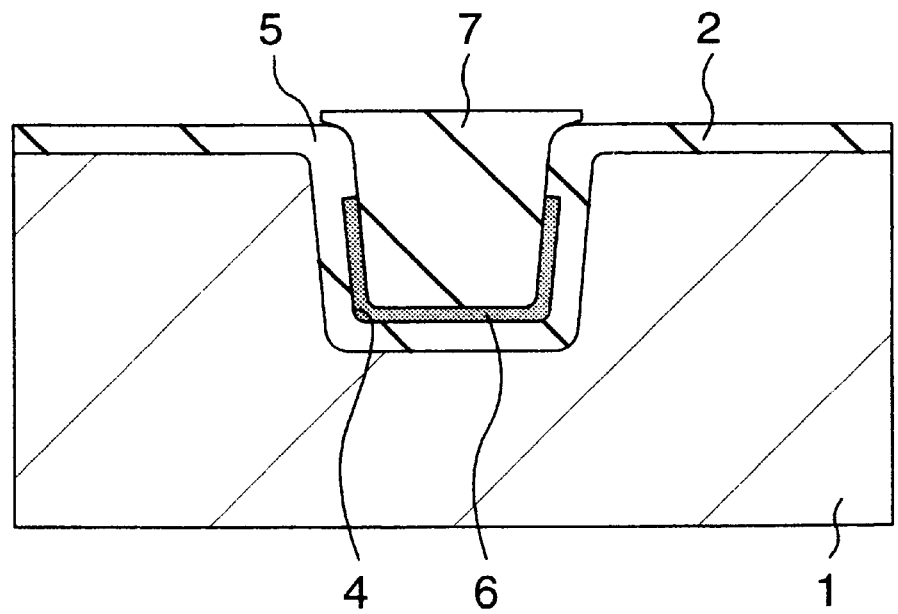

Then, as shown in FIG. 40, silicon oxide film 7 was polished by chemical mechanical polishing to leave silicon oxide film 7 only in groove 4a, thereby forming an element isolation groove 4. When silicon nitride film 3 covering the active region was to be etched with an etching solution such as hot phosphoric acid, etc. silicon nitride film 6 on the inside wall of element isolation groove 4 was etched away at the same time, as shown in FIG. 41, thereby recessing silicon nitride film 6 inwardly into element isolation region 4 and forming a recess at the shoulder edge of element isolation groove 4. Once such a recess was formed at the shoulder edge of element isolation groove 4, the surface of silicon oxide film 7 embedded in element isolation groove 4 was sometimes fractured to make foreign fragments etching residues were left in the recess when gate electrode materials such as polycrystalline silicon, etc. deposited thereon in a later step were to be etched.

To overcome such an inconvenience as mentioned above, for example, as shown in FIG. 42, after removal of silicon nitride film 3, silicon oxide film 7 at the shoulder edge of element isolation groove 4 was reoxidized at a temperature of 850° to 900° C. to make the film thickness larger, thereby sealing the recess by silicon oxide film 7. To seal the recess by silicon oxide film 7, it was necessary to make an increment of the film thickness at least twice as large as the thickness of silicon nitride film 6. When the increment of the film thickness was too large, the active region was narrowed by grown silicon oxide film 5. Thus, an increment of the film thickness was made twice as large as the thickness of silicon nitride film 6 or slightly higher than the double thickness of silicon nitride film 6 by controlling oxidation time.

Figure 43:
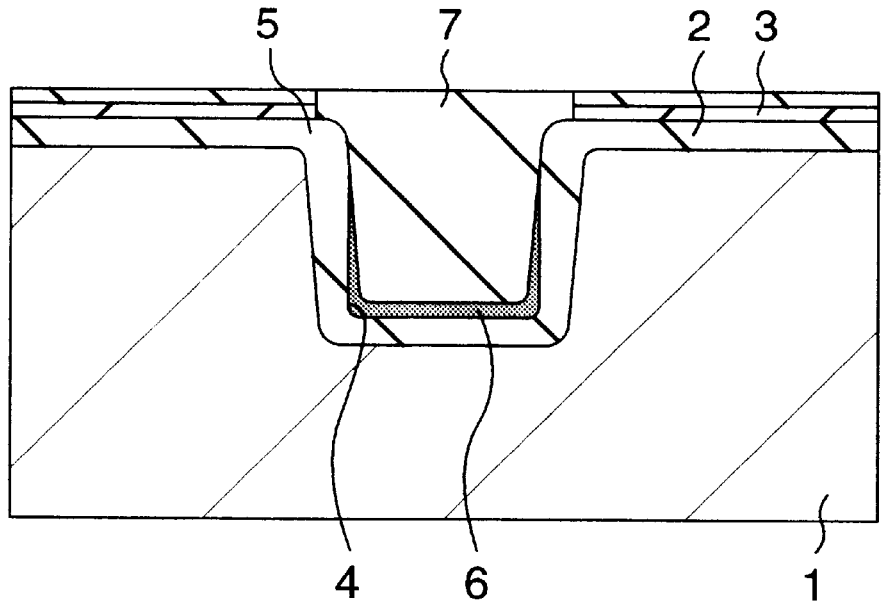
Figure 44:
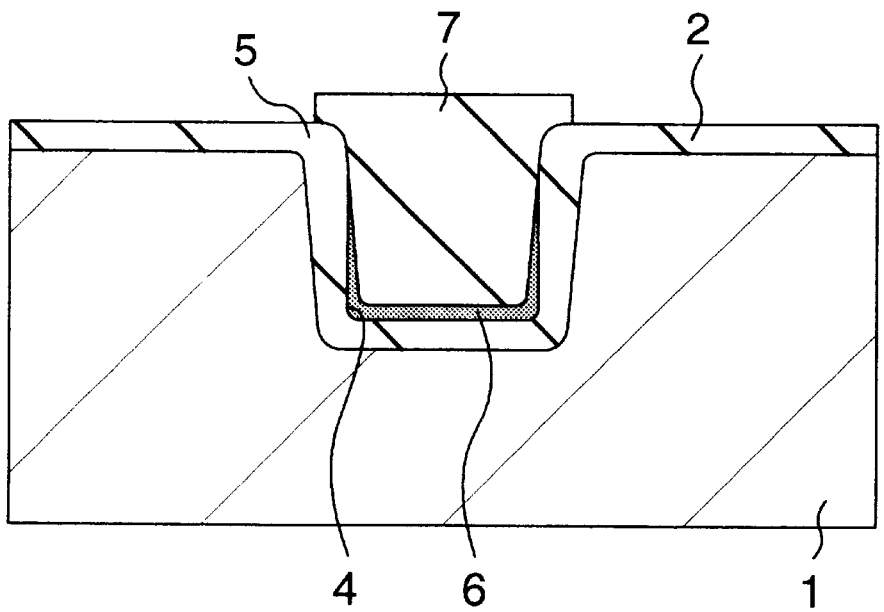

According to another procedure for preventing formation of a recess at the shoulder edge of element isolation groove 4, as shown in FIG. 43, silicon oxide film 7 was polished by chemical mechanical polishing to leave silicon oxide film 7 only in groove 4a, followed by sintering. By setting a longer sintering time or a higher sintering temperature, the surface of silicon nitride film 3 covering the active region and silicon nitride film 6 at the shoulder edge of element isolation groove 4 could be oxidized. Then, the oxide film on silicon nitride film 3 was removed by etching and successively silicon nitride film 3 was removed by etching, whereby formation of a recess at the shoulder edge of element isolation groove 4 could be prevented, as shown in FIG. 44.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

EXAMPLE 8

A process for forming element isolation groove 4 according to a further embodiment of the present invention will be explained below, referring to FIGS. 45 and 46.

Figure 45:
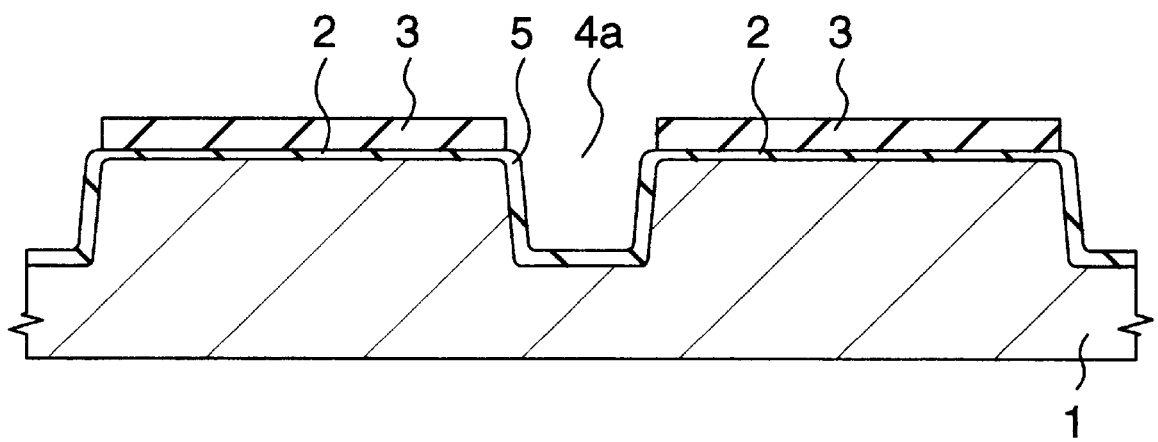
FIGS. 45 to 48 are cross-sectional elevation view of essential part of a semiconductor substrate showing a process for producing a semiconductor device according to Example 8 of the present invention.
Figure 46:
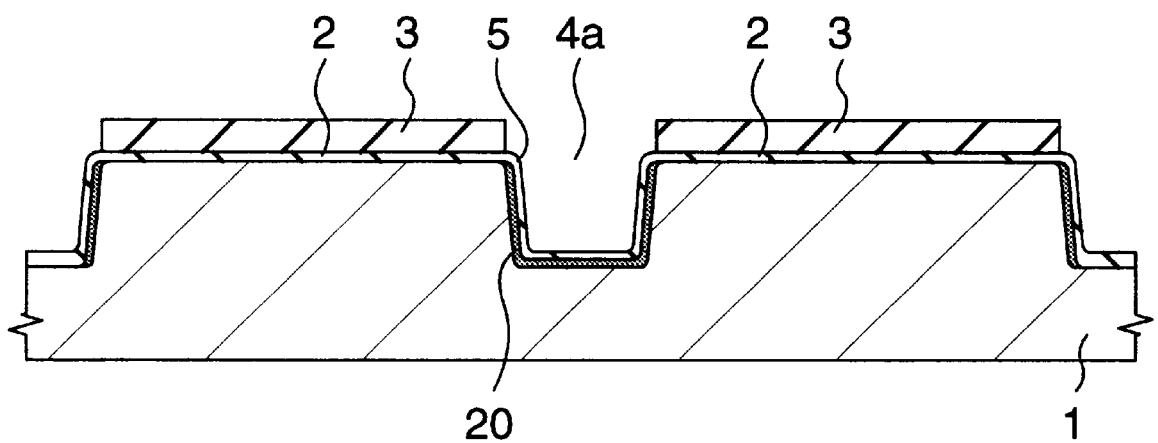

At first, as shown in FIG. 45, silicon oxide film 5 was formed on the inside wall of groove 4a and the shoulder edge of groove 4a was rounded at the same time in the same manner as in Examples 1 to 3, and then, as shown in FIG. 46, the inside wall of groove 4a was subjected to soft nitriding to segregate nitrogen in the region near the boundary between silicon oxide film 5 formed on the inside wall of groove 4a and the side wall of the active region of semiconductor substrate 1, thereby forming silicon nitride layer 20. To carry out a soft nitriding of the inside wall of groove 4a, semiconductor substrate 1 was heat-treated in a NO (nitrogen oxide) or $N_2O$ (dinitrogen oxide) atmosphere, where nitrogen released by thermal decomposition of NO or $N_2O$ was segregated in the region near the boundary between silicon oxide film 5 and the active region of semiconductor substrate 1, and then silicon nitride layer 20 was formed by heat treatment.

According to this embodiment of the present invention, silicon nitride layer 20 was formed in the region near the boundary between silicon oxide film 5 and the active region of semiconductor substrate 1, whereby the region near the boundary was hard to oxidize during the sintering of silicon oxide film 7 later embedded in groove 4a and thus growth of silicon oxide film 5 towards the active region could be suppressed.

Figure 47:
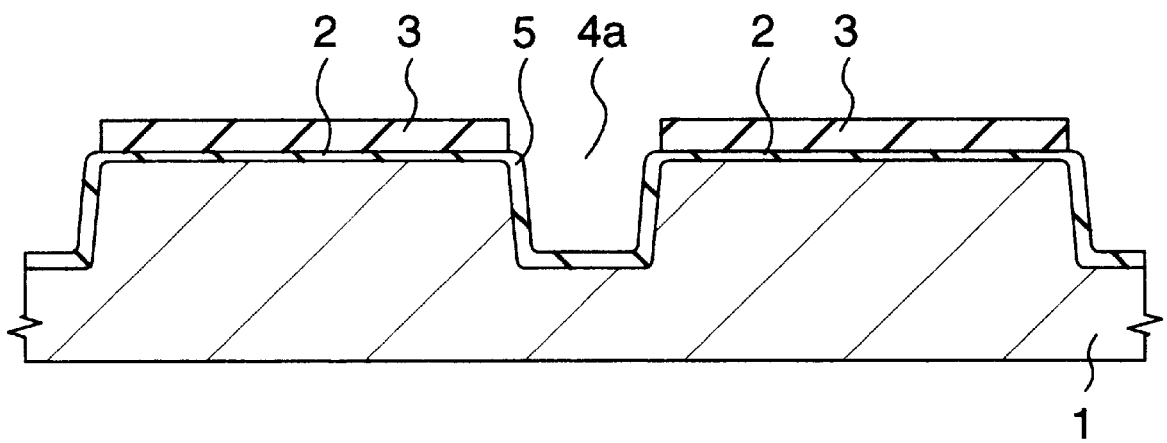
Figure 48:
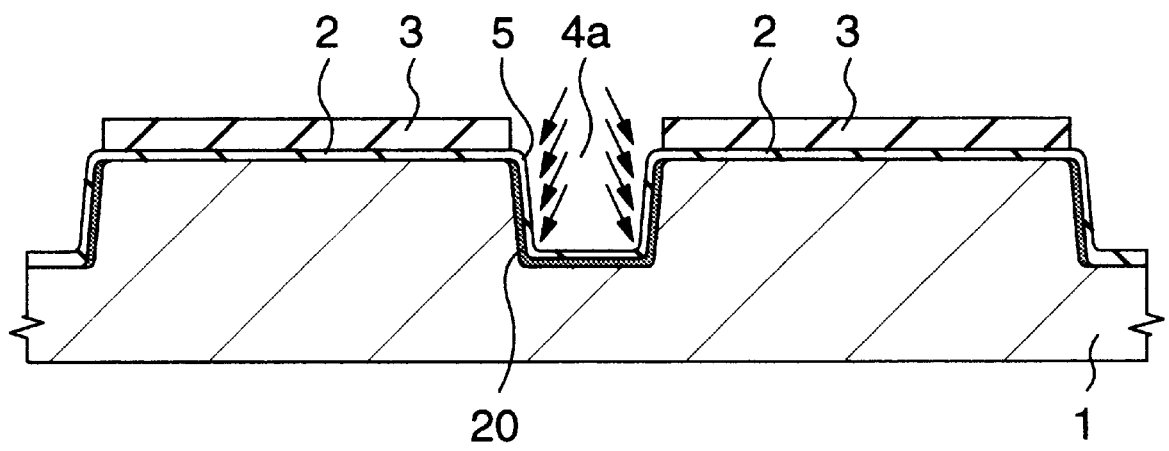

According to another procedure for forming silicon nitride layer 20 in the region near the boundary between silicon oxide film 5 and the active region of semiconductor substrate 1, as shown in FIG. 47, silicon oxide film 5 was formed on the inside wall of groove 4a and the shoulder edge of groove 4a was rounded in the same manner as in Examples 1 to 3, and then, as shown in FIG. 48, nitrogen was ion-implanted in the region near the boundary between silicon oxide film 5 and the active region of semiconductor substrate 1, if necessary, followed by heat treatment.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

EXAMPLE 9

A process for forming element isolation groove 4 according to a still further embodiment of the present invention will be explained below, referring to FIGS. 49 and 50.

Figure 49:
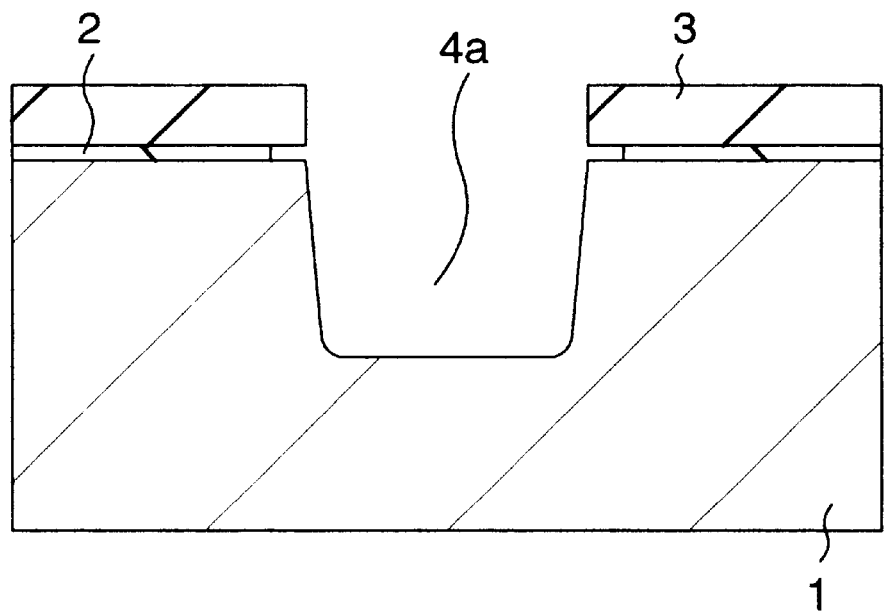
FIGS. 49 to 50 are cross-sectional elevation views of essential part of a semiconductor substrate showing a process for producing a semiconductor device according to Example 9 of the present invention.

At first, as shown in FIG. 49, groove 4a was trenched on semiconductor substrate 1 in an element isolation region by etching, using silicon nitrogen film 3 as a mask, and then silicon oxide film 2 exposed to the inside wall of groove 4a was removed with a hydrofluoric acid-based etching solution to recess silicon oxide film 2 towards the active region. Steps up to this stage were the same as in Examples 1 to 3.

Figure 50:
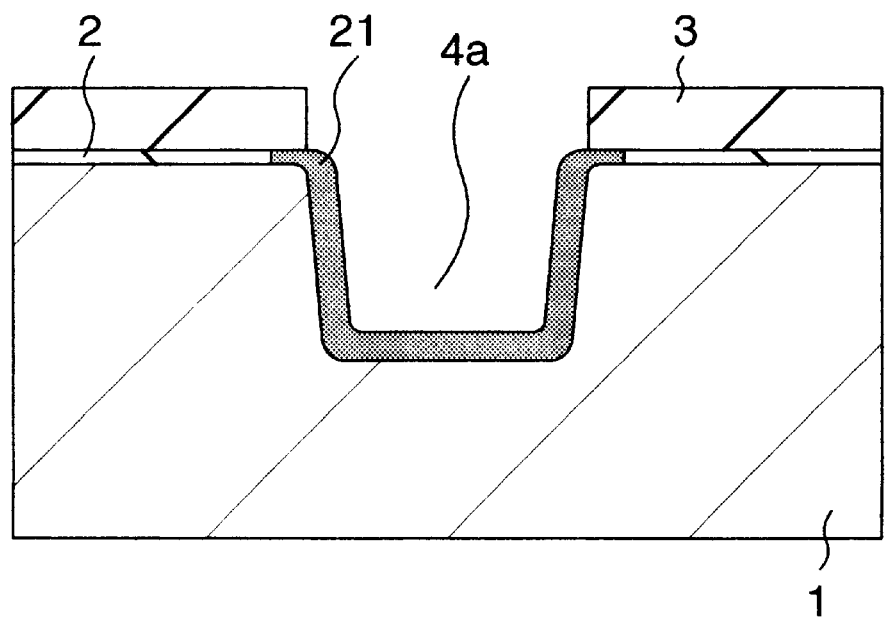

Then, as shown in FIG. 50, semiconductor substrate 1 was subjected to soft nitriding to form silicon nitride film 21 on the inside wall of groove 4a and round the shoulder edge of groove 4a at the same time. To conduct soft nitriding of semiconductor substrate 1, semiconductor substrate 1 was heat-treated in a mixed NO and $N_2$ atmosphere at a temperature of about 900° C. or in a mixed $N_2O$ and $N_2$ atmosphere at a temperature of 1,050° C.

According to this embodiment, silicon nitride film 21 was formed on the inside wall of groove 4a, whereby the region near the above-mentioned boundary was hard to oxidize during the sintering of silicon oxide film 7 later embedded in groove 4a and thus growth of silicon oxide film 5 towards the active region could be suppressed.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

EXAMPLE 10

A process for forming element isolation groove 4 according to a still further embodiment of the present invention will be explained below, referring to FIGS. 51 to 54.

Figure 51:
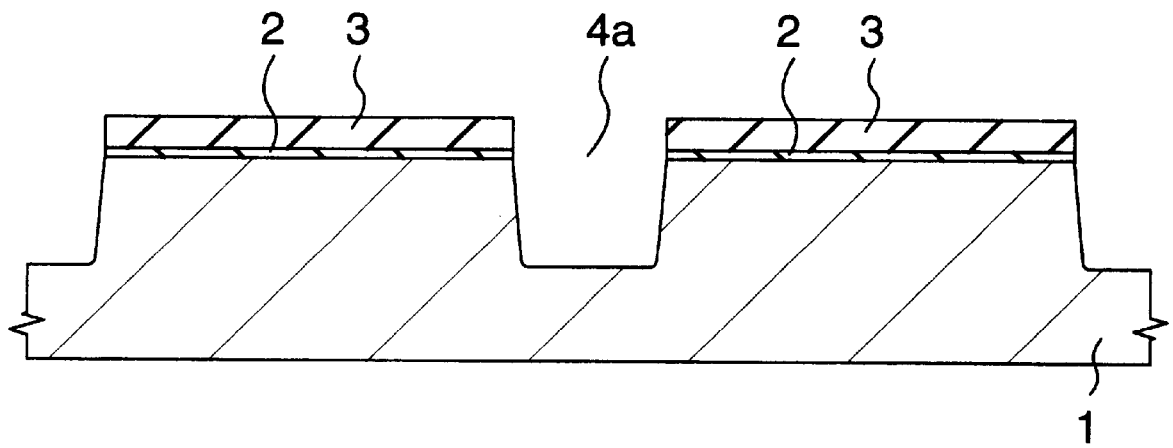
FIGS. 51 to 54 are cross-sectional elevation views of essential part of a semiconductor substrate showing a process for producing a semiconductor device according to Example 10 of the present invention.
Figure 52:
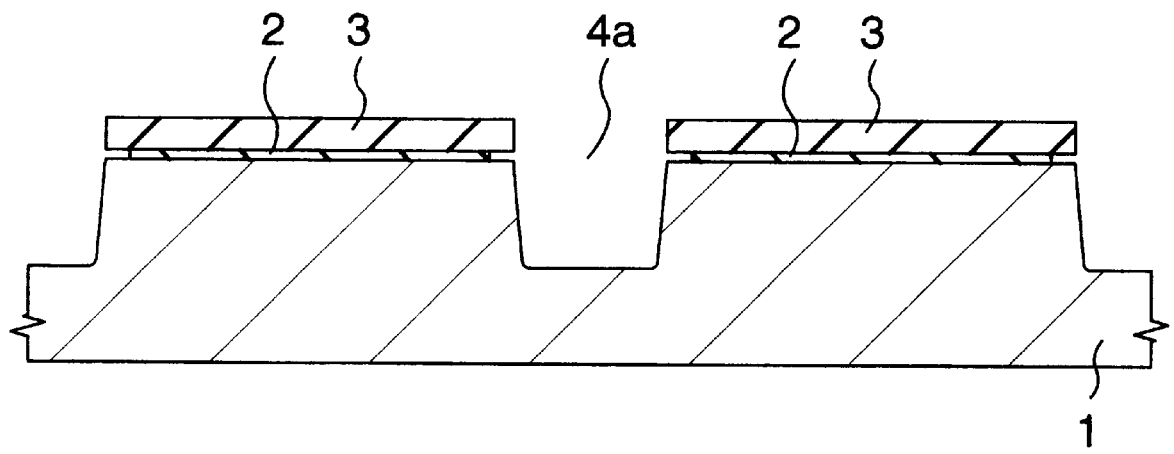

At first, as shown in FIG. 51, groove 4a was trenched on semiconductor substrate 1 in an element isolation region by etching, using silicon nitride film 3 as a mask, and then, as shown in FIG. 52, silicon oxide film 2 exposed to the inside wall of groove 4a was removed by a hydrofluoric acid-based etching solution to recess silicon oxide film 2 towards the active region. Steps up to this stage were the same as in Examples 1 to 3.

Figure 53:
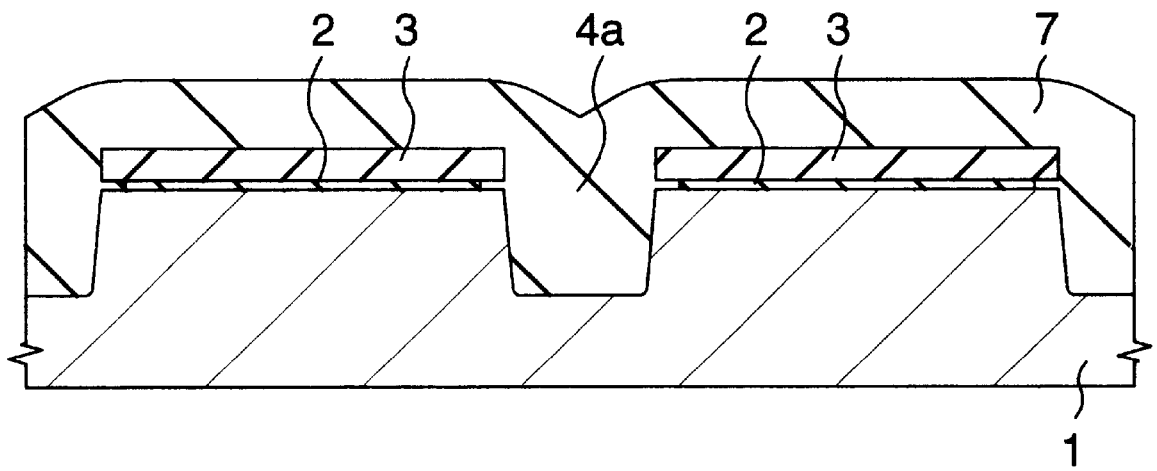
Figure 54:
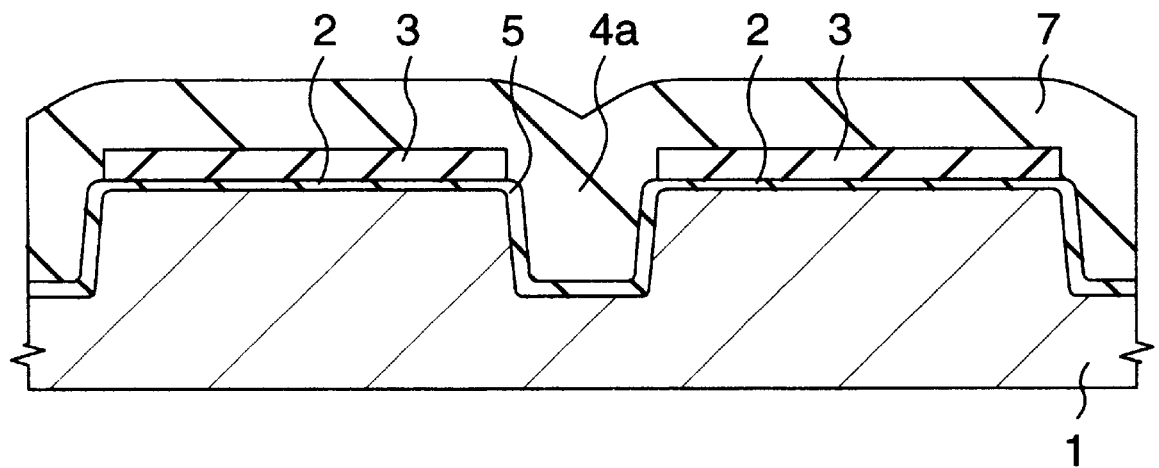

Then, as shown in FIG. 53, silicon oxide film 7 was deposited on semiconductor substrate 1 by CVD to embed silicon oxide film 7 in groove 4a. Then, as shown in FIG. 54, semiconductor substrate 1 was wet oxidized or annealed to sinter silicon oxide film 7. At the same time, silicon oxide film 5 was formed on the inside wall of groove 4a and the shoulder edge of groove 4a was rounded.

According to this embodiment, sintering of silicon oxide film 7, formation of silicon oxide film 5 on the inside wall of groove 4a and rounding of the shoulder edge of groove 4a were carried out at the same time, whereby the process for forming element isolation groove 4 could be simplified.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

EXAMPLE 11

A process for forming element isolation groove 4 according to a still further embodiment of the present invention will be explained below, referring to FIGS. 55 to 58.

Figure 55:
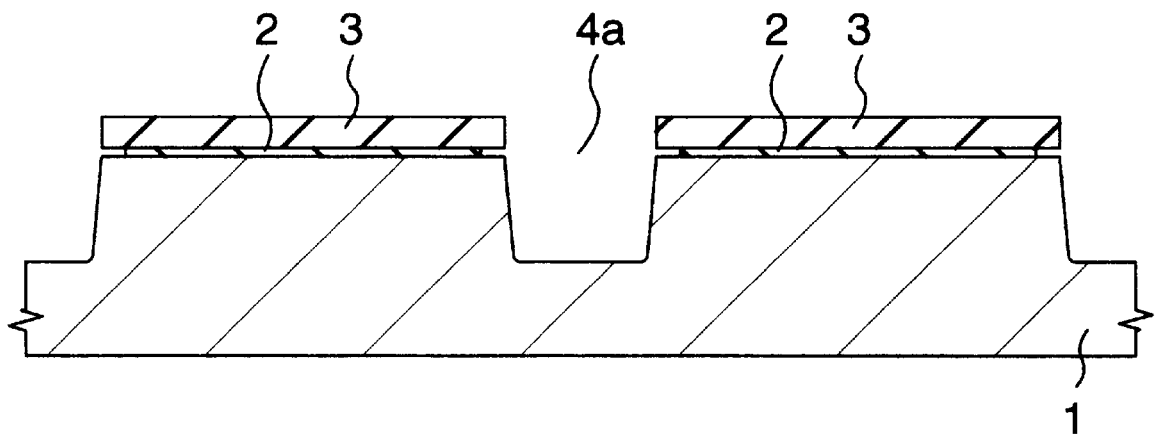
FIGS. 55 to 58 are cross-sectional elevation views of essential part of a semiconductor substrate showing a process for producing a semiconductor device according to Example 11 of the present invention.

At first, as shown in FIG. 55, groove 4a was trenched on semiconductor substrate 1 in an element isolation zone by etching, using silicon nitride film 3 as a mask, and then silicon oxide film 2 exposed to the inside wall of groove 4a was removed by a hydrofluoric acid-based etching solution to recess silicon oxide film 2 towards the active region. Steps up to this stage were the same as in Examples 1 to 3.

Figure 56:
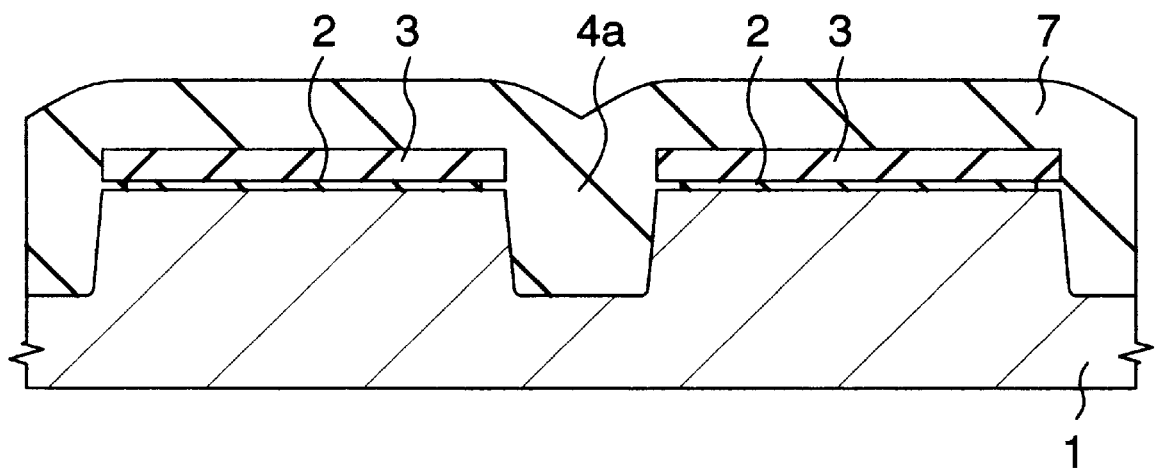
Figure 57:
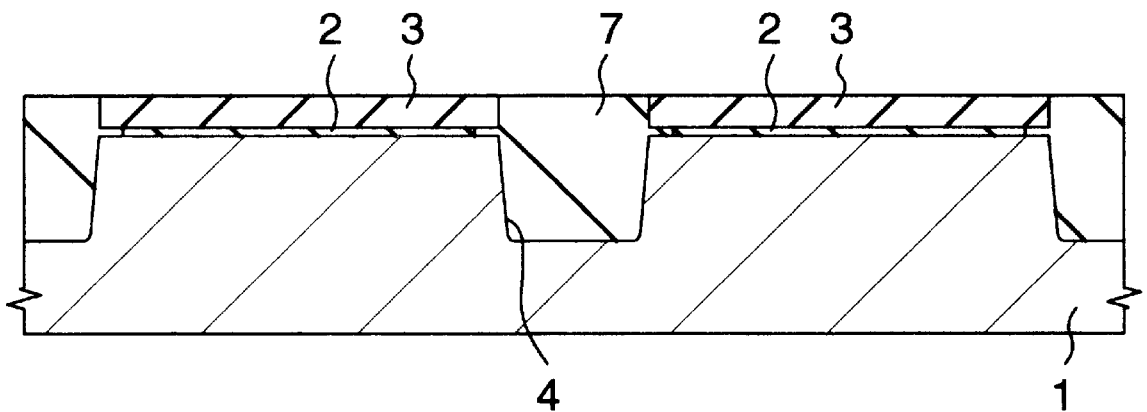
Figure 58:
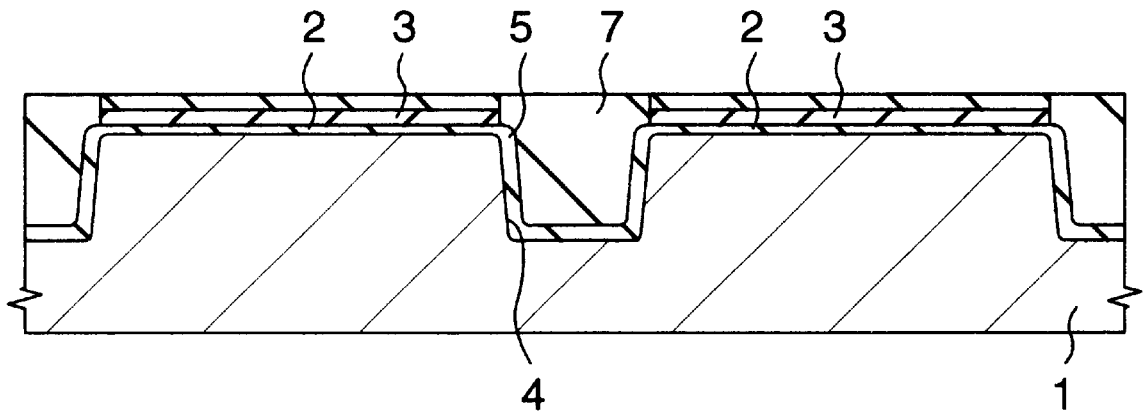

Then, as shown in FIG. 56, silicon oxide film 7 was deposited on semiconductor substrate 1 by CVD to embed silicon oxide film 7 in groove 4a, and then, as shown in FIG. 57, silicon oxide film 7 on silicon nitride film 3 was removed to leave silicon oxide film 7 only in groove 4a, thereby forming element isolation groove 4 embedded with silicon oxide film 7. Then, as shown in FIG. 58, semiconductor substrate 1 was wet oxidized to sinter silicon oxide film 7. At the same time, silicon oxide film was formed on the inside wall of groove 4a and the shoulder edge of groove 4a was rounded.

According to this embodiment, sintering of silicon oxide film 7, formation of silicon oxide film 5 on the inside wall of groove 4a and rounding of the shoulder edge of groove 4a could be carried out at the same time, whereby the process for forming element isolation groove could be simplified.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

EXAMPLE 12

A process for forming element isolation groove 4 according to a still further embodiment of the present invention will be explained below, referring to FIGS. 59 to 64.

Figure 59:
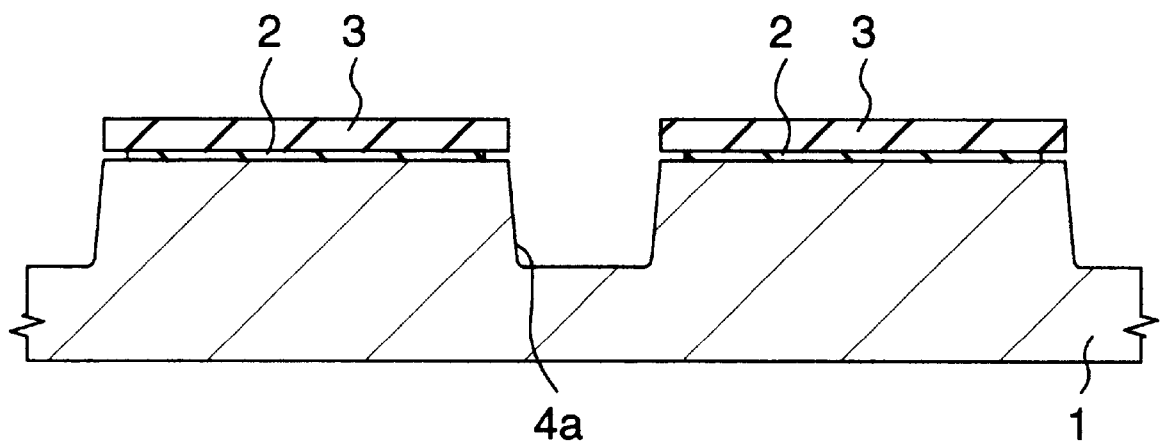
FIGS. 59 to 64 are cross-sectional elevation views of essential part of a semiconductor substrate showing a process for producing a semiconductor device according to Example 12 of the present invention.

At fist, as shown in FIG. 59, groove 4a was trenched on semiconductor substrate 1 in an element isolation region by etching, using silicon nitride film 3 as a mask, and then silicon oxide film 2 exposed to the inside wall of groove 4a was removed by a hydrofluoric acid-based etching solution to recess silicon oxide film 2 towards the active region.

Figure 60:
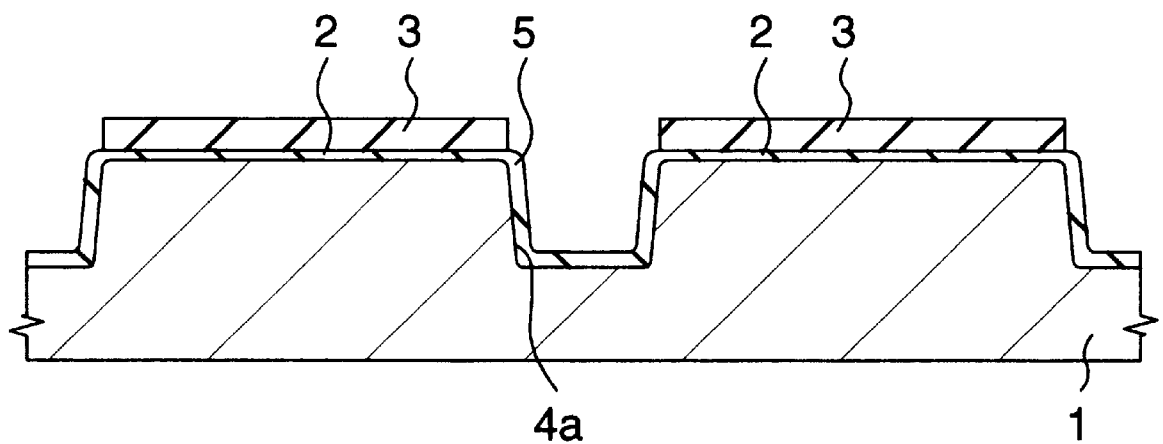

Then, as shown in FIG. 60, semiconductor substrate 1 was thermally oxidized to form silicon oxide film 5 on the inside wall of groove 4a and round the shoulder edge of groove 4a at the same time. Steps up to this stage were the same as in Examples 1 to 3.

Figure 61:
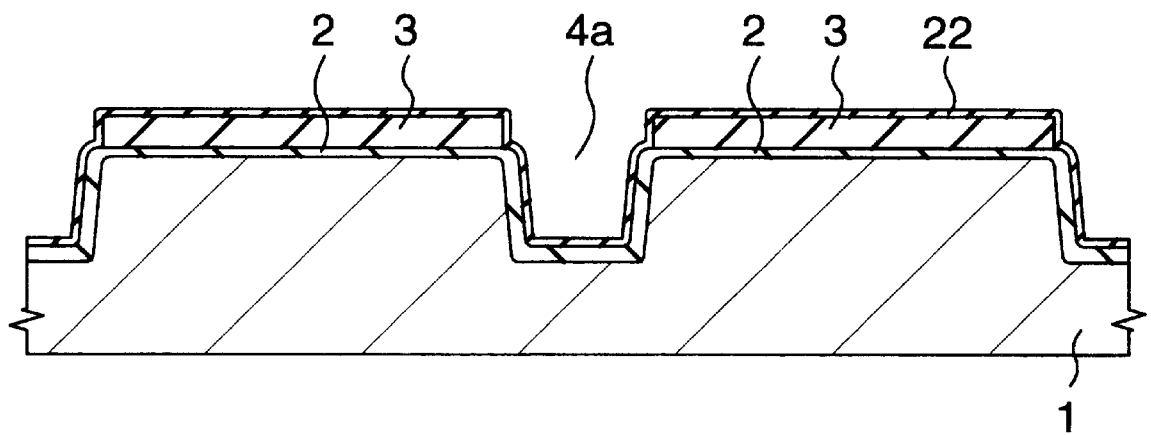
Figure 62:
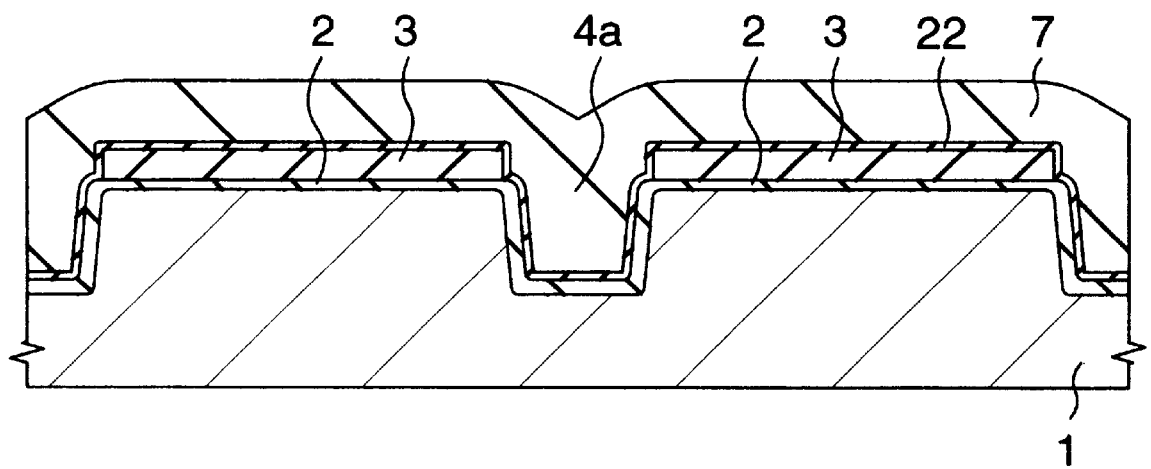

Then, as shown in FIG. 61, polycrystalline silicon film 22 was shallowly deposited on semiconductor substrate 1 by CVD, and then, as shown in FIG. 62, silicon oxide film 7 was deposited on polycrystalline silicon film 22 by CVD to embed silicon oxide film 7 in groove 4a.

Figure 63:
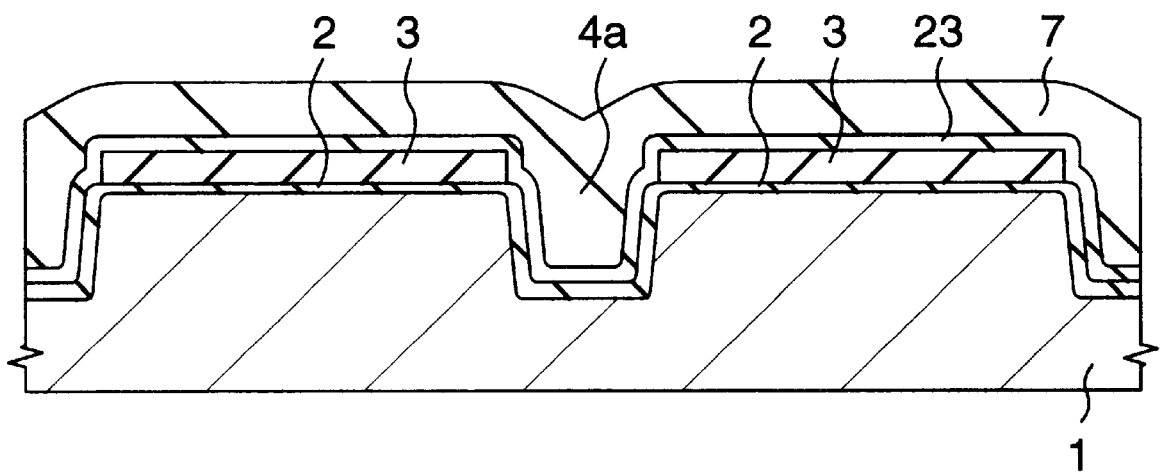

Then, as shown in FIG. 63, semiconductor substrate 1 was wet oxidized to sinter silicon oxide film 7 embedded in groove 4a. At the same time, at least a portion of polycrystalline silicon film 22 was oxidized and converted to silicon oxide film 23. Thus, oxidation of the region near the boundary between silicon oxide film 5 and the active region of semiconductor substrate 1 was suppressed, so that growth of silicon oxide film 5 towards the active region was inhibited. When polycrystalline silicon film 22 was oxidized to silicon oxide film 23, its volume was increased to about twice as large as the original. That is, even when voids were formed in silicon oxide film 7 embedded in groove 4a, the voids could be effectively constricted by the volume increase of silicon oxide film 23.

Figure 64:
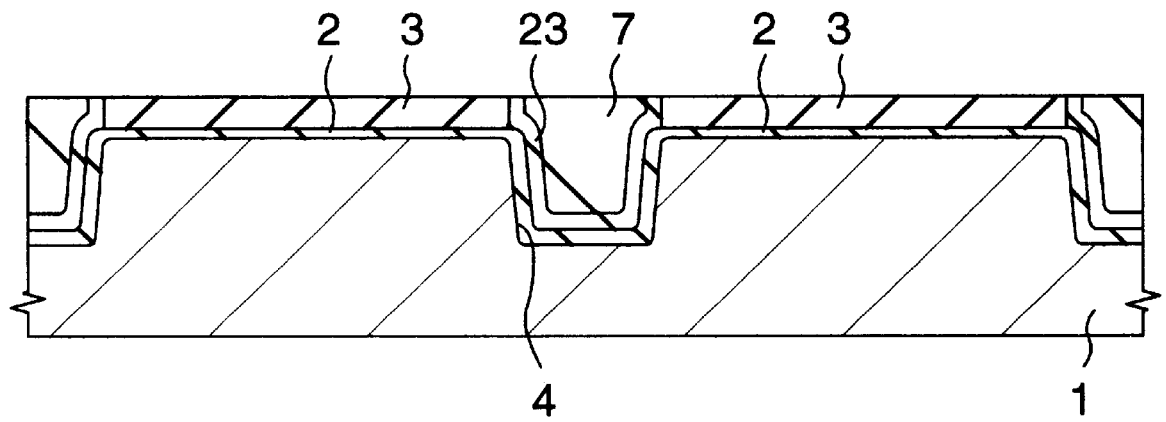

Then, as shown in FIG. 64, silicon oxide film 7 and silicon oxide film 23 on silicon nitride film 3 were removed to leave silicon oxide films 7 and 23 only in groove 4a, thereby forming element isolation groove 4. Sintering of silicon oxide film 7 and oxidation of polycrystalline silicon film 22 could be also carried out after formation of element isolation groove 4. Furthermore, an amorphous silicon film could be used in place of polycrystalline silicon film 22.

It is also possible to further round the shoulder edge of the groove by removing edge portions of upper edge portions of the groove after the recess of pad oxide film and before oxidation in the groove. Thus, after recessing the pad oxide film, isotropic etching may be conducted at the shoulder edge of the groove (to easily remove the edges), followed by oxidation in the groove.

EXAMPLE 13

A process for forming element isolation groove 4 according to a still further embodiment of the present invention will be explained below, referring to FIGS. 65 and 66.

Figure 65:
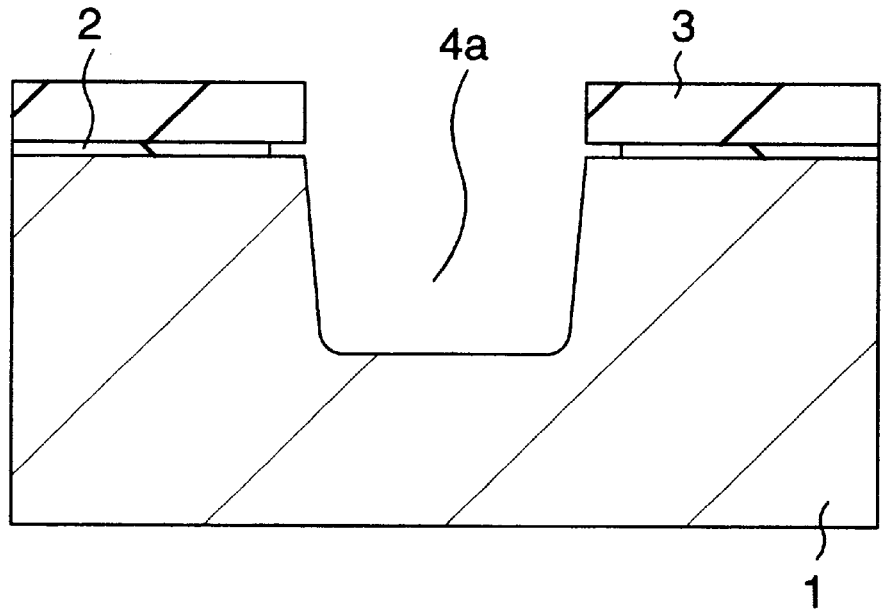
FIGS. 65 and 66 are cross-sectional elevation views of essential part of a semiconductor substrate showing a process for producing a semiconductor device according to Example 13 of the present invention.

At first, as shown in FIG. 65, groove 4a was trenched on semiconductor substrate 1 in an element isolation region by etching, using silicon nitride film 3 as a mask, and then silicon oxide film 2 exposed to the inside wall of groove 4a was removed by a hydrofluoric acid-based etching solution to recess silicon oxide film 2 towards the active region. Steps up to this stage were the same as in Examples 1 to 3.

Figure 66:
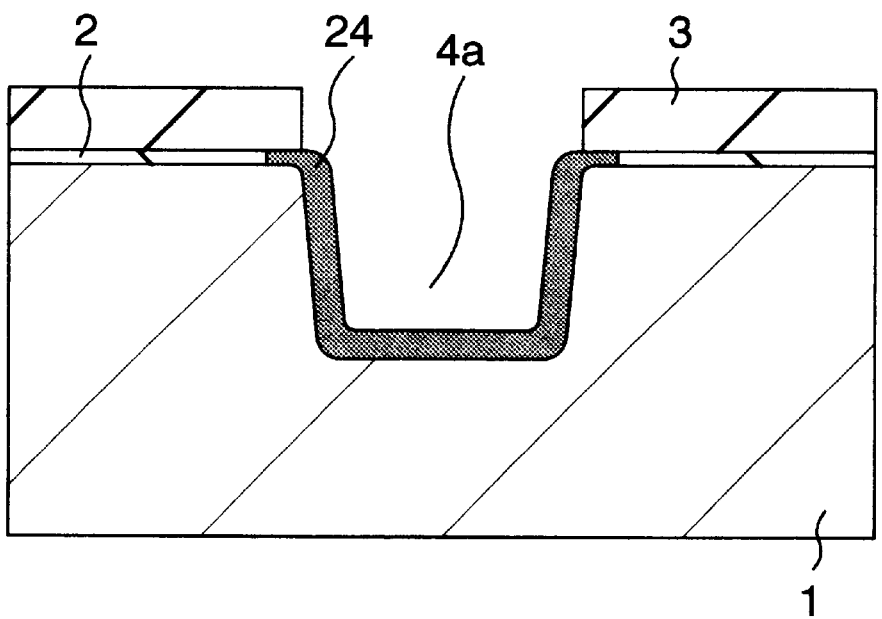

Then, as shown in FIG. 66, semiconductor substrate 1 was heat-treated in a nitrogen atmosphere to form silicon nitride film 24 on the inside wall of groove 4a and round the shoulder edge of groove 4a at the same time.

According to this embodiment, silicon nitride film 24 was formed on the inside wall of groove 4a, whereby oxidation of the active region of semiconductor substrate 1 could be inhibited during the sintering of silicon oxide film 7 later embedded in groove 4a.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

EXAMPLE 14

A process for forming element isolation groove 4 according to a still further embodiment of the present invention will be explained below, referring to FIGS. 67 and 68.

Figure 67:
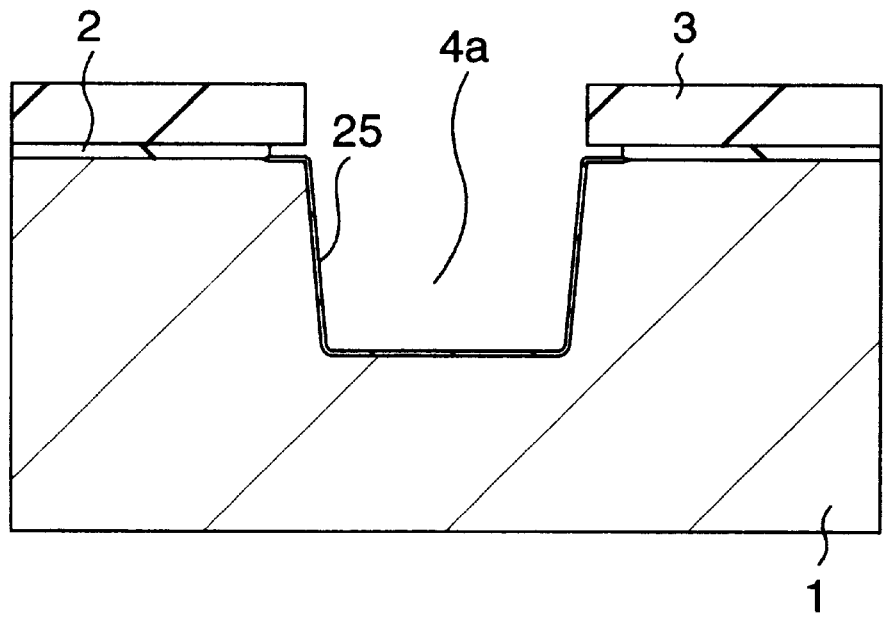
FIGS. 67 and 68 are cross-sectional elevation views of essential part of a semiconductor substrate showing a process for producing a semiconductor device according to Example 14 of the present invention.

At first, as shown in FIG. 67, groove 4a was trenched on semiconductor substrate 1 in an element isolation region by etching, using silicon nitride film 3 as a mask, and then silicon oxide film 2 exposed to the inside wall of groove 4a was removed by a hydrofluoric acid-based solution to recess silicon oxide film 2 towards the active region. Steps up to this stage were the same as in Examples 1 to 3. Then, semiconductor substrate 1 was thermally oxidized to form thin silicon oxide film 25 on the inside wall of groove 4a.

Figure 68:
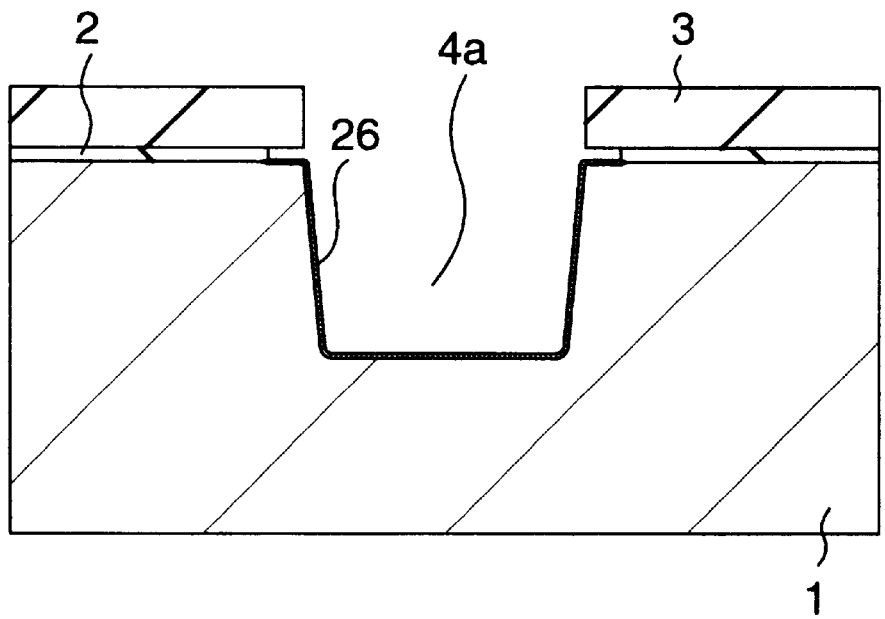

Then, as shown in FIG. 68, semiconductor substrate 1 was heat-treated in a nitrogen atmosphere to convert silicon oxide film 25 on the inside wall of groove 4a to silicon nitride film 26.

According to this embodiment, silicon nitride film 26 was formed on the inside wall of groove 4a, whereby oxidation of the active region of semiconductor substrate 1 could be inhibited during the sintering of silicon oxide film 7 later embedded in groove 4a.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

EXAMPLE 15

A process for forming element isolation groove 4 according to a still further embodiment of the present invention will be explained below, referring to FIGS. 69 and 70.

Figure 69:
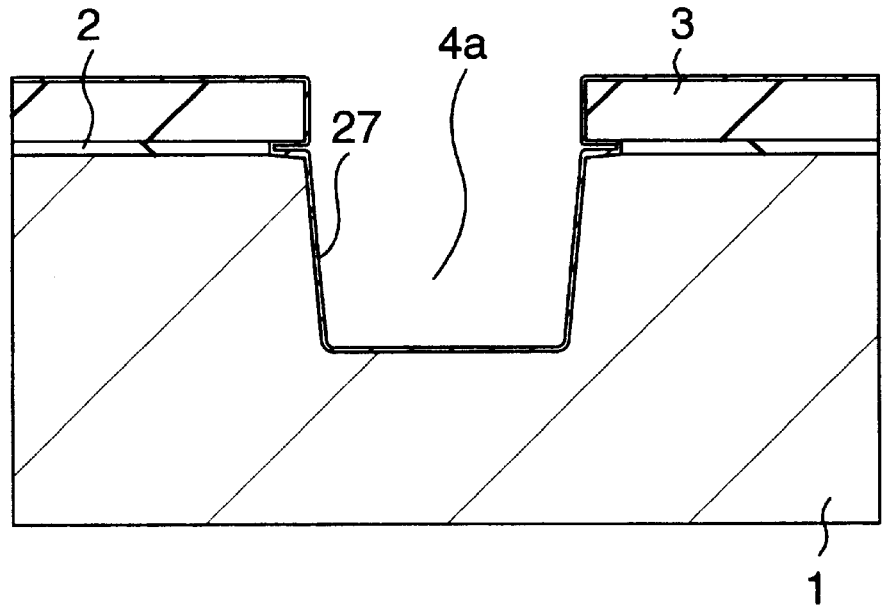
FIGS. 69 and 70 are cross-sectional elevation views of essential part of a semiconductor substrate showing a process for producing a semiconductor device according to Example 15 of the present invention.

At first, as shown in FIG. 69, groove 4a was trenched on semiconductor substrate 1 in an element isolation region by etching, using silicon nitride film 3 as a mask, and then silicon oxide film 2 exposed to the inside wall of groove 4a was removed by a hydrofluoric acid-based etching solution to recess silicon oxide film 2 towards the active region. Steps up to this stage were the same as in Examples 1 to 3. Then, thin polycrystalline silicon film 27 was deposited on semiconductor substrate 1 by CVD.

Figure 70:
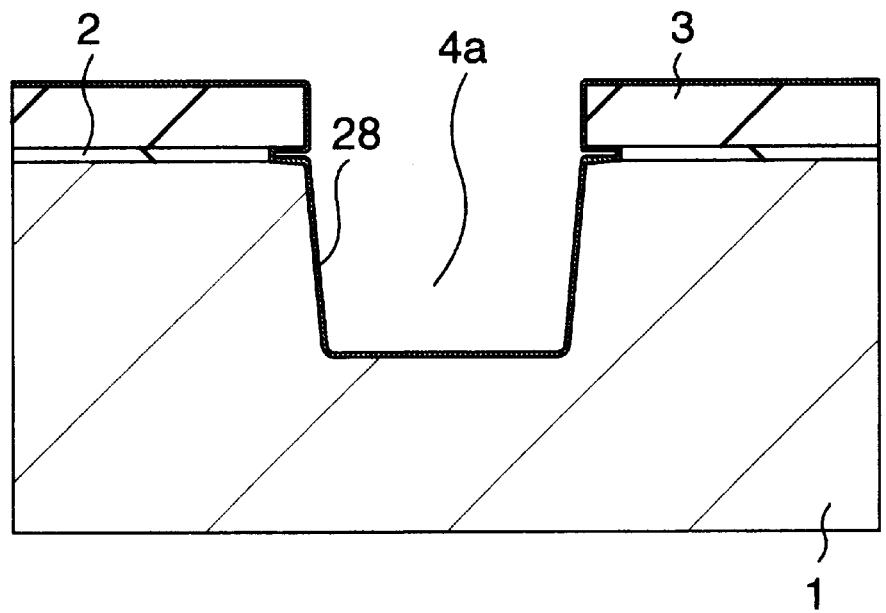

Then, as shown in FIG. 70, semiconductor substrate 1 was heat-treated in a nitrogen atmosphere to convert polycrystalline silicon film 27 to silicon nitride film 28.

According to this embodiment, silicon nitride film 28 was formed on the inside wall of groove 4a, whereby oxidation of the active region of semiconductor substrate 1 could be inhibited during the sintering of silicon oxide film 7 later embedded in the groove.

In the foregoing Examples 6 to 15, the shoulder edge of groove 4a could be more preferably rounded by providing an undercut, as shown in FIG. 34, before trenching groove 4a.

It is also possible to further round the shoulder edge of the groove by removing edge portions of upper edge portions of the groove after the recess of pad oxide film and before the oxidation in the groove. Thus, after recessing the pad oxide film, isotropic etching may be conducted at the shoulder edge of the groove (to easily remove the edges), followed by oxidation in the groove.

In the foregoing, the present invention made by the present inventor has been explained according to specific embodiments of the present invention, but the present invention is not limited thereto and can be modified to various degrees within the scope of the present invention.

INDUSTRIAL APPLICABILITY

According to the present invention, the shape of element isolation groove of a semiconductor device can be optimized by low temperature heat treatment at not more than 1,000° C., and the devices can be made finer with improved electric characteristics thereof.

Furthermore, according to the present invention, an adverse effect of a stress in the active region due to sintering of silicon oxide film embedded in the element isolation groove upon device characteristics can be reduced. Thus, a semiconductor device of high reliability can be produced.

What is claimed is:

1. A process for producing a semiconductor device, which comprises the following steps:

(1) a step of forming a pad oxide film having a thickness of at least 5 nm on a circuit-forming side of a semiconductor substrate, (2) a step of forming an anti-oxidation film on the pad oxide film, (3) a step of trenching a groove to a desired depth at a desired position on the circuit-forming side of the semiconductor substrate, (4) a step of recessing the pad oxide film to an extent of 5 nm to 40 nm from the inside wall of the groove, (5) a step of oxidizing the inside wall of the groove trenched on the semiconductor surface, (6) a step of embedding an isolation film in the oxidized groove, (7) a step of removing the embedding isolation film formed on the anti-oxidation film, (8) a step of removing the anti-oxidation film formed on the circuit-forming side of the semiconductor substrate, and (9) a step of removing the pad oxide film formed on the circuit-forming side of the semiconductor substrate.

2. A process according to claim 1, wherein the inside wall of the groove is oxidized in an oxidative atmosphere of $H_2/O_2$ in a flow rate ratio of $H_2/O_2$ of not more than 0.5.

3. A process according to claim 1, wherein the inside wall of the groove is oxidized just before a recess space formed up to the edge of the recessed pad oxide film is fully filled by oxidation.

4. A process according to claim 1, wherein the inside wall of the groove is oxidized in an oxidative atmosphere of $H_2/O_2$ in a flow rate ratio of $H_2/O_2$ of not more than 0.5 in the range wherein a recess space formed up to the edge of the recessed pad oxide film is filled by oxidation.

5. A process for producing a semiconductor device, which comprises the following steps:
   (a) a step of thermally oxidizing a semiconductor substrate, thereby forming a first silicon oxide film as a pad oxide film on the surface of the semiconductor substrate, then depositing a silicon nitride film as an anti-oxidation film on the first silicon oxide film, and then selectively etching the silicon nitride film, the first silicon oxide film and the semiconductor substrate residing in an element isolation region while masking an element region, thereby trenching a groove on the surface of the semiconductor substrate,
   (b) a step of etching the first silicon oxide film exposed to the inside wall of the groove, thereby recessing the first silicon oxide film from the inside wall of the groove towards an active region to an extent of 5 to 40 nm,
   (c) a step of thermally oxidizing the semiconductor substrate, thereby forming a second silicon oxide film on the inside wall of the groove just before fully filling the second silicon oxide film in the recess space formed up to the edge of the recessed first silicon oxide film and rounding the shoulder edge of the groove at the same time,
   (d) a step of depositing a third silicon oxide film on the surface of the semiconductor substrate, thereby embedding the third silicon oxide film in the groove,
   (e) a step of heat-treating (or annealing) the semiconductor substrate, thereby sintering the third silicon oxide film embedded in the groove,
   (f) a step of removing the third silicon oxide film on the silicon nitride film, while leaving the third silicon oxide film only in the groove, thereby forming an element isolation groove embedded with the third silicon oxide film, and
   (g) a step of removing the silicon nitride film on the surface o the active region whose circumference is confined by the element isolation groove and then forming a semiconductor element in the active region.

6. A process according to claim 5, wherein a thermally oxidizing temperature for forming the first silicon oxide film, a thermally oxidizing temperature for forming the second silicon oxide film and a heat-treating (or annealing) temperature for sintering the third silicon oxide film are all not more than 1,000° C.

7. A process according to claim 5, wherein the thermally oxidizing temperature for forming the second silicon oxide film is from 800° to 1,000° C.

8. A process according to claim 5, wherein the groove has a taper angle e of not more than 85°.

9. A process according to claim 5, wherein the inside wall of the groove is subjected to an soft nitriding treatment after the step (c) but before the step (d), thereby forming a silicon nitride layer in an area near the boundary between the second silicon oxide film formed on the inside wall of the groove and the active region of the semiconductor substrate.

10. A process according to claim 5, wherein an area near the boundary between the second silicon oxide film formed on the inside wall of the groove and an element isolation region of the semiconductor substrate is subjected to nitrogen ion implantation after the step (c) but before the step (d), thereby forming a silicon nitride layer in the area near the second silicon oxide film formed on the inside wall of the groove and the element isolation region of the semiconductor substrate.

11. A process according to claim 5, wherein the third silicon oxide film on the silicon nitride film is removed after the step (d), while leaving the third silicon oxide film only in the groove, thereby forming an element isolation groove embedded with the third silicon oxide film, and then heat-treating (or annealing) the semiconductor substrate, thereby sintering the third silicon oxide film embedded in the groove.

12. A process according to claim 5, wherein the step (c) is carried out in a nitrogen-containing atmosphere, thereby forming a second silicon nitride film on the inside wall of the groove and rounding the shoulder edge of the groove at the same time.

13. A process according to claim 5, wherein a second silicon nitride film is formed at least on the surface of the second silicon oxide film after the step (c) but before the step (d).

14. A process for producing a semiconductor device, which comprises the following steps:
   (a) a step of thermally oxidizing a semiconductor substrate, thereby forming a first silicon oxide film on the surface of the semiconductor substrate, then depositing a silicon nitride film on the first silicon oxide film, and then selectively etching the silicon nitride film and the first silicon oxide film residing in an element isolation region while masking an element region,
   (b) a step of isotropically and shallowly etching the semiconductor substrate in the element isolation region, thereby forming an undercut on the semiconductor substrate at the edge of the element isolation region,
   (c) a step of selectively etching the semiconductor substrate in the element isolation region, thereby trenching a groove on the surface of the semiconductor substrate,
   (d) a step of thermally oxidizing the semiconductor substrate, thereby forming a second silicon oxide film on the inside wall of the groove and rounding the shoulder edge of the groove at the same time,
   (e) a step of depositing a third silicon oxide film on the surface of the semiconductor substrate, thereby embedding the third silicon oxide film in the groove,
   (f) a step of heat-treating (or annealing) the semiconductor substrate, thereby sintering the third silicon oxide film embedded in the groove,
   (g) a step of removing the third silicon oxide film on the silicon nitride film, while leaving the third silicon oxide film only in the groove, thereby forming an element isolation groove embedded with the third silicon oxide film, and
   (h) a step of removing the silicon nitride film on the surface of an active region whose circumference is confined by the element isolation groove, and then forming a semiconductor element in the active region.

15. A process for producing a semiconductor device, which comprises the following steps:
   (a) a step of thermally oxidizing a semiconductor substrate, thereby forming a first silicon oxide film on the surface of the semiconductor substrate, then depositing a first silicon nitride film on the first silicon oxide film and then selectively etching the first silicon nitride film, the first silicon oxide film and the semiconductor substrate residing in an element isolation region while masking an element region, thereby trenching a groove on the surface of the semiconductor substrate, (b) a step of etching the first silicon oxide film exposed to the inside wall of the groove, thereby recessing the first silicon oxide film from the inside wall of the groove to an extent of 5 to 40 nm towards an active region, (c) a step of thermally oxidizing the semiconductor device, thereby forming a second silicon oxide film on the inside wall of the groove just before fully filling the second silicon oxide film in the recess space formed up to the recessed first silicon oxide film, and rounding the shoulder edge of the groove at the same time, (d) a step of depositing a second silicon nitride film on the semiconductor substrate including the inside of the groove by chemical vapor deposition, (e) a step of depositing a third silicon oxide film on the surface of the semiconductor substrate, thereby embedding the third silicon oxide film in the groove, (f) a step of heat-treating (or annealing) the semiconductor substrate, thereby sintering the third silicon oxide film embedded in the groove, (g) a step of removing the third silicon oxide film and the second silicon nitride film on the first silicon nitride film, while leaving the third silicon oxide film and the second silicon nitride film only in the groove, thereby forming an element isolation groove embedded with the third silicon oxide film and the second silicon nitride film, (h) a step of removing the first silicon nitride film on the surface of the active region whose circumference is confined by the element isolation groove by etching, (i) a step of thermally oxidizing the third silicon oxide film in the element isolation groove, thereby increasing the thickness of the film and filling a recess formed by simultaneous removal of the second silicon nitride film at the shoulder edge of the element isolation groove during the removal of the first silicon nitride film by etching, and (j) a step of forming a semiconductor element in the active region.

16. A process for producing a semiconductor device, which comprises the following steps:

(a) a step of thermally oxidizing a semiconductor substrate, thereby forming a first silicon oxide film on the surface of the semiconductor substrate, then depositing a first silicon nitride film on the first silicon oxide film, and then selectively etching the first silicon nitride film, the first silicon oxide film and the semiconductor substrate residing in an element isolation zone while masking an element region, thereby trenching a groove on the surface of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of thermally oxidizing the semiconductor substrate, thereby forming a second silicon oxide film on the inside wall of the groove just before fully filling the second silicon oxide film in the recess space formed up to the recessed first silicon oxide film, and rounding the shoulder edge of the groove at the same time, (d) a step of depositing a second silicon nitride film on the semiconductor substrate including the inside of the groove by chemical vapor deposition, (e) a step of depositing a third silicon oxide film on the surface of the semiconductor substrate, thereby embedding the third silicon oxide in the groove, (f) a step of removing the third silicon oxide film and the second silicon nitride film on the first silicon nitride film, while leaving the third silicon oxide film and the second silicon nitride film only in the groove, thereby forming an element isolation groove embedded with the third silicon oxide film and the second silicon nitride film, (g) a step of heat-treating (or annealing) the semiconductor substrate, thereby sintering the third silicon oxide film embedded in the groove and oxidizing the surface of the first silicon nitride film and the surface of the second silicon nitride film on the shoulder edge of the element isolation groove, (h) a step of removing the first silicon nitride film on the surface of the active region whose circumference is confined by the element isolation groove and the oxide film on the surface of the first silicon nitride film by etching, and (i) a step of forming a semiconductor element in the active region.

17. A process for producing a semiconductor device, which comprises the following steps:

(a) a step of thermally oxidizing a semiconductor substrate, thereby forming a first silicon oxide film on the surface of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the surface of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of depositing a second silicon oxide film on the surface of the semiconductor substrate, thereby embedding the second silicon oxide film in the groove, (d) a step of thermally oxidizing the semiconductor substrate, thereby sintering the second silicon oxide film embedded in the groove, forming a third silicon oxide film on the inside wall of the groove and rounding the shoulder edge of the groove at the same time, (e) a step of removing the second silicon oxide film on the silicon nitride film, while leaving the second silicon oxide film only in the groove, thereby forming an element isolation groove embedded with the second silicon oxide film, and (f) a step of removing the silicon nitride film on the surface of the active region whose circumference is confined by the element isolation groove, and then forming a semiconductor element in the active region.

18. A process for producing a semiconductor device, which comprises the following steps:

(a) a step of thermally oxidizing a semiconductor substrate, thereby forming a first silicon oxide film on the surface of the semiconductor substrate, then depositing a silicon nitride film on the first silicon oxide film, and then selectively etching the silicon nitride film, the first silicon oxide film and the semiconductor substrate residing in an element isolation region, thereby trenching a groove on the surface of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) A step of depositing a second silicon oxide film on the surface of the semiconductor substrate, thereby embedding the second silicon oxide film in the groove, (d) a step of removing the second silicon oxide film on the silicon nitride film, while leaving the second silicon oxide film only in the groove, thereby forming an element isolation groove embedded with the second silicon oxide film, (e) a step of thermally oxidizing the semiconductor substrate, thereby sintering the second silicon oxide film embedded in the groove, forming a third silicon oxide film on the inside wall of the groove and rounding the shoulder edge of the groove at the same time, and (f) a step of removing the silicon nitride film on the surface of the active region whose circumference is confined by the element isolation groove, and then forming a semiconductor element in the active region.

19. A process producing a semiconductor device, which comprises the following steps:

(a) A step of thermally oxidizing a semiconductor substrate, thereby forming a first silicon oxide film on the surface of the semiconductor substrate, then depositing a silicon nitride film on the first silicon film, and then selectively etching the silicon nitride film, the first silicon oxide film and the semiconductor substrate residing in an element isolation region while masking an element region, thereby trenching a groove on the surface of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of thermally oxidizing the semiconductor substrate, thereby forming a second silicon oxide film on the inside wall of the groove just before fully filling the second silicon oxide film in the recess space formed up to the edge of the recessed first silicon oxide film, and rounding the shoulder edge of the groove at the same time, (d) a step of depositing a polycrystalline silicon film on the surface of the semiconductor substrate, (e) a step of depositing a third silicon oxide film on the surface of the semiconductor substrate, thereby embedding the third silicon oxide film in the groove, (f) a step of heat-treating (or annealing) the semiconductor substrate, thereby sintering the third silicon oxide film embedded in the groove and oxidizing the polycrystalline silicon film to convert at least a portion thereof to a silicon oxide film, (g) a step of removing the third silicon oxide film and the silicon oxide film on the silicon nitride film, while leaving the third silicon oxide film and the silicon oxide film only in the groove, thereby forming an element isolation groove embedded with the third silicon oxide film and the silicon oxide film, and (h) a step of removing the silicon nitride film on the surface of the active region whose circumference is confined by the element isolation groove, and then forming a semiconductor element in the active region.

20. A process for producing a semiconductor device, which comprises the following steps:

(a) a step of thermally oxidizing a semiconductor substrate, thereby forming a first silicon oxide film on the surface of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the surface of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of thermally oxidizing the semiconductor substrate, thereby forming a second silicon oxide film on the inside wall of the groove just before fully filling the second silicon oxide film in the recess space formed up to the edge of recessed first silicon oxide film and rounding the shoulder edge of the groove at the same time, (d) a step of depositing a polycrystalline silicon film on the surface of the semiconductor substrate, (e) a step of depositing a third silicon oxide film on the surface of the semiconductor substrate, thereby embedding the third silicon oxide film in the groove, (f) a step of removing the third silicon oxide film and the polycrystalline silicon film on the silicon nitride film, while leaving the third silicon oxide film and the polycrystalline silicon film in the groove, thereby forming an element isolation groove embedded with the third silicon oxide film and the polycrystalline silicon film, (g) a step of heat-treating (or annealing) the semiconductor substrate, thereby sintering the third silicon oxide film embedded in the groove and oxidizing the polycrystalline silicon film to convert at least a portion thereof to a silicon oxide film, and (h) a step of removing the silicon nitride film on the surface of the active region whose circumference is confined by the element isolation groove, and then forming a semiconductor element in the active region.

21. A process for producing a semiconductor device, which comprises the following steps:

(a) a step of oxidizing a semiconductor substrate, thereby forming a first silicon oxide film on the surface of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the surface of the semiconductor substrate, (b) a step of etching the first silicon oxide film exposed to the inside wall of the groove, thereby recessing the first silicon oxide film from the inside wall of the groove towards an active region in an extent of 5 to 40 nm, (c) a step of heat-nitriding the semiconductor substrate, thereby forming a second silicon nitride on the inside wall of the groove, (d) a step of depositing a second silicon oxide film on the surface of the semiconductor substrate, thereby embedding the second silicon oxide film in the groove, (e) a step of heat-treating (or annealing) the semiconductor substrate, thereby sintering the second silicon oxide film embedded in the groove, (f) a step of removing the second silicon oxide film on the first silicon nitride film, while leaving the second silicon oxide film only in the groove, thereby forming an element isolation groove embedded with the second silicon oxide film, and (g) a step of removing the first silicon nitride film on the surface of the active region whose circumference is confined by the element isolation groove, and then forming a semiconductor element in the active region.

22. A process for producing a semiconductor device, which comprises the following steps:

(a) a step of thermally oxidizing a semiconductor substrate, thereby forming a first silicon oxide film on the surface of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the surface of the semiconductor substrate, (b) a step of etching the first silicon oxide exposed to the inside wall of the groove, thereby recessing the first silicon oxide film from the inside wall of the groove towards an active region in an extent of 5 to 40 nm, (c) a step of thermally oxidizing the semiconductor substrate, thereby forming a second silicon oxide film on the inside wall of the groove, and then nitriding the second silicon oxide film, thereby converting at least a portion thereof to a silicon nitride film, (d) a step of depositing a third silicon oxide film on the surface of the semiconductor substrate, thereby embedding the third silicon oxide film in the groove, (f) a step of removing the third silicon oxide film on the first silicon nitride film, while leaving the third silicon oxide film only in the groove, thereby forming an element isolation groove embedded with the third silicon oxide film, and (g) a step of removing the first silicon nitride film on the surface of the active region whose circumference is confined by the element isolation groove, and then forming a semiconductor element in the active region.

23. A process producing a semiconductor device, which comprises the following steps:

(a) a step of thermally oxidizing a semiconductor substrate, thereby forming a first silicon oxide film on the surface of the semiconductor substrate, then depositing a silicon nitride film on the first silicon oxide film, and then selectively etching the silicon nitride film, the first silicon oxide film and the semiconductor substrate residing in an element isolation region while masking an element region, thereby trenching a groove on the surface of the semiconductor substrate, (b) a step of etching the first silicon oxide film exposed to the inside wall of the groove, thereby recessing the first silicon oxide film from the inside wall of the groove towards an active region to an extent of 5 to 40 nm, (c) a step of depositing a polycrystalline silicon film on the semiconductor substrate, and then nitriding the polycrystalline silicon film, thereby converting at least a portion thereof to a silicon nitride film, (d) a step of depositing a second silicon oxide film on the surface of the semiconductor substrate, thereby embedding the second silicon oxide film in the groove, (e) a step of heat-treating (or annealing) the semiconductor substrate, thereby sintering the second silicon oxide film embedded in the groove, (f) a step of removing the second silicon oxide film on the first silicon nitride film, while leaving the second silicon oxide film only in the groove, thereby forming an element isolation groove embedded with the second silicon oxide film, and (g) a step of removing the first silicon nitride film on the surface of the active region whose circumference is confined by the element isolation groove, and then forming a semiconductor element in the active region.

* * * * *